(12) United States Patent
Lee et al.

(10) Patent No.: US 10,840,312 B2
(45) Date of Patent: Nov. 17, 2020

(54) DISPLAY DEVICE

(71) Applicant: Samsung Display Co., Ltd., Yongin-si (KR)

(72) Inventors: Hyeonbum Lee, Hwaseong-si (KR); Joonwoo Bae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/378,583

(22) Filed: Apr. 9, 2019

(65) Prior Publication Data

US 2019/0319076 A1    Oct. 17, 2019

(30) Foreign Application Priority Data

Apr. 12, 2018   (KR) .................. 10-2018-0042854

(51) Int. Cl.
| | | |
|---|---|---|
| *G06F 3/038* | (2013.01) | |
| *H01L 27/32* | (2006.01) | |
| *H01L 51/52* | (2006.01) | |
| *G06F 3/041* | (2006.01) | |
| *G06F 3/044* | (2006.01) | |

(52) U.S. Cl.
CPC .......... *H01L 27/323* (2013.01); *G06F 3/0412* (2013.01); *G06F 3/0443* (2019.05); *H01L 27/3246* (2013.01); *H01L 51/5253* (2013.01); *H01L 51/5284* (2013.01); *G06F 2203/04111* (2013.01); *G06F 2203/04112* (2013.01)

(58) Field of Classification Search
USPC ....... 345/156, 173, 174, 176, 180, 207, 204, 345/205, 697, 698; 257/40, 59
See application file for complete search history.

(56) References Cited

U.S. PATENT DOCUMENTS

2014/0319499 A1* 10/2014 Yamazaki ............. H01L 27/322
                                                                257/40
2015/0168788 A1*  6/2015 Song ................. G02F 1/134309
                                                                345/174

(Continued)

FOREIGN PATENT DOCUMENTS

KR    10-2015-0069712     6/2015
KR    10-2017-0136072    12/2017

(Continued)

*Primary Examiner* — Thuy N Pardo
(74) *Attorney, Agent, or Firm* — H.C. Park & Associates, PLC

(57) ABSTRACT

A display device may include a display panel and an input sensor. The input sensor including a sensing electrode and an insulating layer. The display panel may include a light emitting element and a pixel definition layer. The light emitting element may include a first electrode in contact with a base surface, a second electrode, and a light emitting layer between the first electrode and the second electrode. The pixel definition layer may include a first portion defining an opening exposing the first electrode, and a second portion provided on and at least partially overlapping with the first portion. The sensing electrode is provided on the plurality of thin films overlapped with the first portion of the pixel definition layer and defining an open region at least partially overlapping the second portion of the pixel definition layer.

20 Claims, 41 Drawing Sheets

(56) References Cited

U.S. PATENT DOCUMENTS

| | | | |
|---|---|---|---|
| 2015/0338709 A1* | 11/2015 | Yoshida | G02F 1/136277 257/59 |
| 2016/0118445 A1* | 4/2016 | Yamazaki | H01L 27/3211 257/40 |
| 2016/0299610 A1* | 10/2016 | Yoon | H01L 51/5281 345/174 |
| 2016/0349558 A1* | 12/2016 | Shishido | G06F 3/0412 345/204 |
| 2017/0092177 A1* | 3/2017 | Kobayashi | G06F 1/1637 345/207 |
| 2017/0344186 A1 | 11/2017 | Na et al. | |
| 2018/0149920 A1* | 5/2018 | Yamazaki | G06F 3/0412 345/205 |
| 2018/0247990 A1* | 8/2018 | Jinbo | H01L 27/3258 345/207 |
| 2019/0265532 A1* | 8/2019 | Yamazaki | G02F 1/13338 345/697 |
| 2019/0302959 A1* | 10/2019 | Clark | G06F 3/0412 345/698 |

FOREIGN PATENT DOCUMENTS

| | | |
|---|---|---|
| KR | 10-2017-0136073 | 12/2017 |
| KR | 10-2019-0086129 | 7/2019 |

\* cited by examiner

DISPLAY DEVICE

CROSS-REFERENCE TO RELATED APPLICATION

This application claims priority from and the benefit of Korean Patent Application No. 10-2018-0042854, filed on Apr. 12, 2018, which is hereby incorporated by reference for all purposes as if fully set forth herein.

BACKGROUND

Field

Exemplary implementations of the invention relate generally to a display device and, more specifically, to a display device, in which an input sensor is integrated.

Discussion of Background

Various display devices are being developed for use in multimedia devices such as televisions, mobile phones, tablet computers, navigation systems, gaming machines, and the like. A keyboard or a mouse is used as an input device of the display device. A recent display device includes a touch panel that is used as an input device.

Signals for operations of a display device may serve as noise signals in a touch panel, and in this case, the touch panel may suffer from low touch sensitivity.

The above information disclosed in this Background section is only for understanding of the background of the inventive concepts, and, therefore, it may contain information that does not constitute prior art.

SUMMARY

Applicant discovered that as the thickness of display devices decreases with the use of smaller and smaller displays for mobile phones and the like, interference with the touch sensing function, such as parasitic capacitance, may be caused due to spatial variations in the pixel defining layer, which reduces the distance between an electrode in the display panel and a sensing electrode.

Devices constructed according to exemplary implementations of the invention are capable of reducing noise, which can adversely affect the input sensor of the display device. For example, display devices constructed according to the principles and exemplary implementations of the invention have an input sensor with a reduced noise property integrated into the display device. A portion of the sensing electrode, which is relatively close to an electrode in the pixel definition layer, may be removed. The sensing electrode may have an open region, which is formed to correspond to a second portion of the pixel definition layer. The open region of the sensing electrode may be configured to suppress or prevent noise caused by the electrode from affecting the sensing electrode. The input sensor may further include a bridge pattern corresponding to the open region of the sensing electrode. The bridge pattern may be used to improve sensitivity in an operation of sensing an external input, without an increase of the noise caused by the second electrode.

Additional features of the inventive concepts will be set forth in the description which follows, and in part will be apparent from the description, or may be learned by practice of the inventive concepts.

According to some exemplary implementations of the inventive concepts, a display device may include a display panel and an input sensor directly provided on the display panel. The input sensor may include a sensing electrode and an insulating layer. The display panel may include a light emitting element including a first electrode in contact with a base surface, a second electrode, and a light emitting layer disposed between the first electrode and the second electrode, a pixel definition layer provided below the second electrode in contact with the base surface, the pixel definition layer including a first portion defining an opening exposing the first electrode, and a second portion provided on and at least partially overlapping with the first portion, and a plurality of thin films provided on the second electrode. The sensing electrode may be provided on the plurality of thin films overlapped with the first portion of the pixel definition layer and defining an open region at least partially overlapping the second portion of the pixel definition layer.

In an exemplary embodiment, the insulating layer may cover the sensing electrode. The input sensor may further include a bridge connector disposed on the insulating layer and overlapping with the open region, and the bridge connector may be connected to the sensing electrode through a contact hole defined in the insulating layer.

In an exemplary embodiment, the sensing electrode may include a first sensing electrode and a second sensing electrode intersecting and being insulated from each other. The first sensing electrode may include first sensor portions and a first connecting portion connecting the first sensor portions to each other and insulating each other. The second sensing electrode may include second sensor portions and a second connecting portion connecting the second sensor portions to each other. The insulating layer may include a first insulating layer provided between the first connecting portion and the second connecting portion.

In an exemplary embodiment, the first connecting portion may be provided below the first insulating layer, and the first sensor portions, the second sensor portions, and the second connecting portion may be provided on the first insulating layer.

In an exemplary embodiment, the insulating layer may further include a second insulating layer, which is provided on the first insulating layer to cover the first sensor portions, the second sensor portions, and the second connecting portion.

In an exemplary embodiment, the input sensor may further include a bridge connector provided on the second insulating layer, and the bridge connector may be connected to the first sensor portions or the second sensor portions through a contact hole defined in the second insulating layer. The bridge connector is at least partially overlapped with the open region.

In an exemplary embodiment, a thickness of the second insulating layer may be substantially equal to a thickness of the second portion.

In an exemplary embodiment, a thickness of the first portion of the pixel definition layer may be substantially equal to a thickness of the second portion of the pixel definition layer.

In an exemplary embodiment, the second portion of the pixel definition layer may be not overlapped with the sensing electrode.

In an exemplary embodiment, a length of a side or a diameter of the second portion may range from about 10 μm to about 25 μm.

In an exemplary embodiment, the first portion and the second portion of the pixel definition layer may be integrated.

In an exemplary embodiment, the sensing electrode may have a mesh-shaped structure, in which an opening corresponding to the opening of the first portion is defined.

In an exemplary embodiment, the display device may further include an anti-reflection unit directly provided on the input sensor. The anti-reflection unit includes a light blocking layer, an opening partially overlapping the opening of the first portion of the pixel definition layer is defined in the light blocking layer.

In an exemplary embodiment, the display device may further include an anti-reflection unit provided between the display panel and the input sensor. The anti-reflection unit includes a light blocking layer, an opening partially overlapping the opening of the first portion of the pixel definition layer is defined in the light blocking layer.

In an exemplary embodiment, the plurality of thin films may include a first inorganic layer in contact with the second electrode, a second inorganic layer disposed on the first inorganic layer, an organic layer disposed on the second inorganic layer, a third inorganic layer disposed on the organic layer, and a fourth inorganic layer disposed on the third inorganic layer, and the sensing electrode may be in contact with the fourth inorganic layer.

According to an exemplary embodiment of the inventive concept, a display device may include a display panel, and an input sensor provided on the display panel, the input sensor including a sensing electrode and an insulating layer. The display panel may include a plurality of light emitting elements provided on a base surface, a pixel definition layer in contact with the base surface, the pixel definition layer including a first portion, having a plurality of openings exposing first electrodes of the plurality of light emitting elements, and a plurality of second portions, which are located adjacent to the first portion and having a thickness larger than a thickness of the first portion, and a plurality of thin films provided on the plurality of light emitting elements. The sensing electrode may be disposed on the plurality of thin films overlapping with the first portion and defining a plurality of open regions at least partially overlapping the plurality of second portions.

In an exemplary embodiment, the first electrodes may include first-type electrodes, each of the first-type electrodes has a first area, second-type electrodes, each of the second-type electrodes has a second area larger than the first area, and third-type electrodes, each of the third-type electrodes has a third area larger than the second area. The plurality of openings may include first-type openings corresponding to the first-type electrodes, second-type openings corresponding to the second-type electrodes, and third-type openings corresponding to the third-type electrodes. Each of the plurality of second portions may be surrounded with two of the first-type openings, one of the second-type openings, and one of the third-type openings.

In an exemplary embodiment, the sensing electrode may have a mesh-shaped structure defining first openings corresponding to the first-type openings, second openings corresponding to the second-type openings, and third openings corresponding to the third-type openings.

In an exemplary embodiment, the insulating layer may cover the sensing electrode, the input sensor may further include bridge connectors provided on the insulating layer, and the bridge connectors may be connected to the sensing electrode through contact holes defined in the insulating layer. The bridge connectors overlap the plurality of open regions.

In an exemplary embodiment, the bridge connectors may include bridge patterns, each of the sensing electrode and the bridge patterns may have a mesh line, and a line width of the mesh line of the sensing electrode may be substantially equal to a line width of the mesh line of each of the bridge patterns.

In an exemplary embodiment, a difference in thickness between the second portion and the first portion may be substantially equal to a thickness of the insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 1:
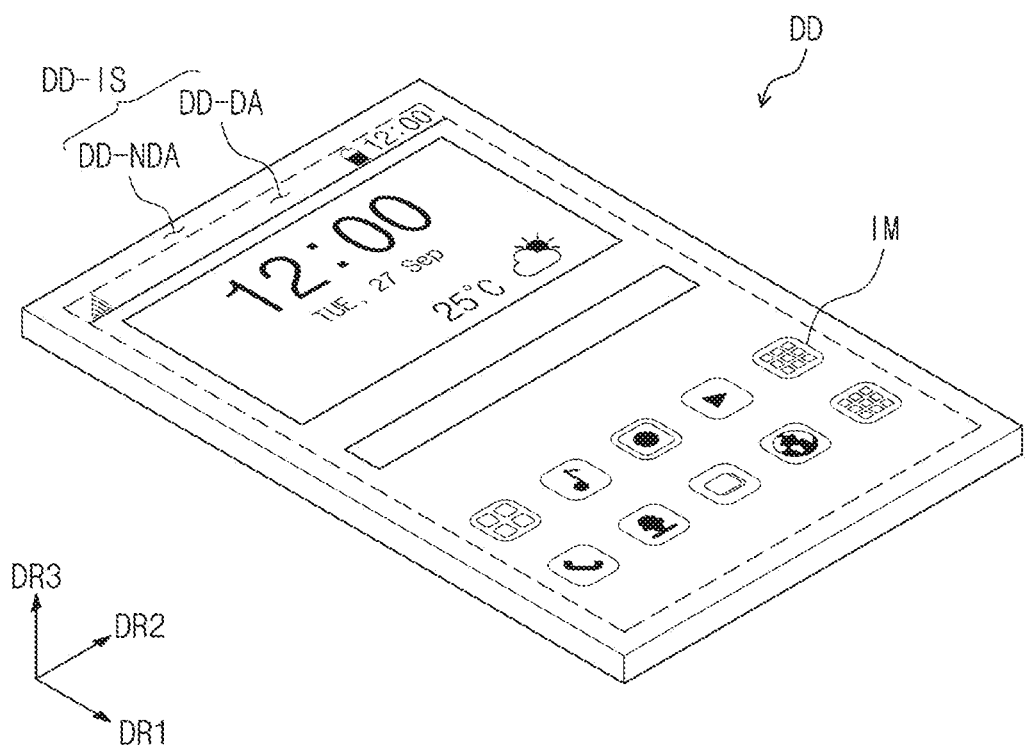
FIG. 1 is a perspective view of a display device constructed according to an exemplary embodiment of the invention.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD constructed according to an exemplary embodiment of the invention. As shown in FIG. 1, the display device DD may include a display surface DD-IS, which is used to display an image IM. The display surface DD-IS may be defined to be parallel to a first direction axis DR1 and a second direction axis DR2. A normal direction of the display surface DD-IS (i.e., a thickness direction of the display device DD) will be referred to as a third direction axis DR3.

In the following description, the third direction axis DR3 may be used to differentiate a front or top surface of each element from a back or bottom surface. However, directions indicated by the first to third direction axes DR1, DR2, and DR3 may be just an example. Hereinafter, first to third directions may be directions indicated by the first to third direction axes DR1, DR2, and DR3, respectively, and will be identified with the same reference numbers.

In FIG. 1, the display device DD is illustrated to have a flat display surface, but the inventive concepts are not limited thereto. The display surface of the display device DD may have a curved or three-dimensional shape. In the case where the display device DD has the three-dimensional display surface, the display surface may include a plurality of display regions that are oriented in different directions. For example, the display device DD may have a display surface that is shaped like a polygonal pillar.

In the illustrated embodiment, the display device DD may be a rigid display device. However, the inventive concepts are not limited thereto, and in an exemplary embodiment, the display device DD may be a flexible display device. In the illustrated embodiment, the display device DD, which can be used for a cellphone terminal, is exemplarily illustrated. The cellphone terminal may further include an electronic module, a camera module, a power module, and so forth, which are mounted on a mainboard and are provided in a bracket or case, along with the display device DD. The display device DD may be used for large-sized electronic devices (e.g., television sets and monitors) or small- or medium-sized electronic devices (e.g., tablets, car navigation systems, game machines, and smart watches).

As shown in FIG. 1, the display surface DD-IS may include a display region DD-DA, which is used to display the image IM, and a non-display region DD-NDA, which is adjacent to the display region DD-DA. The non-display region DD-NDA may not be used to display an image. As an example of the image IM, icon images are shown in FIG. 1.

As shown in FIG. 1, the display region DD-DA may have a rectangular shape. The non-display region DD-NDA may surround the display region DD-DA. However, the inventive concepts are not limited to this example, and in an exemplary embodiment, shapes of the display and non-display regions DD-DA and DD-NDA may be variously changed in a complementary manner.

FIGS. 2A to 2D are cross-sectional views each illustrating the display device DD according to an exemplary embodiment of the invention. FIGS. 2A to 2D illustrate vertical sections, each of which is taken on a plane defined by the second and third directions DR2 and DR3. In order to provide better understanding of a stacking structure of a display panel and/or functional units, the display devices DD are illustrated in a simplified manner in FIGS. 2A to 2D.

In an exemplary embodiment, the display device DD may include a display panel, an input sensor, an anti-reflection unit, and a window. At least two of the display panel, the input sensor, the anti-reflection unit, and the window may be integrally formed by a successive process steps or may be combined with each other by an adhesive member. FIGS. 2A to 2D illustrate examples in which an optically clear adhesive OCA is used as the adhesive member. In various exemplary embodiments to be described below, the adhesive member may be a typical adhesive material or a typical gluing agent. In an exemplary embodiment, the anti-reflection unit and the window may be replaced with other elements or may be omitted.

In FIGS. 2A to 2D, if an element (e.g., the input sensor, the anti-reflection unit, or the window) is formed on another element by a successive process step, the unit will be expressed using a term "layer". If an element (e.g., the input sensor, the anti-reflection unit, or the window) is combined to another element by an adhesive member, the element will be expressed using a term "panel". The element expressed using the term "panel" may include a base layer (e.g., a synthetic resin film, a composite film, or a glass substrate) providing a base surface, but the element expressed using the term "layer" may not have the base layer. In other words, the element expressed using the term "layer" may be placed on a base surface that is provided by another element.

The input sensor, the anti-reflection unit, and the window may be referred to as an input-sensing panel ISP, an anti-reflection panel RPP, and a window panel WP or to as an input-sensing layer ISL, an anti-reflection layer RPL, and a window layer WL, according to the presence or absence of the base layer.

Figure 2A:
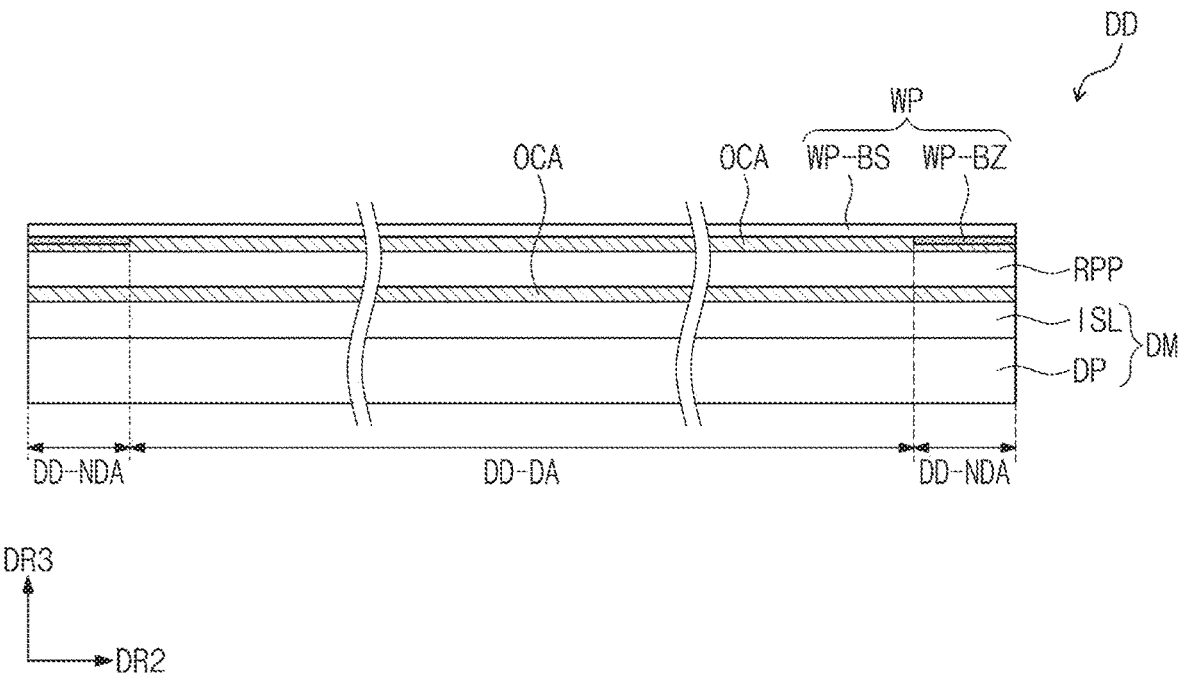
FIGS. 2A, 2B, 2C, and 2D are cross-sectional views each illustrating a display device according to an exemplary embodiment of the invention.

As shown in FIG. 2A, the display device DD may include a display panel DP, an input-sensing layer ISL, an anti-reflection panel RPP, and a window panel WP. The input-sensing layer ISL may be directly provided (or disposed) on the display panel DP. In the present specification, the expression "an element B may be directly provided on an element A" means that an adhesive layer/member is not provided between the elements A and B. After the formation of the element A, the element B may be formed on a base surface, which is provided by the element A, through a successive process step.

The display panel DP and the input-sensing layer ISL, which is directly provided (or disposed) on the display panel DP, may be referred to as a display module DM. An optically clear adhesive OCA may be provided between the display module DM and the anti-reflection panel RPP and between the anti-reflection panel RPP and the window panel WP.

The display panel DP may be configured to generate an image, and the input-sensing layer ISL may be configured to obtain information on coordinates of an external input (e.g., a touch event). The display module DM may further include a protection member provided on a bottom surface of the display panel DP. The protection member and the display panel DP may be combined to each other by an adhesive member. The display devices DD, which will be described with reference to FIGS. 2B to 2D, may further include the protection member.

According to an exemplary embodiment of the invention, the display panel DP may be a light-emitting type display panel, but the inventive concepts are not limited to a specific type of the display panel DP. For example, the display panel DP may be an organic light emitting display panel or a quantum dot light-emitting display panel. A light emitting layer of the organic light emitting display panel may be formed of or include an organic light emitting material. The light emitting layer of the quantum dot light-emitting display panel may include quantum dots and/or quantum rods. For the sake of simplicity, the description that follows will refer to an example in which the display panel DP is the organic light emitting display panel.

The anti-reflection panel RPP may be configured to reduce reflectance of an external light that is incident from an outer space to the window panel WP. In an exemplary embodiment, the anti-reflection panel RPP may include a phase retarder and a polarizer. The phase retarder may be of a film type or a liquid crystal coating type and may include a $\lambda/2$ phase retarder and/or a $\lambda/4$ phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The phase retarder and the polarizer may further include a protection film. At least one of the phase retarder, the polarizer, or the protection films thereof may be used as a base layer of the anti-reflection panel RPP. In an exemplary embodiment, the anti-reflection panel RPP may include a destructive interference structure. For example, the destructive interference structure may include a first reflection layer and a second reflection layer which are provided on different layers. The first reflection layer and the second reflection layer may be configured to allow a first reflection light and a second reflection light, which are respectively reflected by them, to destructively interfere with each other, and this may make it possible to reduce reflectance of the external light.

In an exemplary embodiment, the window panel WP may include a base film WP-BS and a bezel pattern WP-BZ. The base film WP-BS may include a glass substrate and/or a synthetic resin film. The base film WP-BS may not be limited to a single-layered structure. For example, in an exemplary embodiment, the base film WP-BS may include two or more films that are combined to each other by an adhesive film.

The bezel pattern WP-BZ may be partially overlapped with the base film WP-BS. The bezel pattern WP-BZ may be provided on a rear surface of the base film WP-BS to define a bezel region of the display device DD (e.g., the non-display region DD-NDA of FIG. 1).

The bezel pattern WP-BZ may be a colored organic layer and may be formed by, for example, a coating method. The bezel pattern WP-BZ may include a plurality of sequentially-stacked organic layers. A predetermined pattern may be formed in at least one of such organic layers. The window panel WP may further include a functional coating layer provided on the front surface of the base film WP-BS. The functional coating layer may include an anti-fingerprint layer, an anti-reflection layer, a hard coating layer, and so forth.

Figure 2B:
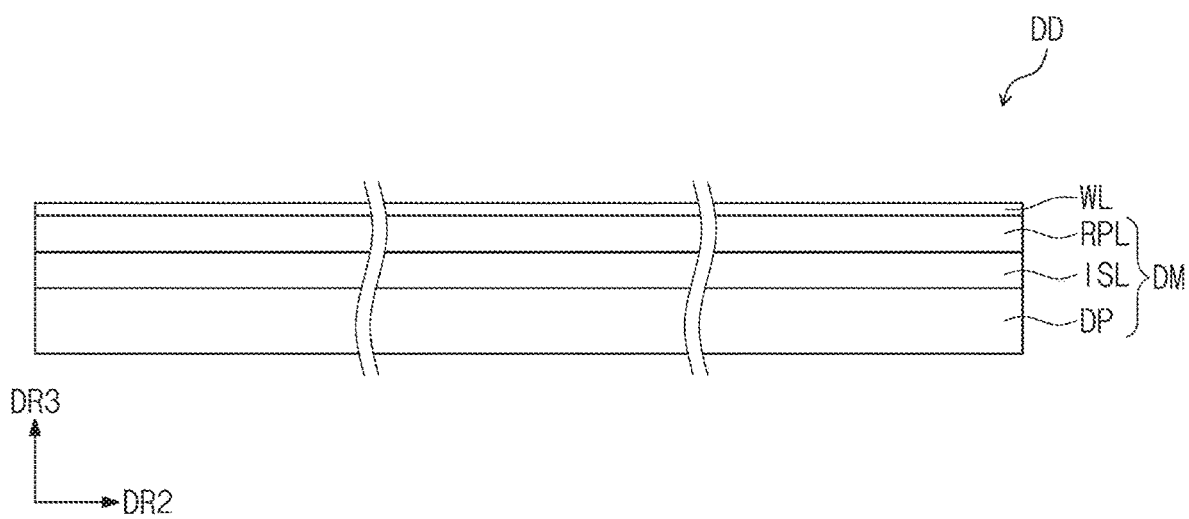
Figure 2C:
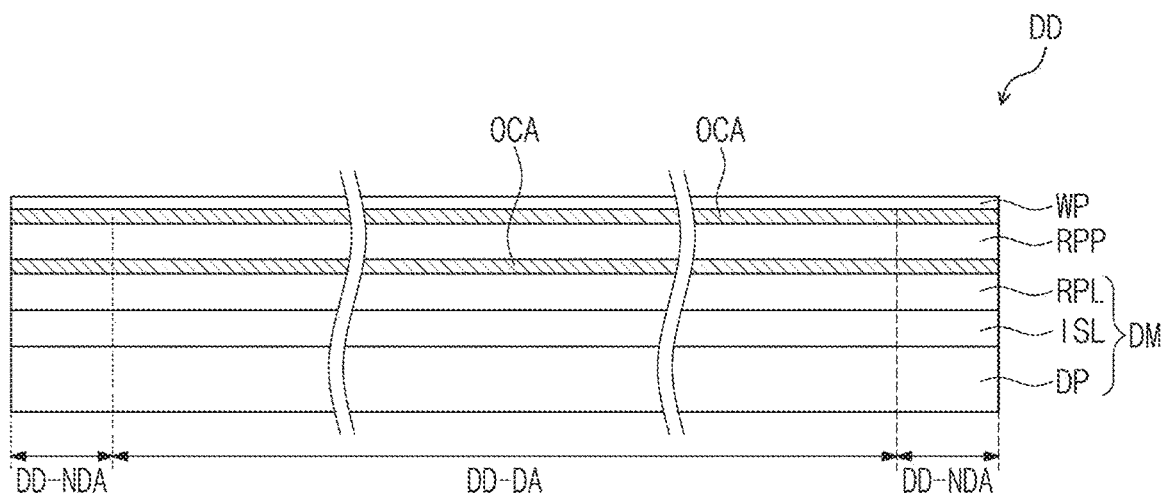
Figure 2C:
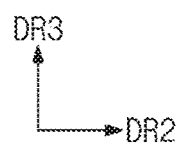
Figure 2D:
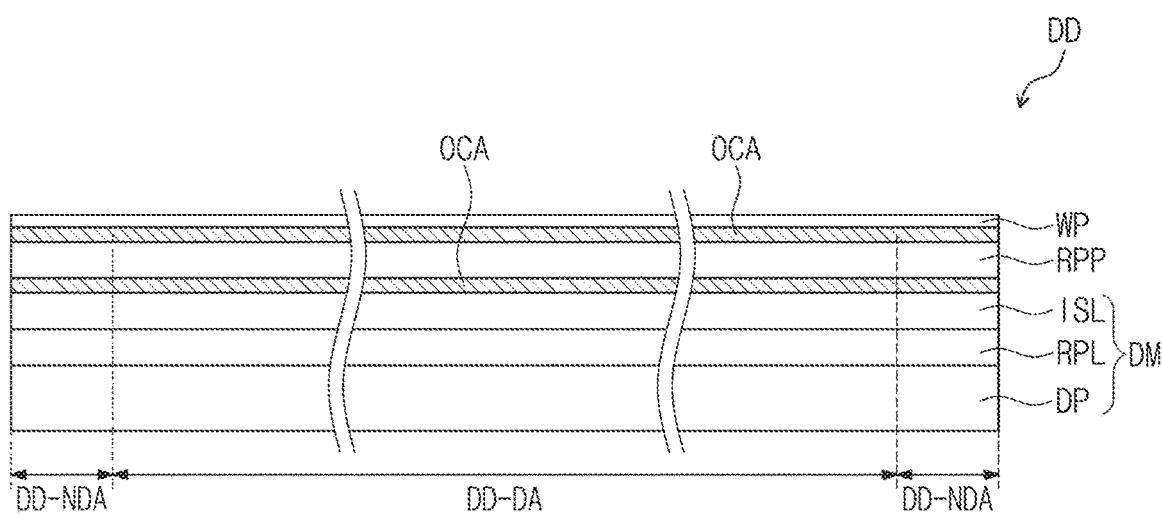
Figure 2D:
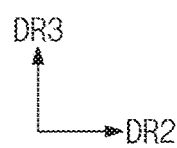

In FIGS. 2B to 2D, the window panel WP and the window layer WL may be illustrated in a simplified manner (e.g., without distinction of the base film WP-BS and the bezel pattern WP-BZ).

As shown in FIG. 2B, the display device DD may include the display panel DP, the input-sensing layer ISL, the anti-reflection layer RPL, and the window layer WL. Adhesive members may be omitted from the display device DD, and the input-sensing layer ISL, the anti-reflection layer RPL, and the window layer WL may be formed on a base surface, which is provided by the display panel DP, by a successive process. The stacking order of the input-sensing layer ISL and the anti-reflection layer RPL may be changed. In an exemplary embodiment, one of the anti-reflection layer RPL and the window layer WL may be provided in the form of panel.

Referring to FIGS. 2C and 2D, the display device DD may include two kinds of anti-reflection units. For example, as shown in FIG. 2C, the anti-reflection layer RPL may be directly provided on the input-sensing layer ISL. As shown in FIG. 2D, the anti-reflection layer RPL may be directly provided on the display panel DP, and the input-sensing layer ISL may be directly provided on the anti-reflection layer RPL.

The optically clear adhesive OCA may be used to attach the anti-reflection layer RPL or the input-sensing layer ISL to the anti-reflection panel RPP. Here, the anti-reflection panel RPP may include a polarizer film, and the anti-reflection layer RPL may include, at least, light-blocking patterns.

In FIGS. 2A to 2D, the input sensor is illustrated to be overlapped with the entire top surface of the display panel DP, but the inventive concepts are not limited thereto. For example, the input sensor may be overlapped with only the display region DD-DA. In an exemplary embodiment, the input sensor may be overlapped with only a portion of the display region DD-DA or with only the non-display region DD-NDA.

The input sensor may be a touch-sensing panel, which is configured to sense a touch event from a user, or a fingerprint-sensing panel, which is configured to read a fingerprint of a user's finger. The input sensor may include a plurality of sensing electrodes, and a pitch or width of the sensing electrodes may be changed according to an intended use of the input sensor. For the touch-sensing panel, the sensing electrodes may have a width ranging from several millimeters to several tens of millimeters, whereas for the fingerprint-sensing panel, the sensing electrodes may have a width ranging from several tens of micrometers to several hundreds of micrometers.

In each of the display devices DD shown in FIGS. 2A to 2D, the input-sensing layer ISL may be placed to be close to the display panel DP, compared with the input sensor of the panel type. Thus, the sensing sensitivity of the input-sensing layer ISL may be greatly affected by noise resulting from the display panel DP.

Figure 3A:
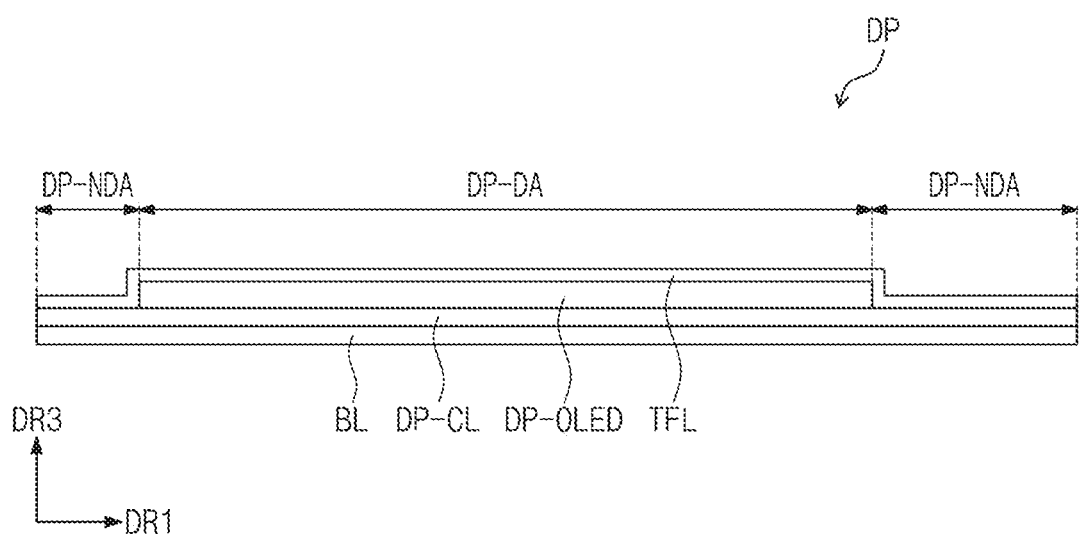
FIG. 3A is a cross-sectional view illustrating a display panel constructed according to an exemplary embodiment of the invention.
Figure 3B:
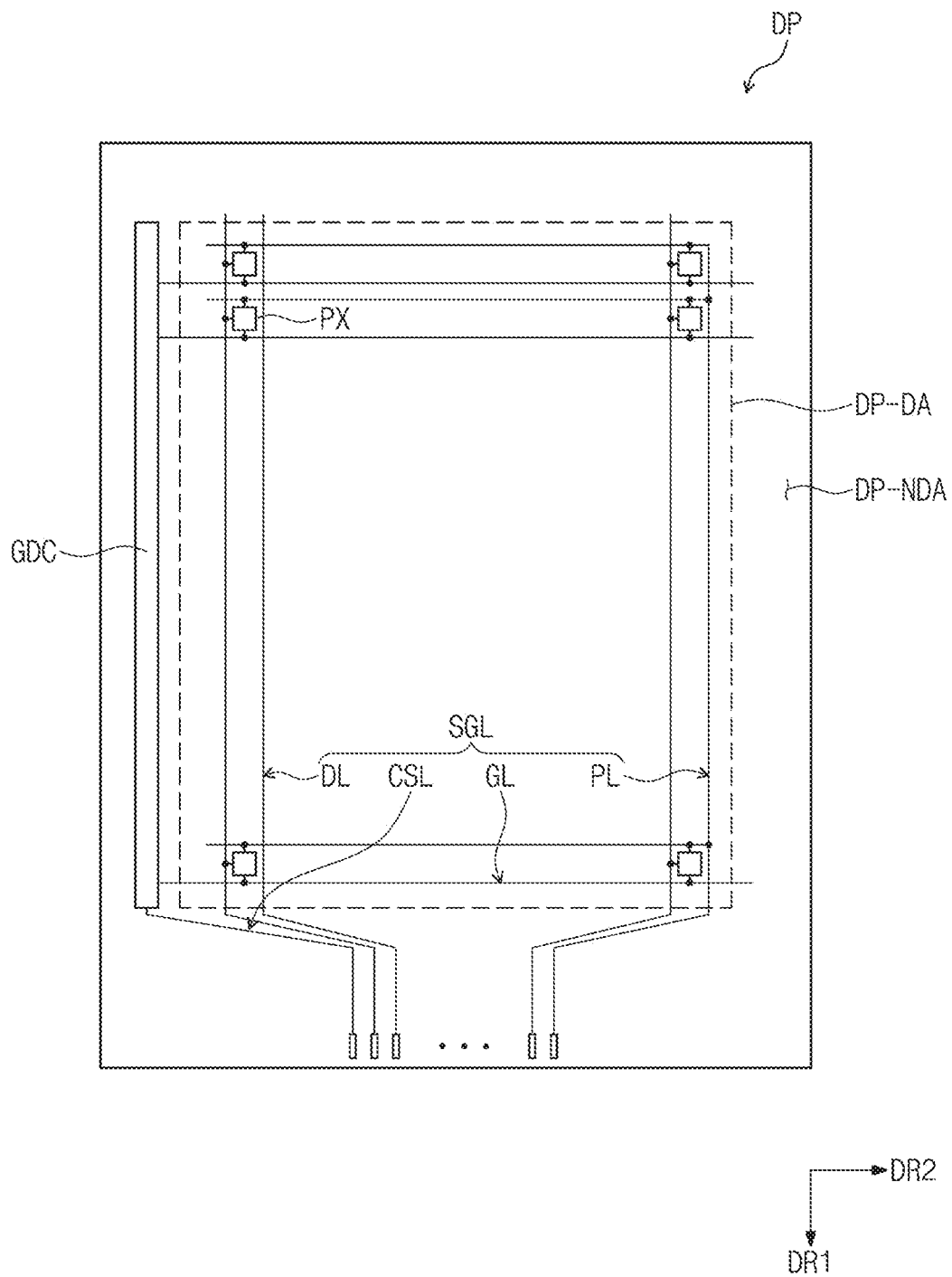
FIG. 3B is a plan view illustrating a display panel constructed according to an exemplary embodiment of the invention.
Figure 3C:
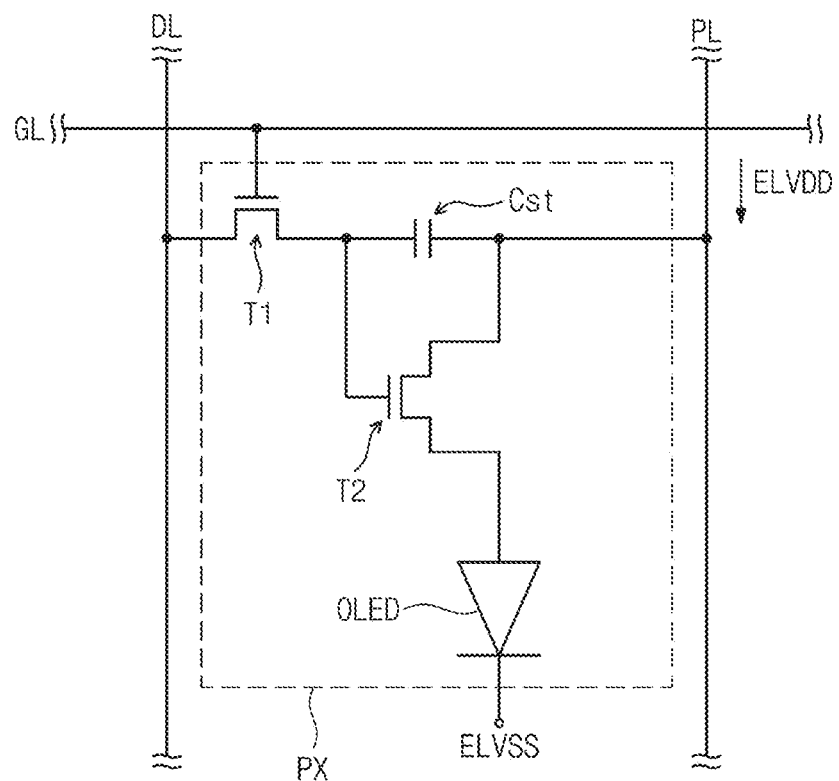
FIG. 3C is an equivalent circuit diagram of a representative pixel constructed according to an exemplary embodiment of the invention.
Figure 3D:
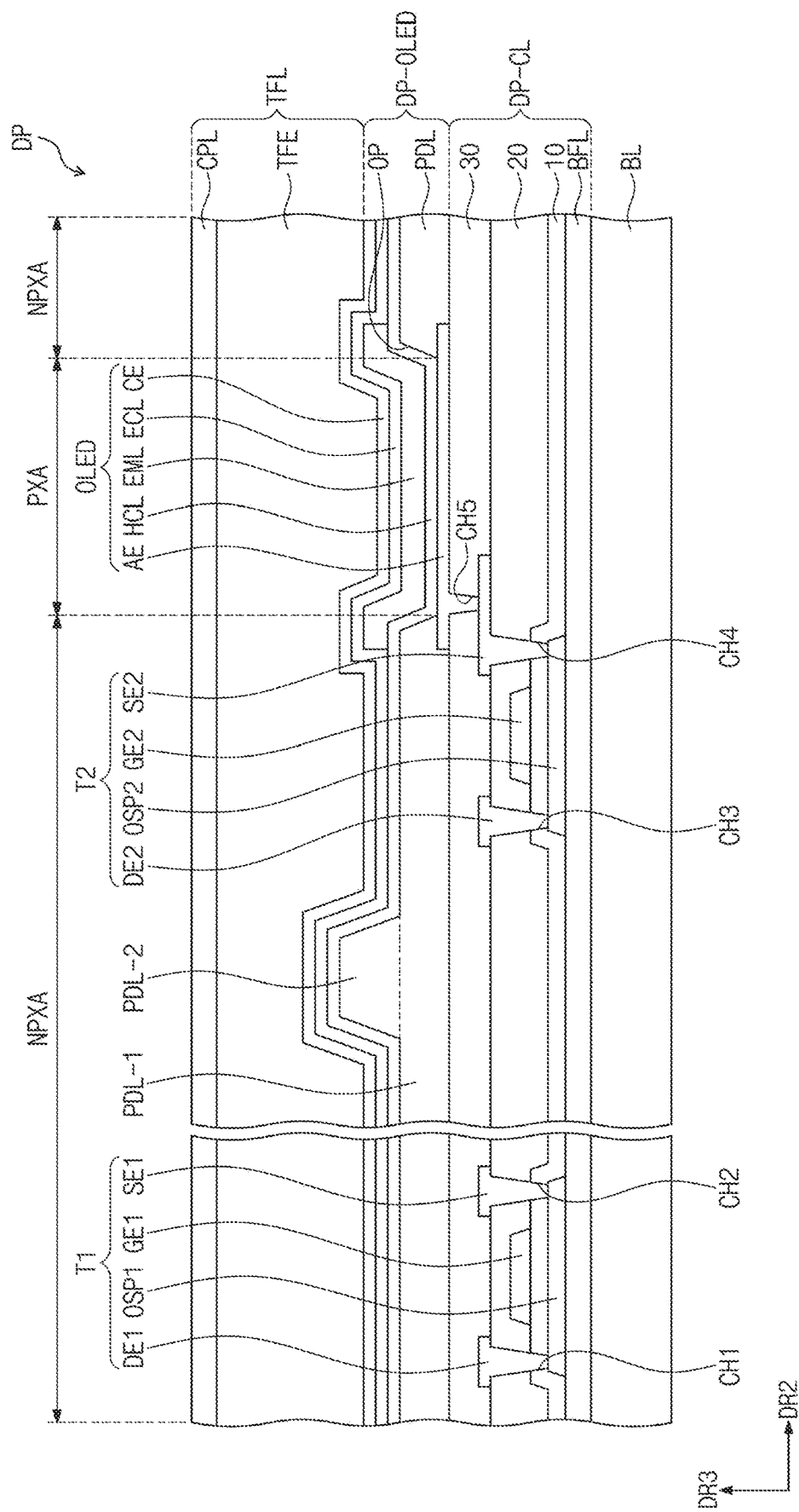
FIGS. 3D and 3E are enlarged cross-sectional views each illustrating a display panel constructed according to an exemplary embodiment of the invention.
Figure 3E:
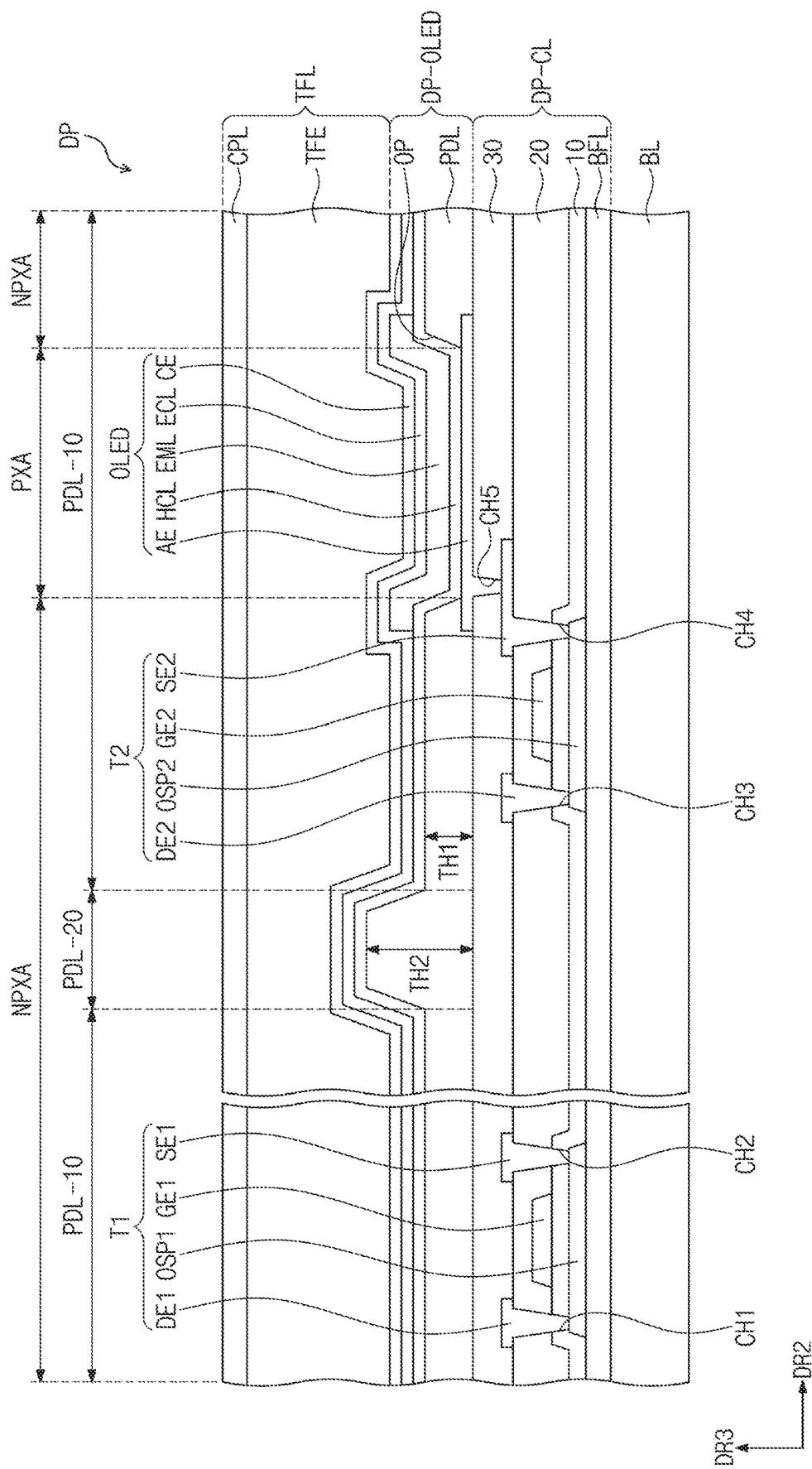

FIG. 3A is a cross-sectional view illustrating the display panel DP constructed according to an exemplary embodiment of the invention. FIG. 3B is a plan view illustrating the display panel DP constructed according to an exemplary embodiment of the invention. FIG. 3C is an equivalent circuit diagram illustrating a representative pixel PX constructed according to an exemplary embodiment of the invention. FIGS. 3D and 3E are enlarged cross-sectional views each illustrating the display panel DP constructed according to an exemplary embodiment of the invention. The display panel DP to be described below may be applied to all of the display devices DD described with reference to FIGS. 2A to 2D.

As shown in FIG. 3A, the display panel DP may include a base layer BL, a circuit device layer DP-CL on the base layer BL, a display device layer DP-OLED on the circuit device layer DP-CL, and an insulating layer TFL (hereinafter, an upper insulating layer) on the display device layer DP-OLED.

The base layer BL may be formed of or include a synthetic resin film. The synthetic resin layer may be formed on a working substrate, which is used to fabricate the display panel DP. Thereafter, a conductive layer, an insulating layer, and so forth may be formed on the synthetic resin layer. If the working substrate is removed, the synthetic resin layer may be used as the base layer BL. The synthetic resin layer may be a polyimide-based resin layer, and the inventive concepts are not limited to a specific material to be used for the base layer BL. In addition, the base layer BL may include a glass substrate, a metal substrate, or an organic/inorganic composite substrate.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display device layer DP-OLED may include a light emitting element. The display device layer DP-OLED may include organic light emitting diodes, which are used as the light emitting element. The display device layer DP-OLED may further include an organic layer, such as a pixel definition layer.

The upper insulating layer TFL may include a thin encapsulation layer, which is used to seal the circuit device layer DP-CL, as will be described below. The upper insulating layer TFL may further include functional layers (e.g., a capping layer or a refractive index control layer).

As shown in FIG. 3B, the display panel DP may include a display region DP-DA and a non-display region DP-NDA, when viewed in a plan view. In the illustrated embodiment, the non-display region DP-NDA may be defined along a border of the display region DP-DA. The display and non-display regions DP-DA and DP-NDA of the display panel DP may correspond to the display and non-display regions DD-DA and DD-NDA, respectively, of the display device DD shown in FIGS. 1 to 2D.

The display panel DP may include a driving circuit GDC, a plurality of signal lines SGL, and a plurality of pixels PX. The pixels PX may be provided in the display region DP-DA. Each of the pixels PX may include a light emitting element and a pixel driving circuit connected thereto. The driving circuit GDC, the signal lines SGL, and the pixel driving circuit may be included in the circuit device layer DP-CL shown in FIG. 3A.

The driving circuit GDC may include a scan driving circuit. The scan driving circuit may be configured to generate a plurality of scan signals and to sequentially output the scan signals to a plurality of scan lines GL to be described below. In addition, the scan driving circuit may be configured to output other control signals to a driving circuit of the pixel PX.

The scan driving circuit may include a plurality of thin-film transistors, which are formed by the same method as that for the driving circuit of the pixels PX or for example by a low-temperature polycrystalline silicon (LTPS) or low-temperature polycrystalline oxide (LTPO) process.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit.

The signal lines SGL may be connected to a circuit board. For example, the signal lines SGL may be connected to a timing control circuit, which is provided in the form of an integrated circuit (IC) chip mounted on the circuit board. In an exemplary embodiment, the IC chip may be provided on the non-display region DP-NDA and may be connected to the signal lines SGL.

FIG. 3C illustrates a scan line GL, a data line DL, a power line PL, and a representative pixel PX connected thereto. The structure of the pixel PX is not limited to the example of FIG. 3C and may be variously changed.

The organic light emitting diode OLED may be a top-emission type diode or a bottom-emission type diode. The pixel PX may include a first or switching transistor T1, a second or driving transistor T2, and a capacitor Cst, which are used as parts of a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

The first transistor T1 may be configured to output a data signal applied to the data line DL, in response to a scan signal applied to the scan line GL. The capacitor Cst may be charged to a voltage corresponding to a data signal received from the first transistor T1. The second transistor T2 may be connected to the organic light emitting diode OLED. The second transistor T2 may be used to control a driving current flowing through the organic light emitting diode OLED, in response to an amount of electric charges stored in the capacitor Cst.

The equivalent circuit of FIG. 3C is just one of possible equivalent circuits for the pixels, but the inventive concepts are not limited thereto. The pixel PX may further include at least one transistor or at least one capacitor. In an exemplary embodiment, the organic light emitting diode OLED may be provided between and coupled to the power line PL and the second transistor T2.

Each of FIGS. 3D and 3E illustrate a portion of the display panel DP, whose pixels have the same circuit structure as the equivalent circuit shown in FIG. 3C. Hereinafter, the display panel DP will be described in more detail with reference to FIG. 3D.

The circuit device layer DP-CL, the display device layer DP-OLED, and a thin encapsulation layer TFE may be sequentially provided. In the illustrated embodiment, the circuit device layer DP-CL may include a buffer layer BFL, a first intermediate inorganic layer 10, and a second intermediate inorganic layer 20, which are formed of inorganic materials, and an intermediate organic layer 30, which is formed of an organic material. The inorganic and organic materials are not limited to specific materials, and in an exemplary embodiment, the buffer layer BFL may be selectively provided or may be omitted.

A semiconductor pattern OSP1 (hereinafter, a first semiconductor pattern) of the first transistor T1 and a semiconductor pattern OSP2 (hereinafter, a second semiconductor pattern) of the second transistor T2 may be provided on the buffer layer BFL. The first and second semiconductor patterns OSP1 and OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. A control electrode GE1 (hereinafter, a first control electrode) of the first transistor T1 and a control electrode GE2 (hereinafter, a second control electrode) of the second transistor T2 may be provided on the first intermediate inorganic layer 10. The first control electrode GE1 and the second control electrode GE2 may be fabricated by the same photolithography process as that for the scan lines GL (e.g., see FIG. 3B).

The second intermediate inorganic layer 20 may be provided on the first intermediate inorganic layer 10 to cover the first control electrode GE1 and the second control electrode GE2. An input electrode DE1 and an output electrode SE1 (hereinafter, a first input electrode and a first output electrode) of the first transistor T1 and an input electrode DE2 and an output electrode SE2 (hereinafter, a second input electrode and a second output electrode) of the second transistor T2 may be provided on the second intermediate inorganic layer 20.

The first input electrode DE1 and the first output electrode SE1 may be respectively connected to the first semiconductor pattern OSP1 through a first penetration hole CH1 and a second penetration hole CH2, which are formed to penetrate the first intermediate inorganic layer 10 and the second intermediate inorganic layer 20. The second input electrode DE2 and the second output electrode SE2 may be respectively connected to the second semiconductor pattern OSP2 through a third penetration hole CH3 and a fourth penetration hole CH4, which are formed to penetrate the first intermediate inorganic layer 10 and the second intermediate inorganic layer 20. In an exemplary embodiment, at least one of the first transistor T1 and the second transistor T2 may have a bottom gate structure.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may have a substantially flat surface (e.g., a flat top surface).

The display device layer DP-OLED may be provided on the intermediate organic layer 30. The display device layer DP-OLED may include a pixel definition layer PDL and the organic light emitting diode OLED. A first electrode AE may be provided on the intermediate organic layer 30. The first electrode AE may be connected to the second output electrode SE2 through a fifth through hole CH5 penetrating the intermediate organic layer 30. An opening OP may be defined in the pixel definition layer PDL. The opening OP of the pixel definition layer PDL may be formed to expose at least a portion of the first electrode AE.

As shown in FIG. 3D, the pixel definition layer PDL may be divided into two distinguishable portions. For example, the pixel definition layer PDL may include a first portion PDL-1, in which the opening OP exposing the first electrode AE is defined, and a second portion PDL-2, which is provided on and partially overlapped with the first portion PDL-1. In other words, the first portion PDL-1 and the second portion PDL-2 may be two portions that are distinguished from each other in the third direction DR3. The first portion PDL-1 may be in contact with the intermediate organic layer 30. In the illustrated embodiment, the intermediate organic layer 30 may provide a base surface, on which the pixel definition layer PDL and the first electrode AE are directly provided.

The pixel definition layer PDL may also be divided into two portions, when viewed in a plan view. For example, as shown in FIG. 3E, when viewed in the second direction DR2, the pixel definition layer PDL may include a main portion PDL-10, in which the opening OP exposing the first electrode AE is defined, and a sub portion PDL-20, which is located adjacent to the main portion PDL-10 and is thicker than the main portion PDL-10.

A thickness TH1 of the main portion PDL-10 may be about 40% to about 60% of a thickness TH2 of the sub portion PDL-20. The thickness TH2 may be a vertical length of the sub portion PDL-20 that is measured at a center region of the sub portion PDL-20.

The pixel definition layer PDL having the two portions may be formed by removing a portion of the pixel definition layer PDL using a halftone mask. As a result, the two portions of the pixel definition layer PDL may be provided in the form of a continuous single body. In an exemplary embodiment, the formation of the pixel definition layer PDL may include forming an insulating layer, which corresponds to the first portion PDL-1 of FIG. 3D, and then forming a spacer, which corresponds to the second portion PDL-2, using a printing method. In this case, there may be an interface between the two portions of the pixel definition layer PDL.

The display region DP-DA of FIG. 3B may include a light-emitting region PXA and a non-light-emitting region NPXA adjacent to the light-emitting region PXA, as shown in FIG. 3D. The non-light-emitting region NPXA may surround the light-emitting region PXA. In the illustrated embodiment, the light-emitting region PXA may correspond to a portion of the first electrode AE exposed by the opening OP.

In an exemplary embodiment, the light-emitting region PXA may be overlapped with at least one of the first and second transistors T1 and T2. The opening OP may be formed to have an increased width, and in this case, each of the first electrode AE and a light emitting layer EML to be described below may be formed to have an increased width.

A hole control layer HCL may be commonly provided in the light-emitting region PXA and the non-light-emitting region NPXA. A common layer, such as the hole control layer HCL, may be provided in common in the pixels PX (e.g., see FIG. 3B). The hole control layer HCL may include a hole transport layer and, in an exemplary embodiment, the hole control layer HCL may further include a hole injection layer.

The light emitting layer EML may be provided on the hole control layer HCL. The light emitting layer EML may be provided on a region corresponding to the opening OP. In other words, the light emitting layer EML may include a plurality of isolated patterns, each of which is provided for a corresponding one of the pixels PX. The light emitting layer EML may be formed of or include at least one of organic or inorganic materials. The light emitting layer EML may be configured to generate a specific color light.

An electron control layer ECL may be provided on the light emitting layer EML. The electron control layer ECL may be provided in all the pixels PX (e.g., see FIG. 3B). The electron control layer ECL may include an electron transport layer, and in an exemplary embodiment, the electron control layer ECL may further include an electron injection layer. A second electrode CE may be provided on the electron control layer ECL. The second electrode CE may be provided in common in the pixels PX.

The upper insulating layer TFL may be provided on the second electrode CE. The upper insulating layer TFL may include a plurality of thin films. For example, as shown in FIG. 3D, the upper insulating layer TFL may include the thin encapsulation layer TFE and a capping layer CPL. The thin film encapsulation layer TFE and the capping layer (CPL) may be distinguished each other in their functions.

In the illustrated embodiment, the thin encapsulation layer TFE may be fully overlapped with the display region DP-DA of FIGS. 3A and 3B. The thin encapsulation layer TFE may be used to hermetically seal the organic light emitting diode OLED provided on the display region DP-DA. The thin encapsulation layer TFE may not be provided on the non-display region DP-NDA or may be provided on only a portion of the non-display region DP-NDA. The stacking structure of the thin encapsulation layer TFE will be described in more detail below.

The capping layer CPL may wholly cover the display region DP-DA and the non-display region DP-NDA. The capping layer CPL may hermetically seal the thin encapsulation layer TFE. In the case where the thin encapsulation layer TFE is provided to wholly cover the display region DP-DA and the non-display region DP-NDA, the capping layer CPL may be omitted.

In an exemplary embodiment, the organic light emitting diode OLED may further include a resonance structure, which is used to control a resonance distance of light emitted from the light emitting layer EML. The resonance structure may be provided between the first electrode AE and the second electrode CE, and a thickness of the resonance structure may be determined, depending on a wavelength of light to be emitted from the light emitting layer EML.

Figure 4A:
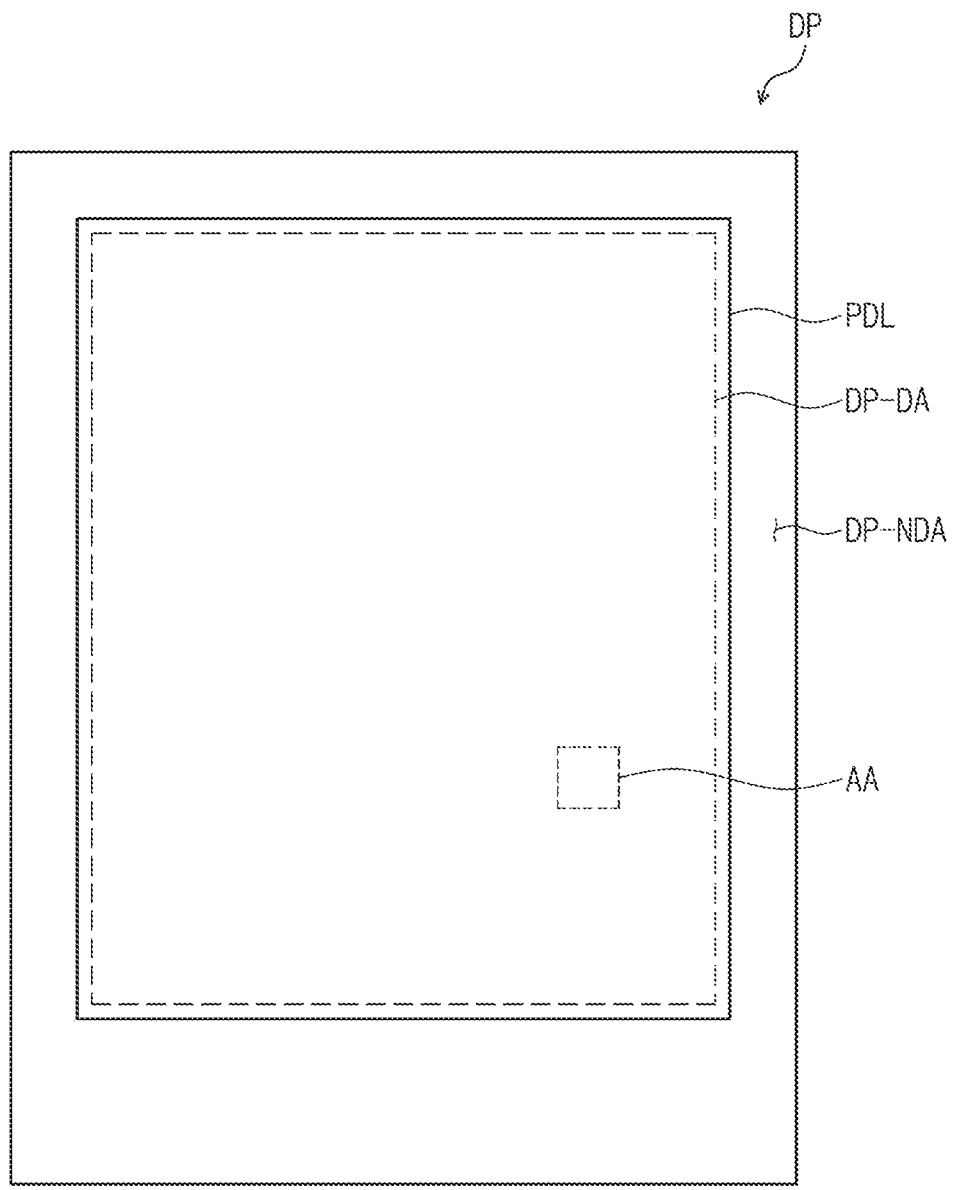
FIG. 4A is a plan view illustrating a display panel in a specific step of a fabrication process according to an exemplary embodiment of the invention.
Figure 4B:
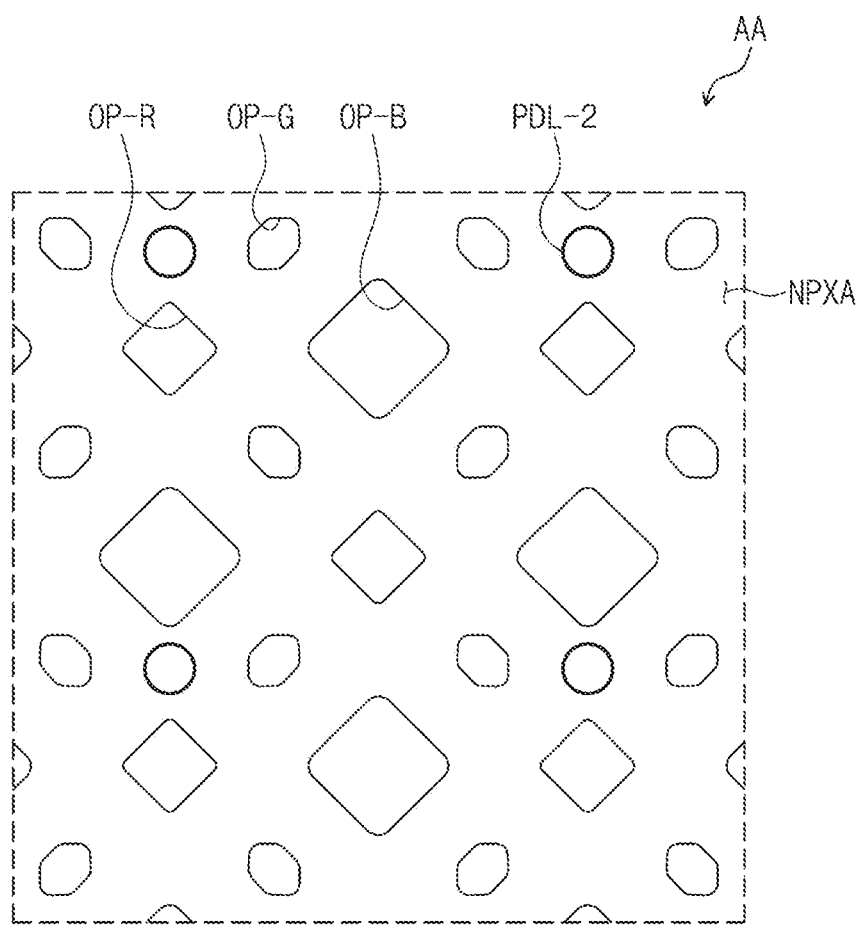
FIG. 4B is an enlarged plan view illustrating region AA of the display panel of FIG. 4A.
Figure 4C:
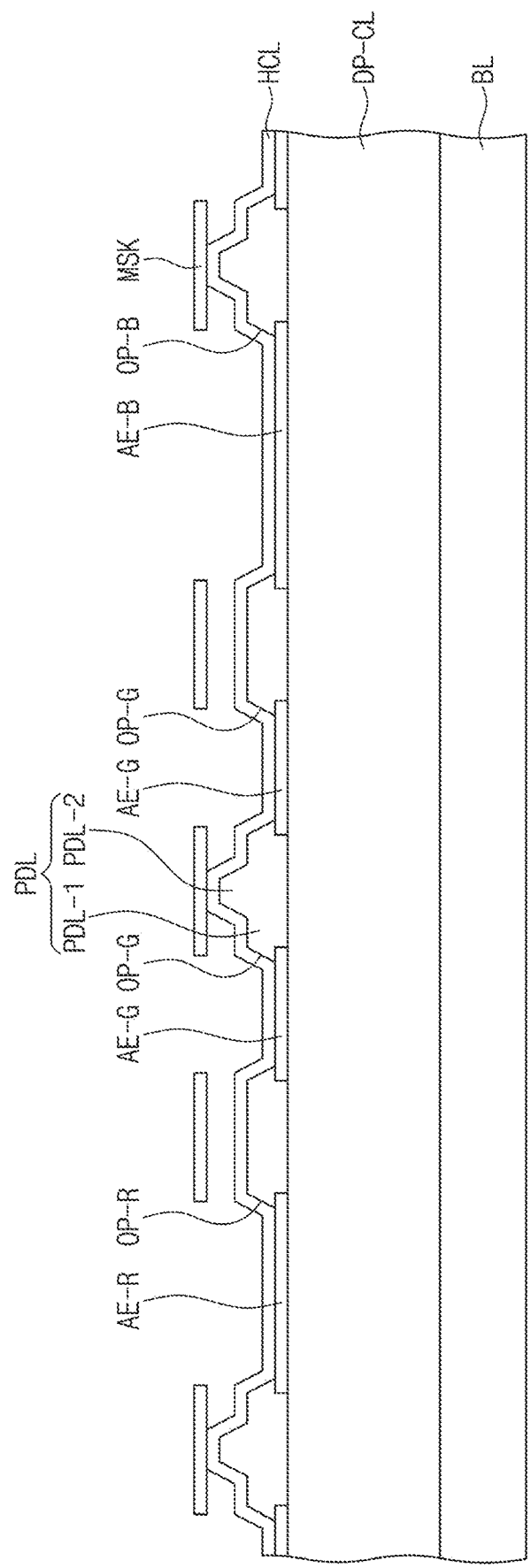
FIG. 4C is a cross-sectional view illustrating a display panel in a specific step of a fabrication process according to an exemplary embodiment of the invention.

FIG. 4A is a plan view illustrating the display panel DP in a specific step of a fabrication process according to an exemplary embodiment of the invention. FIG. 4B is an enlarged plan view illustrating region AA of the display panel DP of FIG. 4A. FIG. 4C is a cross-sectional view illustrating the display panel DP in a specific step of a fabrication process according to an exemplary embodiment of the invention. Hereinafter, the pixel definition layer PDL of FIGS. 3D and 3E will be described in more detail with reference to FIGS. 4A to 4C.

As shown in FIG. 4A, the pixel definition layer PDL may be overlapped with the entire region of the display region DP-DA. In an exemplary embodiment, an organic layer may be formed on the intermediate organic layer 30 and may be patterned using photolithography and etching processes. As a result, the pixel definition layer PDL, which is divided into two portions and has a plurality of openings, may be formed.

FIG. 4B shows an enlarged shape of a region 'AA' of FIG. 4A. As shown in FIG. 4B, three types of openings may be formed in the pixel definition layer PDL. Such openings may be classified into a first-type opening OP-G, a second-type opening OP-R, and a third-type opening OP-B, based on its area. The area of each of the first-, second-, and third-type openings OP-G, OP-R, and OP-B may be proportional to a light emitting area of a corresponding pixel.

The pixels PX of FIG. 3B may include a green pixel, a red pixel, and a blue pixel, which are configured to emit green, red, and blue lights, respectively. In the illustrated embodiment, the first-, second-, and third-type openings OP-G, OP-R, and OP-B may correspond to the green, red, and blue pixels, respectively.

When viewed in a plan view, as shown in FIG. 4B, the second portion PDL-2 may be provided at a region (hereinafter, spacer region), which is surrounded by two first-type openings OP-G, one second-type opening OP-R, and one third-type opening OP-B. A plurality of spacer regions may be defined in the pixel definition layer PDL, and the second portions PDL-2 may be provided at some of the spacer regions.

The shape of the second portion PDL-2 may be variously changed. For example, when viewed in a plan view, the second portion PDL-2 may have a circular, rectangular, or square shape. A length of a side (or a diameter) of the second portion PDL-2 may range from about 10 µm to about 25 µm. In this case, the second portion PDL-2 may meet functional requirement for a spacer to be described below. The second portion PDL-2 may be spaced apart from the first-, second-, and third-type openings OP-G, OP-R, and OP-B by a distance of about 5-10 μm, when viewed in a plan view.

As shown in FIG. 4C, the second portion PDL-2 may support a mask MSK. The mask MSK may be used in a subsequent process of depositing the light emitting layer EML of FIG. 3D. In an exemplary embodiment, the mask MSK may be in contact with the hole control layer HCL provided on the second portion PDL-2. In the process of depositing the light emitting layer EML, the second portion PDL-2 may be used to support the mask MSK and thereby to prevent the mask MSK from being in contact with active regions of the hole control layer HCL corresponding to the first-, second-, and third-type openings OP-G, OP-R, and OP-B. That is, the second portion PDL-2 may be used as the spacer for separating the light emitting layer EML from the mask MSK.

As shown in FIG. 4C, a first-type first electrode AE-G, a second-type first electrode AE-R, and a third-type first electrode AE-B may be provided at regions corresponding to the first-, second-, and third-type openings OP-G, OP-R, and OP-B, respectively. The first-type first electrode AE-G may have a first area, the second-type first electrode AE-R may have a second area larger than the first area, and the third-type first electrode AE-B may have a third area larger than the second area. An area of each of the first-, second-, and third-type first electrodes AE-G, AE-R, and AE-B may determine a light emitting area of a corresponding pixel. For example, a light emitting area of each pixel may be proportional to an area of a corresponding one of the first-, second-, and third-type first electrodes AE-G, AE-R, and AE-B.

FIGS. 5A to 5D are cross-sectional views each illustrating the thin encapsulation layer TFE constructed according to an exemplary embodiment of the invention. The thin encapsulation layer TFE may include at least one insulating layer. In an exemplary embodiment, the thin encapsulation layer TFE may include at least one inorganic layer (hereinafter, an inorganic encapsulation layer). In an exemplary embodiment, the thin encapsulation layer TFE may include at least one organic layer (hereinafter, an organic encapsulation layer) and at least one inorganic encapsulation layer.

The inorganic encapsulation layer may be used to protect the display device layer DP-OLED (e.g., of FIG. 3A) from moisture or oxygen, and the organic encapsulation layer may be used to protect the display device layer DP-OLED from a contamination material such as dust particles. The inorganic encapsulation layer may include at least one of a silicon nitride layer, a silicon oxynitride layer, a silicon oxide layer, a titanium oxide layer, or an aluminum oxide layer, but the inventive concepts are not limited thereto. The organic encapsulation layer may include an acrylic organic layer, but the inventive concepts are not limited thereto.

Figure 5A:
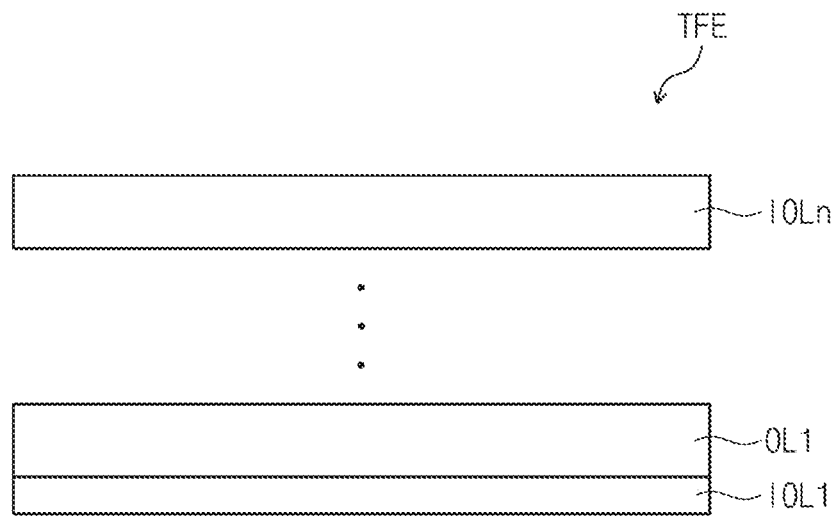
FIGS. 5A, 5B, 5C, and 5D are cross-sectional views each illustrating a thin encapsulation layer constructed according to an exemplary embodiment of the invention.

As shown in FIG. 5A, the thin encapsulation layer TFE may include n inorganic encapsulation layers IOL1 to IOLn, where n is a natural number larger than 2. Here, the first one (i.e., IOL1) of the inorganic encapsulation layers may be in contact with the second electrode CE (e.g., see FIG. 3D).

The thin encapsulation layer TFE may further include (n−1) organic encapsulation layers OL1, and in an exemplary embodiment, the (n−1) organic encapsulation layers OL1 and the n inorganic encapsulation layers IOL1 to IOLn may be alternately provided. Each of the (n−1) organic encapsulation layers OL1 may have a thickness that is larger than a mean thickness of the n inorganic encapsulation layers IOL1 to IOLn.

Each of the n inorganic encapsulation layers IOL1 to IOLn may be a single layer made of a single material or may be a multi-layered structure, in which at least two layers made of different materials are included. The (n−1) organic encapsulation layers OL1 may be formed by a process of depositing organic monomers. The organic monomers may include, for example, at least one of acryl-based monomers, but the inventive concepts are not limited thereto.

In an exemplary embodiment, the thin encapsulation layer TFE may include a silicon oxynitride layer, an organic monomer layer, and a silicon nitride layer, which are sequentially stacked on the second electrode CE. In an exemplary embodiment, another inorganic layer may be provided on the silicon nitride layer, and the silicon nitride layer may be a double layered structure (e.g., including two layers deposited under different conditions).

In an exemplary embodiment, the thin encapsulation layer TFE may include a first inorganic encapsulation layer IOL1, an organic encapsulation layer OL1, and a second inorganic encapsulation layer IOL2.

Figure 5B:
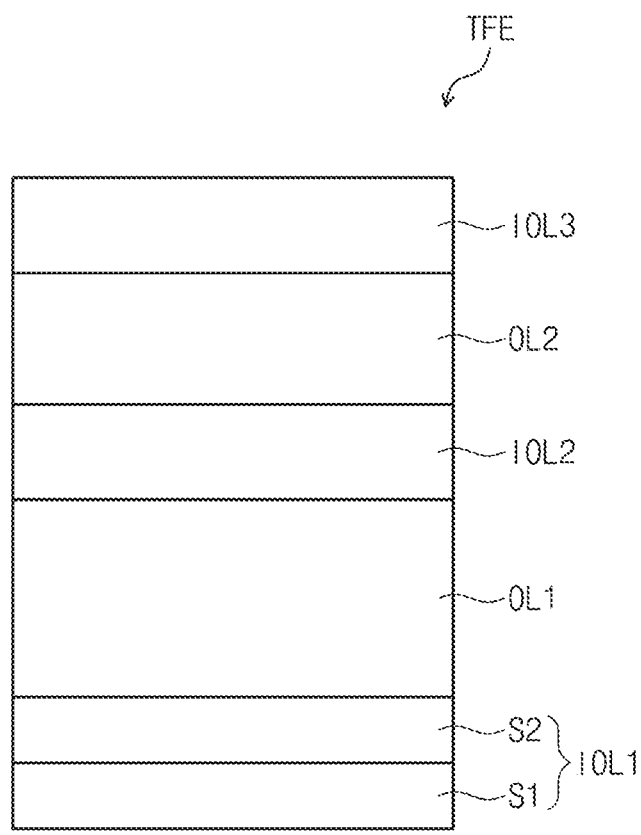

As shown in FIG. 5B, the thin encapsulation layer TFE may include a first inorganic encapsulation layer IOL1, a first organic encapsulation layer OL1, a second inorganic encapsulation layer IOL2, a second organic encapsulation layer OL2, and a third inorganic encapsulation layer IOL3, which are sequentially stacked.

The first inorganic encapsulation layer IOL1 may have a double-layered structure. A first sub-layer S1 may be a lithium fluoride layer, and a second sub-layer S2 may be an aluminum oxide layer. The first organic encapsulation layer OL1 may be a first organic monomer layer, the second inorganic encapsulation layer IOL2 may be a first silicon nitride layer, the second organic encapsulation layer OL2 may be a second organic monomer layer, and the third inorganic encapsulation layer IOL3 may be a second silicon nitride layer.

Figure 5C:
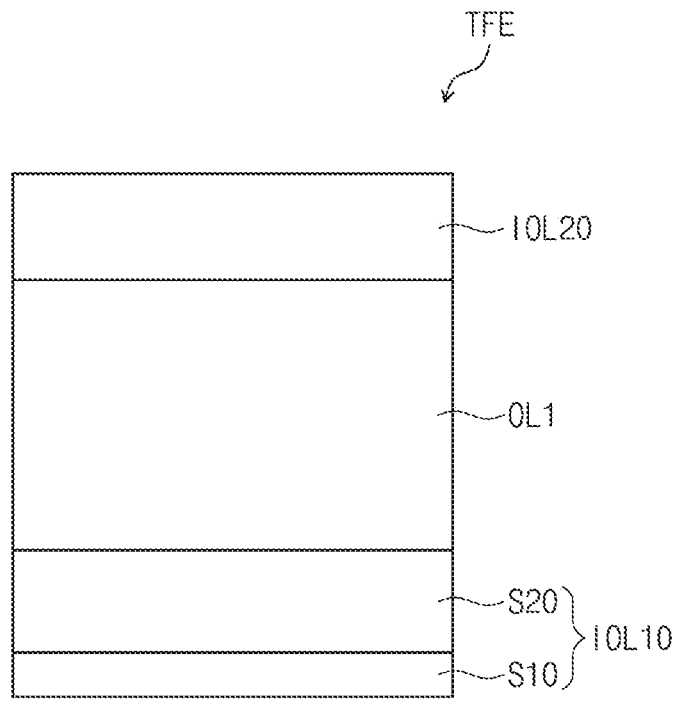

As shown in FIG. 5C, the thin encapsulation layer TFE may include a first inorganic encapsulation layer IOL10, a first organic encapsulation layer OL1, and a second inorganic encapsulation layer IOL20, which are sequentially stacked. The first inorganic encapsulation layer IOL10 may have a double-layered structure.

A first sub-layer S10 may be a lithium fluoride layer, and a second sub-layer S20 may be a silicon oxynitride layer. The first organic encapsulation layer OL1 may include an acrylic monomer, and the second inorganic encapsulation layer IOL20 may be a silicon nitride layer. In the case where the thin encapsulation layer TFE of FIG. 5C is used as a part of the display panel DP of FIG. 3D, the capping layer CPL may be a silicon nitride layer, which is formed under a deposition condition different from that for the second inorganic encapsulation layer IOL20.

Figure 5D:
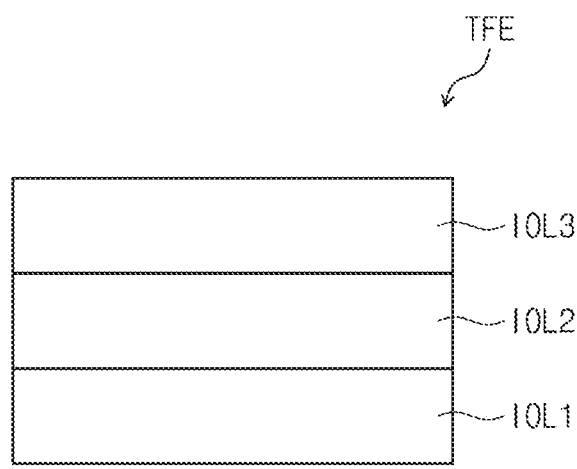

As shown in FIG. 5D, the thin encapsulation layer TFE may include a plurality of inorganic encapsulation layers, which are sequentially stacked. The thin encapsulation layer TFE may include the first inorganic encapsulation layer IOL1, the second inorganic encapsulation layer IOL2, and the third inorganic encapsulation layer IOL3. At least one of the inorganic encapsulation layers may be or include a silicon nitride layer, a silicon oxynitride layer, a silicon oxide layer, a titanium oxide layer, or an aluminum oxide layer. For example, the first and third inorganic encapsulation layers IOL1 and IOL3 may be or include a silicon nitride layer, a silicon oxynitride layer, a silicon oxide layer, a titanium oxide layer, or an aluminum oxide layer.

At least one of the inorganic encapsulation layers may be or include a hexamethyldisiloxane (HMDSO) layer. The HMDSO layer may have a stress-absorption property. The second inorganic encapsulation layer IOL2 may be the HMDSO layer. The second inorganic encapsulation layer IOL2 may be used to absorb stress of the first and third inorganic encapsulation layers IOL1 and IOL3. Accordingly, the thin encapsulation layer TFE may become more flexible.

In the case where the thin encapsulation layer TFE has only the inorganic encapsulation layers, it may be possible to form the thin encapsulation layer TFE within a single chamber through a successive deposition process, and thus to simplify a process of forming the thin encapsulation layer TFE. By contrast, in the case where the thin encapsulation layer TFE has at least one organic encapsulation layer and at least one inorganic encapsulation layer, it is necessary to change a process chamber in use at least one time. In the case where one of the inorganic encapsulation layers is the HMDSO layer, the thin encapsulation layer TFE may have increased flexibility.

Figure 6A:
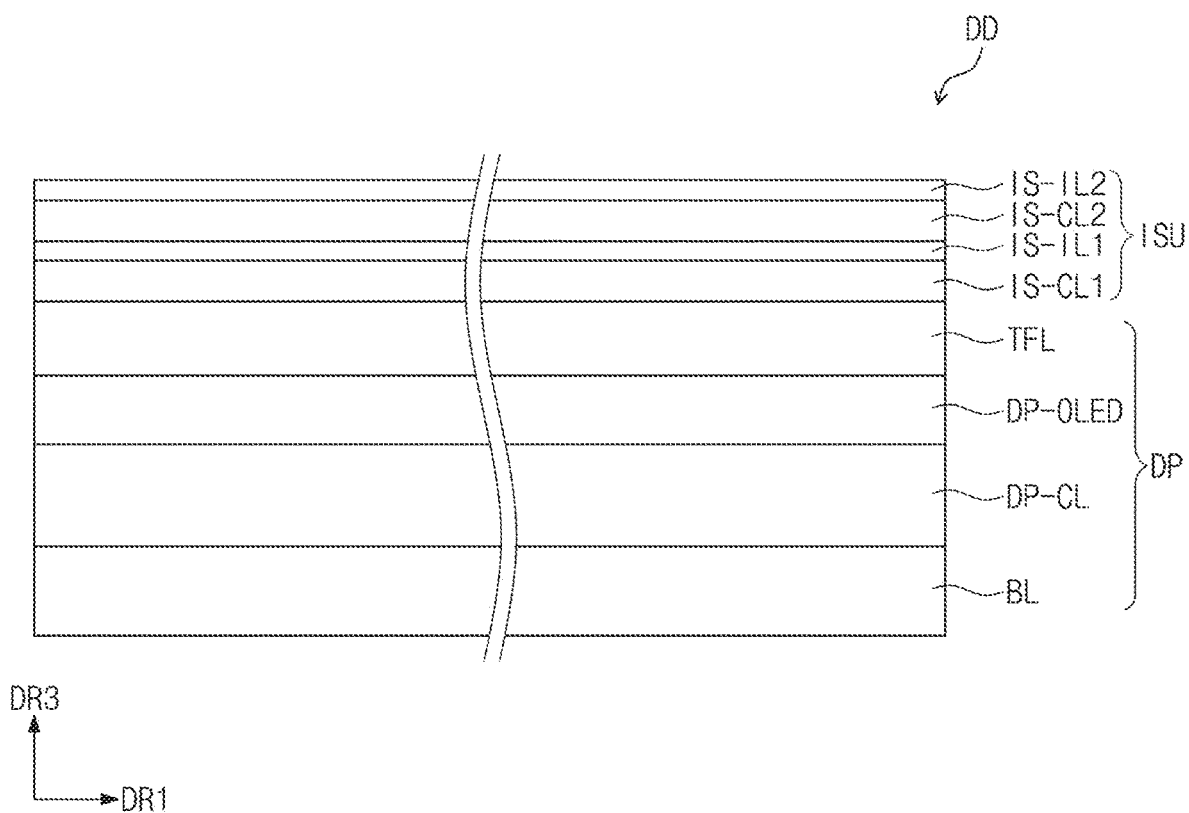
FIG. 6A is a cross-sectional view illustrating a display device constructed according to an exemplary embodiment of the invention.
Figure 6B:
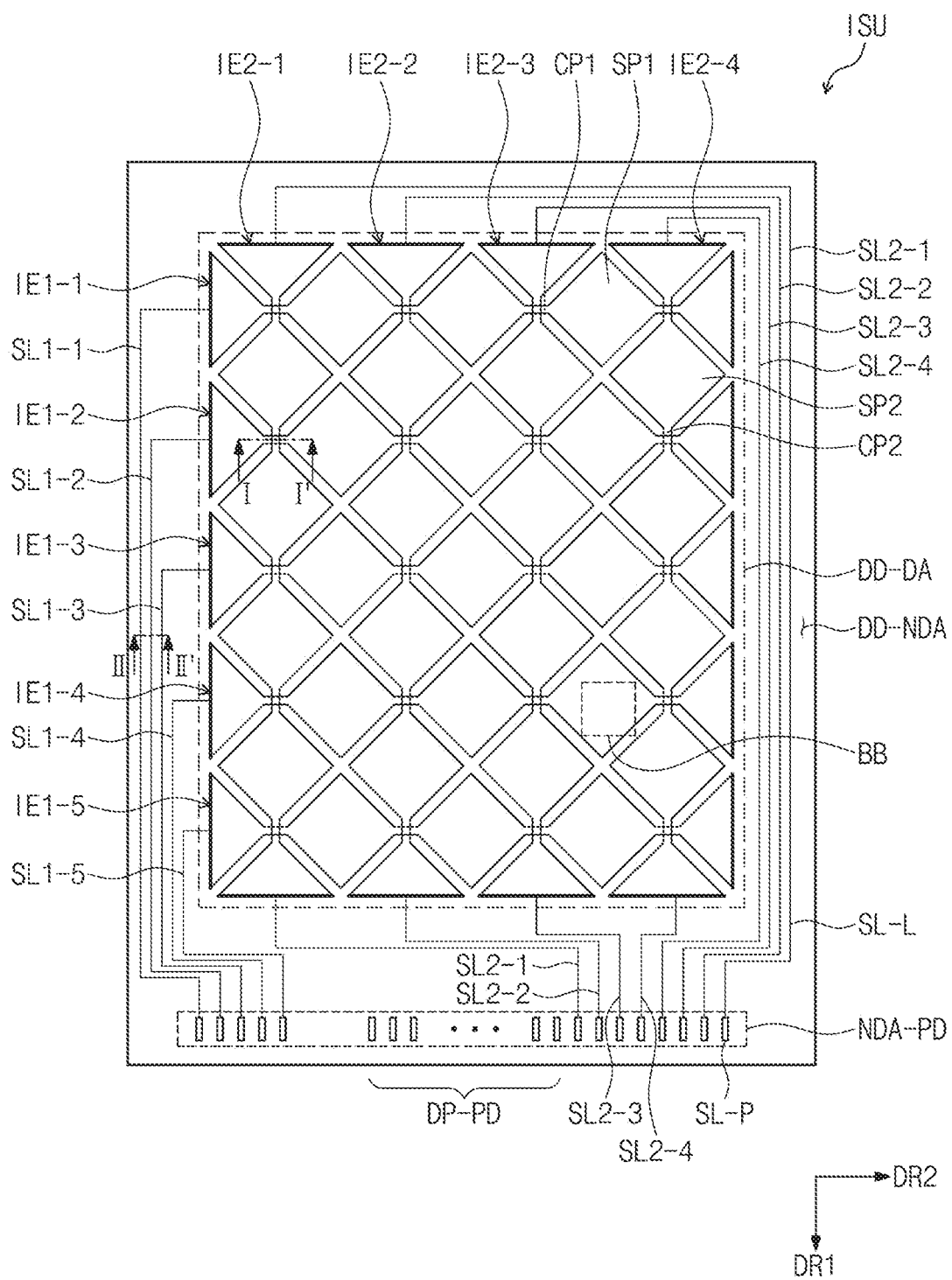
FIG. 6B is a plan view illustrating an input sensor constructed according to an exemplary embodiment of the invention.
Figure 6C:
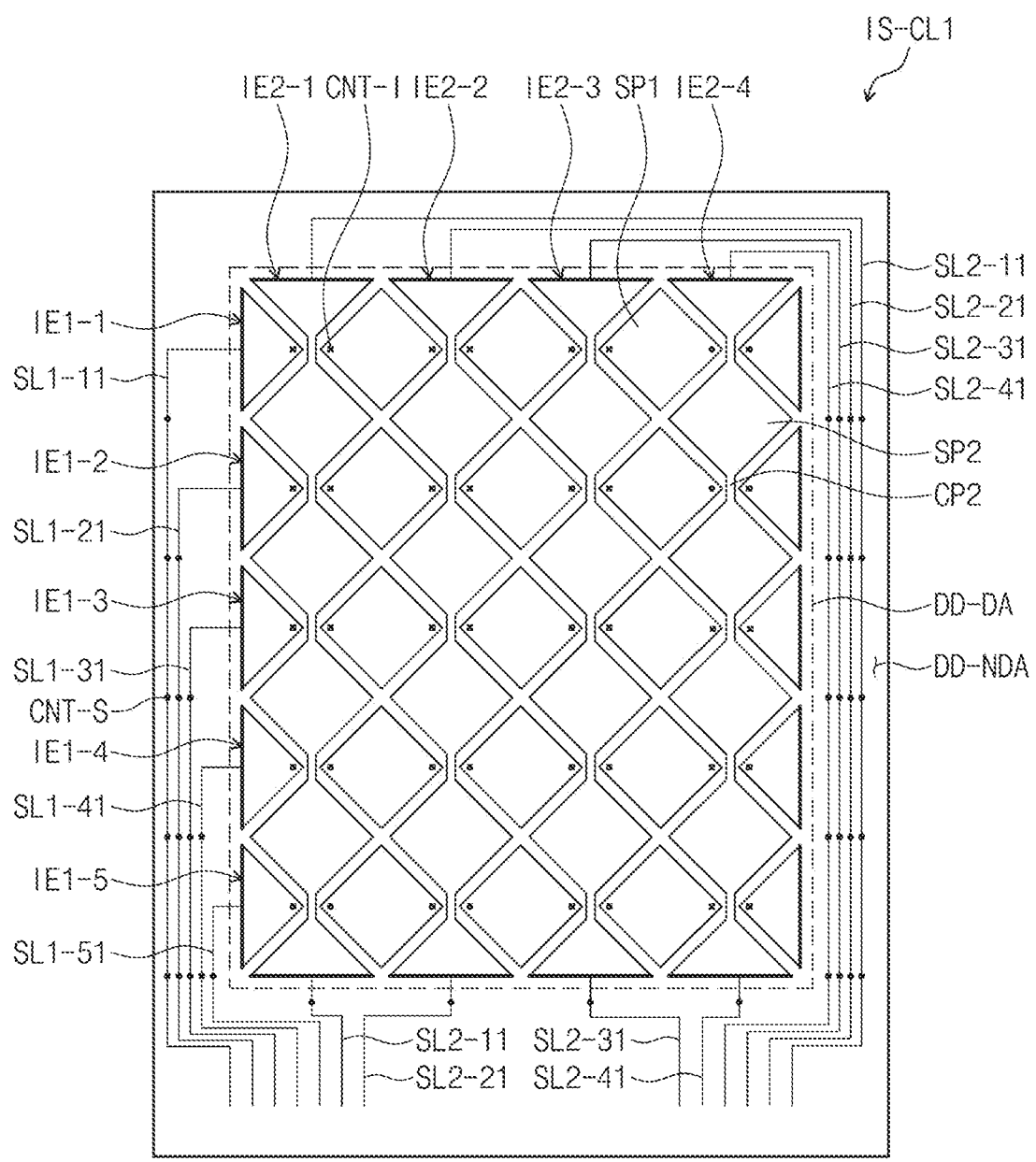
FIG. 6C is a plan view illustrating a first conductive layer of an input sensor constructed according to an exemplary embodiment of the invention.
Figure 6D:
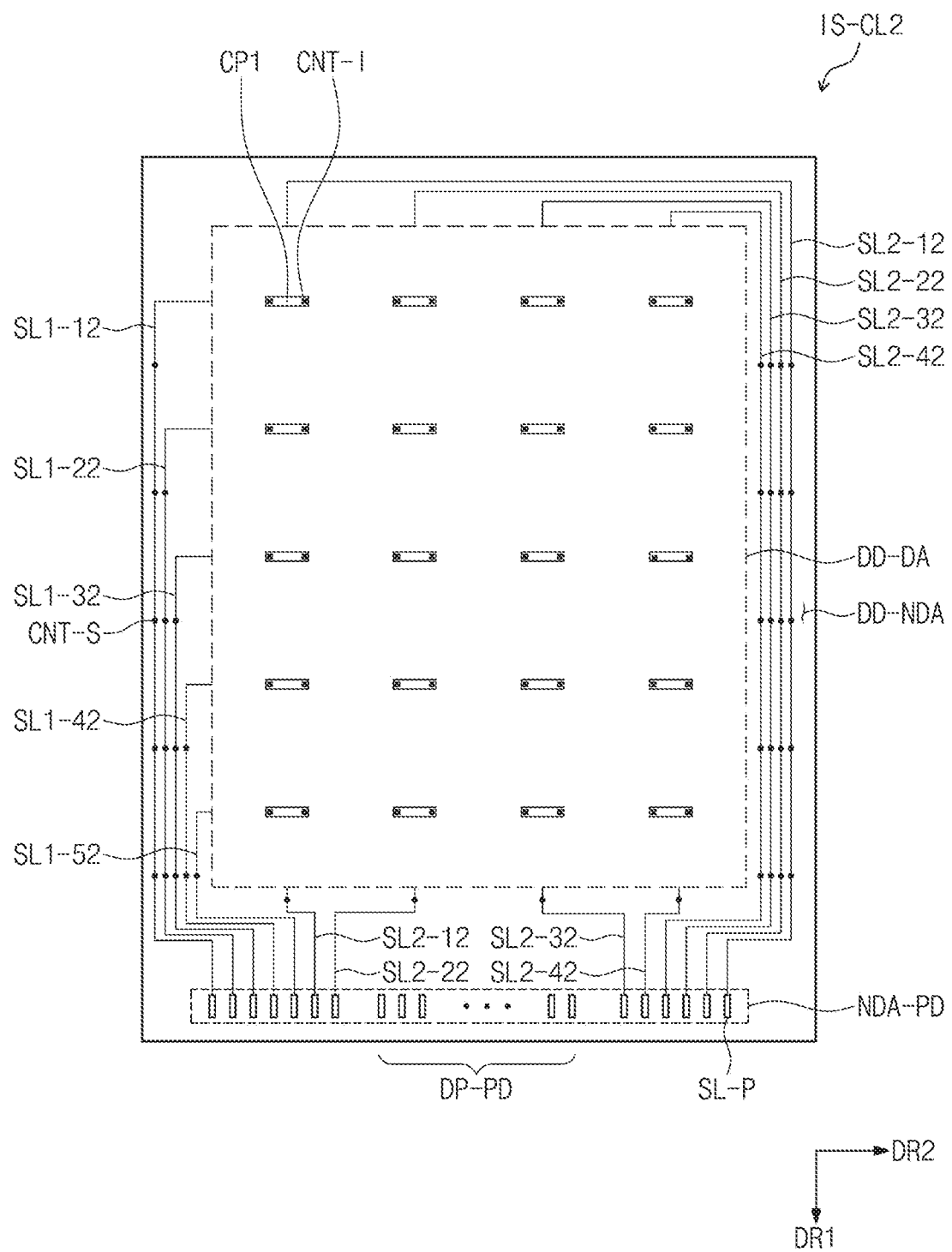
FIG. 6D is a plan view illustrating a second conductive layer of an input sensor constructed according to an exemplary embodiment of the invention.
Figure 6E:
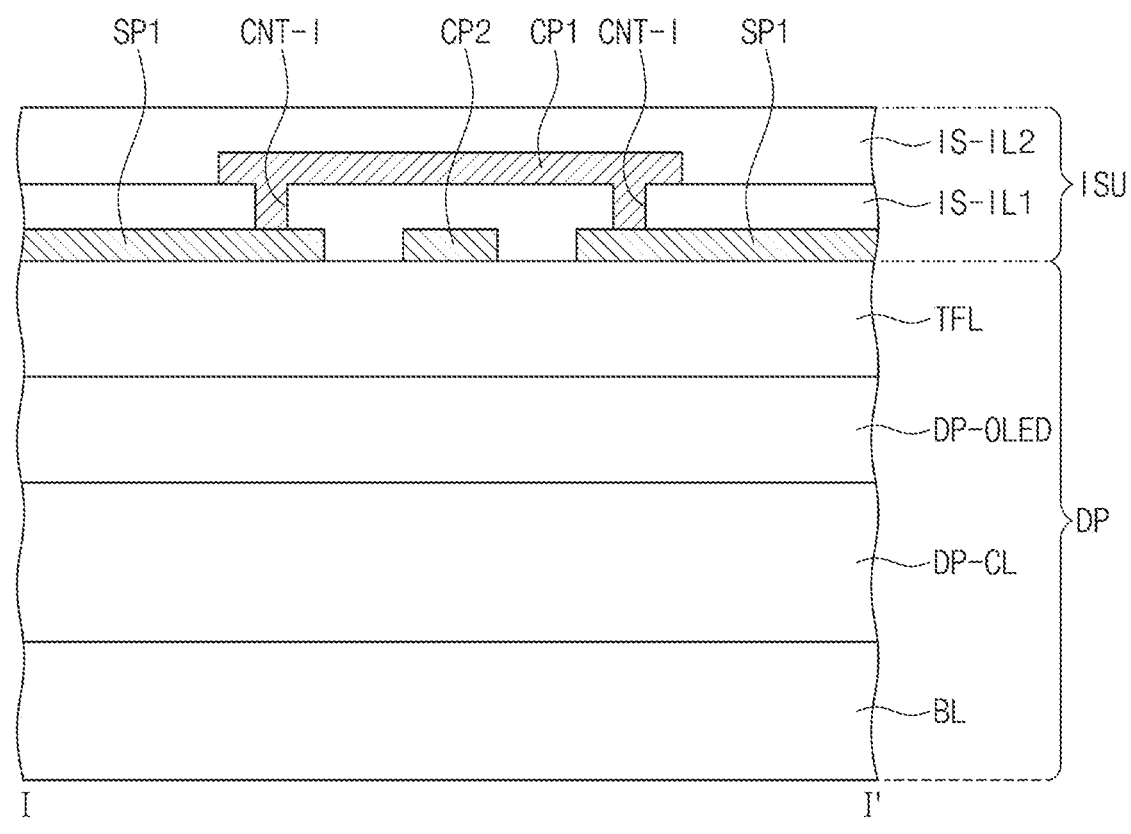
FIGS. 6E and 6F are cross-sectional views each illustrating a portion of an input sensor constructed according to an exemplary embodiment of the invention.
Figure 6F:
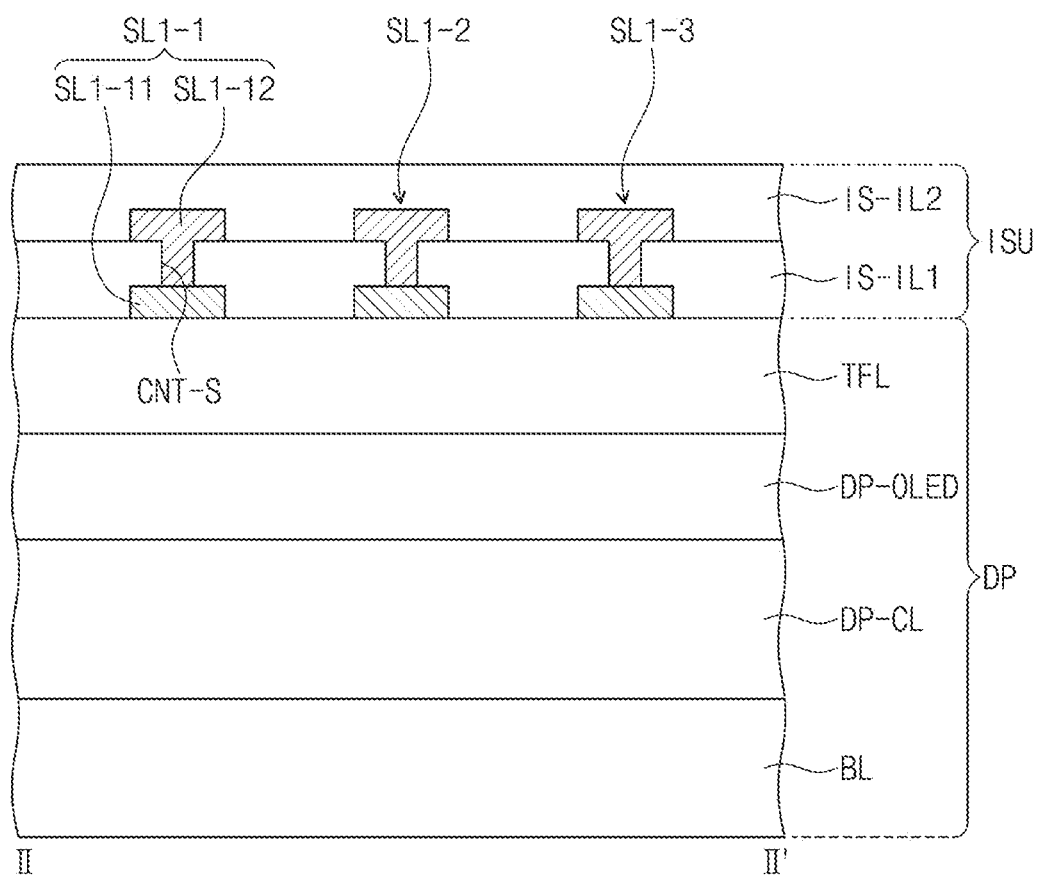

FIG. 6A is a cross-sectional view illustrating the display device DD constructed according to an exemplary embodiment of the invention. FIG. 6B is a plan view illustrating an input-sensing unit ISU constructed according to an exemplary embodiment of the invention. FIG. 6C is a plan view illustrating a first conductive layer IS-CL1 of the input-sensing unit ISU constructed according to an exemplary embodiment of the invention. FIG. 6D is a plan view illustrating a second conductive layer IS-CL2 of the input-sensing unit ISU constructed according to an exemplary embodiment of the invention. FIGS. 6E and 6F are cross-sectional views each illustrating a portion of the input-sensing unit ISU constructed according to an exemplary embodiment of the invention.

In FIG. 6A, in order to provide better understanding of a stacking structure of the input sensort ISU, the display panel DP is illustrated in a simplified manner. For example, the anti-reflection unit and the window may be provided on the input sensor ISU but they are not shown in FIG. 6A. The input sensor ISU of the "layer" type is illustrated, as shown in FIGS. 2A to 2D.

The input sensor ISU may include, at least, a sensing electrode and an insulating layer. The input sensor ISU may further include a signal line connected to the sensing electrode. The input sensor ISU may be configured to sense an external input, for example, using a capacitance-sensing method. The inventive concepts are not limited to a specific sensing method of the input sensor ISU, and in an exemplary embodiment, the input sensor ISU may be configured to sense an external input in an electromagnetic induction manner or a pressure-sensing manner.

As shown in FIG. 6A, the input sensor ISU may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layered structure or a multi-layered structure including a plurality of layers stacked in the third direction DR3. The conductive layer of the single-layered structure may include a metal layer or a transparent conductive layer. The metal layer may include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium tin zinc oxide (ITZO). In an exemplary embodiment, the transparent conductive layer may include a conductive polymer (e.g., PEDOT), metal nanowires, or graphene.

The conductive layer of the multi-layered structure may include a plurality of metal layers. The metal layers may form a triple-layered structure of, for example, titanium/aluminum/titanium. The conductive layer of the multi-layered structure may include at least one metal layer and at least one transparent conductive layer.

Each of the first conductive layer IS-CL1 and the second conductive layer IS-CL2 may include a plurality of patterns. In the following description, the first conductive layer IS-CL1 will be described to include first conductive patterns, and the second conductive layer IS-CL2 will be described to include second conductive patterns. Each of the first and second conductive patterns may include sensing electrodes and signal lines.

The stacking structure and material of the sensing electrode may be determined in consideration of technical requirements on sensing sensitivity. The sensing sensitivity may be affected by RC delay, and here, since the metal layer has electric resistance lower than that of the transparent conductive layer, the sensing electrodes formed of the metal layer may have a reduced RC delay value. Thus, it may be possible to reduce a charging time taken to charge a capacitor defined between the sensing electrodes. By contrast, in the case where the sensing electrodes are formed of the transparent conductive layer, the sensing electrodes may not be recognized by a user, compared with the sensing electrodes formed of the metal layer. Furthermore, since the sensing electrodes have an increased input area, it may be possible to increase capacitance of the capacitor.

The sensing electrodes may form a mesh structure, as will be described below, and in this case, it may be possible to prevent the sensing electrodes including the metal layer from being recognized by a user and to reduce noise such as parasitic capacitance caused by the second electrode AE (e.g., see FIG. 3D). The thickness of the upper insulating layer TFL may be adjusted to prevent the input sensor ISU from being affected by noise caused by elements of the display device layer DP-OLED. Each of the first and second insulating layers IS-IL1 and IS-IL2 may have a single- or multi-layered structure. Each of the first and second insulating layers IS-IL1 and IS-IL2 may include an inorganic material, an organic matter, or a composite material.

At least one of the first and second insulating layers IS-IL1 and IS-IL2 may include an inorganic layer. The inorganic layer may be formed of or include at least one of aluminum oxide, titanium oxide, silicon oxide, silicon oxynitride, zirconium oxide, or hafnium oxide.

At least one of the first and second insulating layers IS-IL1 and IS-IL2 may include an organic layer. The organic layer may be formed of or include at least one of acrylic resins, methacryl resins, polyisoprene resins, vinyl resins, epoxy resins, urethane resins, cellulose resins, siloxane resins, polyimide resins, polyamide resins, or perylene resins.

As shown in FIG. 6B, the input sensor ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. The input sensor ISU may further include an optical dummy electrode provided in a boundary region between the first sensing electrodes IE1-1 to IE1-5 and the second sensing electrodes IE2-1 to IE2-4.

The first sensing electrodes IE1-1 to IE1-5 may cross the second sensing electrodes IE2-1 to IE2-4. The first sensing electrodes IE1-1 to IE1-5 may be arranged in the first direction DR1 and each of the first sensing electrodes IE1-1 to IE1-5 may extend in the second direction DR2. The first and second sensing electrodes IE1-1 to IE1-5 and IE2-1 to IE2-4 may be configured to sense an external input in a mutual-capacitance manner and/or a self-capacitance manner. In an exemplary embodiment, during a first period, coordinates of an external input may be calculated in the mutual-capacitance manner, and during a second period, coordinates of the external input may be re-calculated in the self-capacitance manner.

Each of the first sensing electrodes IE1-1 to IE1-5 may include first sensor portions SP1 and first connecting portions CP1. Each of the second sensing electrodes IE2-1 to IE2-4 may include second sensor portions SP2 and second connecting portions CP2. Two of the first sensor portions SP1, which are located at opposite ends of the first sensing electrode, may have a small area or size (e.g., half area), compared with a central one of the first sensor portions SP1. Two of the second sensor portions SP2, which are located at opposite ends of the second sensing electrode, may have a small area or size (e.g., half area), compared with a central one of the second sensor portions SP2.

The inventive concepts are not limited to shapes of the first sensing electrodes IE1-1 to IE1-5 and the second sensing electrodes IE2-1 to IE2-4 shown in FIG. 6B. In an exemplary embodiment, the first sensing electrodes IE1-1 to IE1-5 and the second sensing electrodes IE2-1 to IE2-4 may have a shape (e.g., a bar shape), in which no distinction between the sensor portion and portion and the connecting portion is apparent. Although each of the first and second sensor portions SP1 and SP2 is illustrated as having a diamond shape, the inventive concepts are not limited thereto. For example, each of the first and second sensor portions SP1 and SP2 may have at least one of other polygonal shapes, except for the diamond shape.

In one first sensing electrode, the first sensor portions SP1 may be arranged in the second direction DR2, and in one second sensing electrode, the second sensor portions SP2 may be arranged in the first direction DR1. Each of the first connecting portions CP1 may connect adjacent ones of the first sensor portions SP1 to each other, and each of the second connecting portions CP2 may connect adjacent ones of the second sensor portions SP2 to each other.

The first signal lines SL1-1 to SL1-5 may be connected to ends of the first sensing electrodes IE1-1 to IE1-5, respectively. The second signal lines SL2-1 to SL2-4 may be connected to opposite ends of the second sensing electrodes IE2-1 to IE2-4. In an exemplary embodiment, the first signal lines SL1-1 to SL1-5 may also be connected to opposite ends of the first sensing electrodes IE1-1 to IE1-5. In an exemplary embodiment, the second signal lines SL2-1 to SL2-4 may be connected to only one-side ends of the second sensing electrodes IE2-1 to IE2-4, respectively.

In the illustrated embodiment, it may be possible to improve the sensing sensitivity of the input sensor ISU, compared with an input sensor, in which the second signal lines SL2-1 to SL2-4 are connected to only one-side ends of the second sensing electrodes IE2-1 to IE2-4, respectively. Since the second sensing electrodes IE2-1 to IE2-4 are longer than the first sensing electrodes IE1-1 to IE1-5, voltage drop of a detection or transmission signal may occur, and this may lead to deterioration in sensing sensitivity of the input sensor ISU. In the illustrated embodiment, since the second signal lines SL2-1 to SL2-4, which are connected to opposite ends of the second sensing electrodes IE2-1 to IE2-4, are used to transmit a detection or transmission signal, it may be possible to prevent the voltage drop of the detection or transmission signal and thereby to prevent the sensing sensitivity of the input sensor ISU from being deteriorated.

Each of the first signal lines SL1-1 to SL1-5 and the second signal lines SL2-1 to SL2-4 may include a line portion SL-L and a pad portion SL-P. The pad portion SL-P may be provided on a pad region NDA-PD and may be aligned to each other. The input sensor ISU may include signal pads DP-PD. The signal pads DP-PD may be provided on the pad region NDA-PD and may be aligned to each other. The signal pads DP-PD may be overlapped with and connected to the pad portions of the signal lines SGL of FIG. 3B.

In an exemplary embodiment, the first signal lines SL1-1 to SL1-5 and the second signal lines SL2-1 to SL2-4 may be replaced with a circuit board, which is separately fabricated, or the like.

As shown in FIG. 6C, the first conductive layer IS-CL1 may include the first sensor portions SP1, the second sensor portions SP2, and the second connecting portions CP2. Each of the second sensing electrodes IE2-1 to IE2-4 may be integrated together. The first sensor portions SP1 may be spaced apart from the second sensing electrodes IE2-1 to IE2-4. The first conductive layer IS-CL1 may include first line portions SL1-11 to SL1-51 of the first signal lines SL1-1 to SL1-5 and first line portions SL2-11 to SL2-41 of the second signal lines SL2-1 to SL2-4.

The first sensor portions SP1, the second sensor portions SP2, and the second connecting portions CP2 may be formed by the same process. The first sensor portions SP1, the second sensor portions SP2, and the second connecting portions CP2 may be formed of or include the same material and may have the same stacking structure. In the illustrated embodiment, the first sensor portions SP1, the second sensor portions SP2, and the second connecting portions CP2 may include a transparent conductive layer.

The first line portions SL1-11 to SL1-51 of the first signal lines SL1-1 to SL1-5 and the first line portions SL2-11 to SL2-41 of the second signal lines SL2-1 to SL2-4 may be formed by a process that is the same as or different from that for the first sensor portions SP1. The first line portions SL1-11 to SL1-51 of the first signal lines SL1-1 to SL1-5 and the first line portions SL2-11 to SL2-41 of the second signal lines SL2-1 to SL2-4 may include a transparent conductive layer or a metal layer.

Although not shown in FIG. 6C, the first insulating layer IS-IL1 may cover at least the display region DD-DA. In the illustrated embodiment, the first insulating layer IS-IL1 may be overlapped with at least a portion of the display and non-display regions DD-DA and DD-NDA. The first insulating layer IS-IL1 may cover the first line portions SL1-11 to SL1-51 of the first signal lines SL1-1 to SL1-5 and the first line portions SL2-11 to SL2-41 of the second signal lines SL2-1 to SL2-4.

In the illustrated embodiment, the first insulating layer IS-IL1 may be overlapped with the display region DD-DA and the pad region NDA-PD. The first insulating layer IS-IL1 may be fully overlapped with the display and non-display regions DD-DA and DD-NDA. The first insulating layer IS-IL1 may define first connection contact holes CNT-I, which are formed to partially expose the first sensor portions SP1, and second connection contact holes CNT-S, which are formed to partially expose the first line portions SL1-11 to SL1-51 of the first signal lines SL1-1 to SL1-5 and the first line portions SL2-11 to SL2-41 of the second signal lines SL2-1 to SL2-4.

As shown in FIG. 6D, the second conductive layer IS-CL2 may include the first connecting portions CP1. In addition, the second conductive layer IS-CL2 may include second line portions SL1-12 to SL1-52 of the first signal lines SL1-1 to SL1-5 and second line portions SL2-12 to SL2-42 of the second signal lines SL2-1 to SL2-4. The second conductive layer IS-CL2 may include pad portions SL-P of the first signal lines SL1-1 to SL1-5, pad portions SL-P of the second signal lines SL2-1 to SL2-4, and the signal pads DP-PD.

The first connecting portions CP1, the second line portions SL1-12 to SL1-52 of the first signal lines SL1-1 to SL1-5, and the second line portions SL2-12 to SL2-42 of the second signal lines SL2-1 to SL2-4 may be formed by the same process. The first connecting portions CP1, the second line portions SL1-12 to SL1-52 of the first signal lines SL1-1 to SL1-5, and the second line portions SL2-12 to SL2-42 of the second signal lines SL2-1 to SL2-4 may include the same material and may have the same stacking structure (e.g., a multilayered structure including a plurality of metal layers).

Figure 10A:
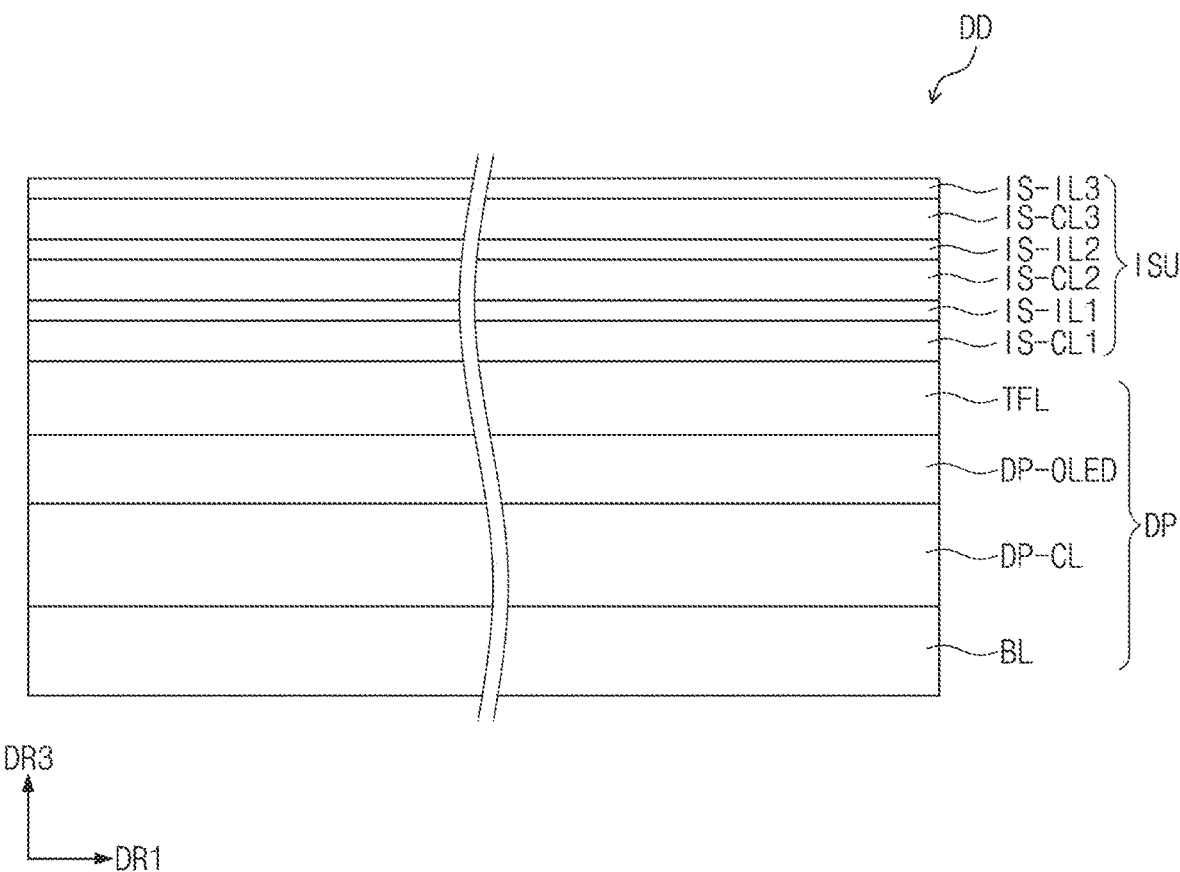
FIG. 10A is a cross-sectional view illustrating an input sensor constructed according to an exemplary embodiment of the invention.

In an exemplary embodiment, the second conductive layer IS-CL2 may include the second connecting portions CP2 (e.g., see FIG. 10A). Here, the first connecting portions CP1 may be formed from the first conductive layer IS-CL1. Thus, each of the first sensing electrodes IE1-1 to IE1-5 may be integrated together.

Although not shown in FIG. 6D, the second insulating layer IS-IL2 may be overlapped with at least a portion of the display and non-display regions DD-DA and DD-NDA. In the illustrated embodiment, the second insulating layer IS-IL2 may expose the pad region NDA-PD.

As shown in FIG. 6E, the first sensor portions SP1 may be electrically connected to the first connecting portion CP1 through the first connection contact holes CNT-I. The first connecting portion CP1 may be formed of or include a material having electric resistance lower than the first sensor portions SP1.

The first connecting portion CP1 may cross the second connecting portion CP2, and in an exemplary embodiment, to reduce the effect of interference such as parasitic capacitance, the first connecting portion CP1 may be configured to have a reduced width in a horizontal direction. The first connecting portion CP1 may include a low resistance material (e.g., the same metallic material as the second line portions SL1-12 to SL1-52 of the first signal lines SL1-1 to SL1-5), and this may make it possible to improve the sensing sensitivity of the input sensor ISU.

In the illustrated embodiment, the first insulating layer IS-IL1 may be a polymer layer (e.g., an acrylic polymer layer). The second insulating layer IS-IL2 may also be a polymer layer (e.g., an acrylic polymer layer). The polymer layer may be configured to improve flexibility of the display device DD, even when the input sensor ISU is directly provided on the display panel DP.

Three first signal lines SL1-1 to SL1-3 of the first signal lines SL1-1 to SL1-5 are exemplarily illustrated in FIG. 6F. Referring to the first signal line SL1-1, the first line portion SL1-11 and the second line portion SL1-12 may be electrically connected to each other through the second connection contact holes CNT-S. Since the first signal line SL1-1 has a double-layered structure, resistance of the first signal line SL1-1 may be decreased.

In an exemplary embodiment, one of the first and second line portions SL1-11 and SL1-12 may be omitted. One of the first and second line portions of the second signal lines SL2-1 to SL2-4 may be omitted.

Figure 7A:
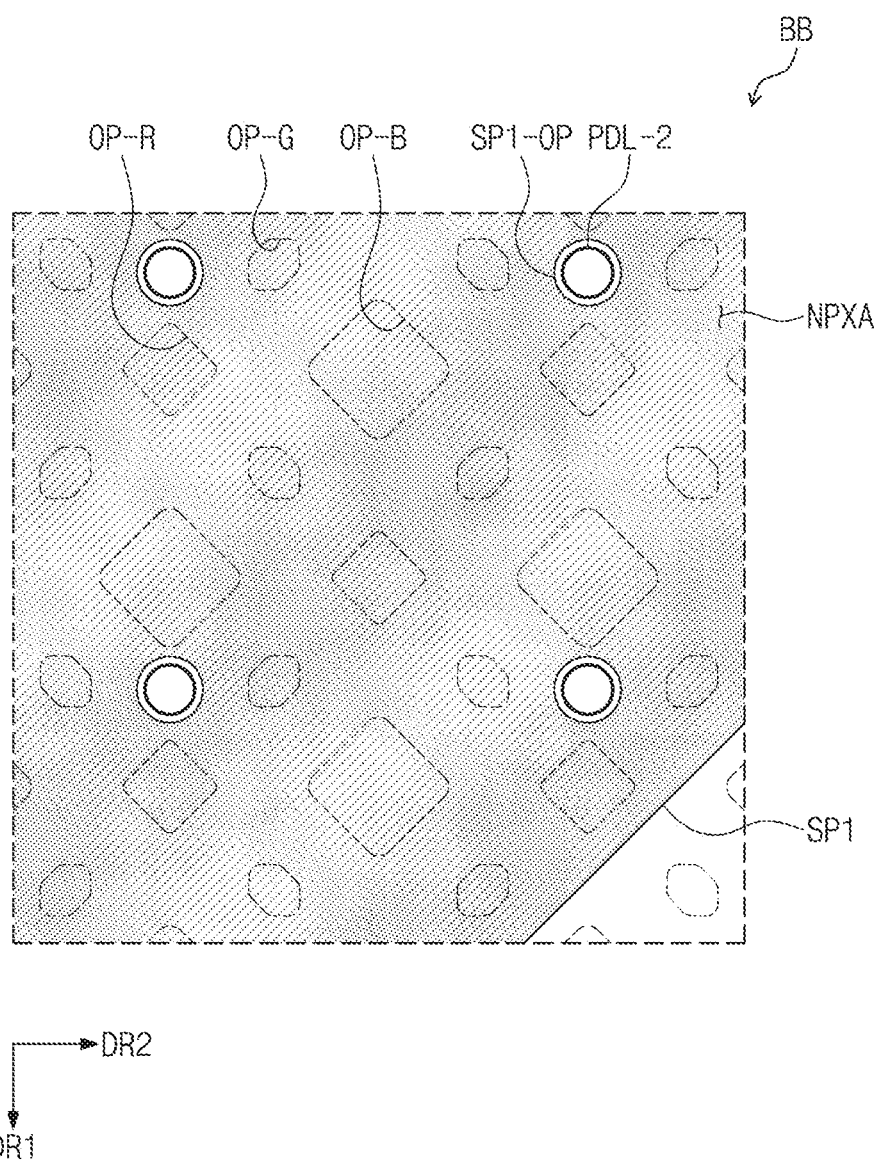
FIG. 7A is an enlarged plan view illustrating a region BB of a display device having an input sensor constructed according to an exemplary embodiment of the invention.
Figure 7B:
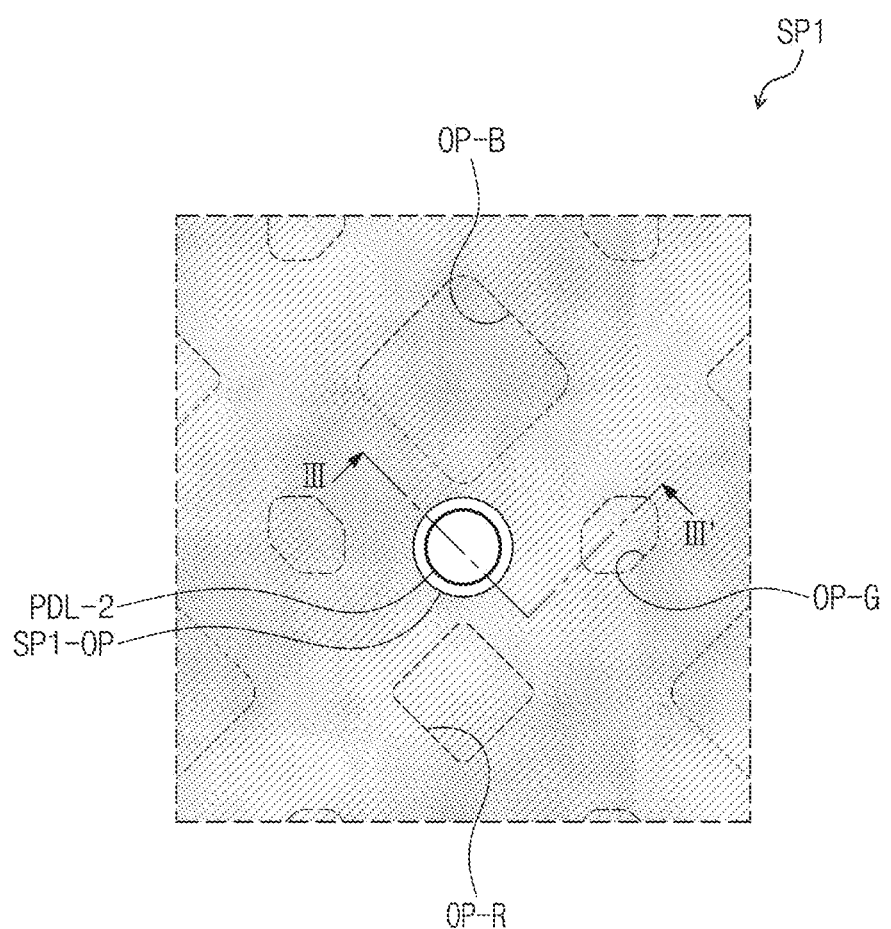
FIG. 7B is an enlarged plan view illustrating a portion of the input sensor of FIG. 7A.
Figure 7C:
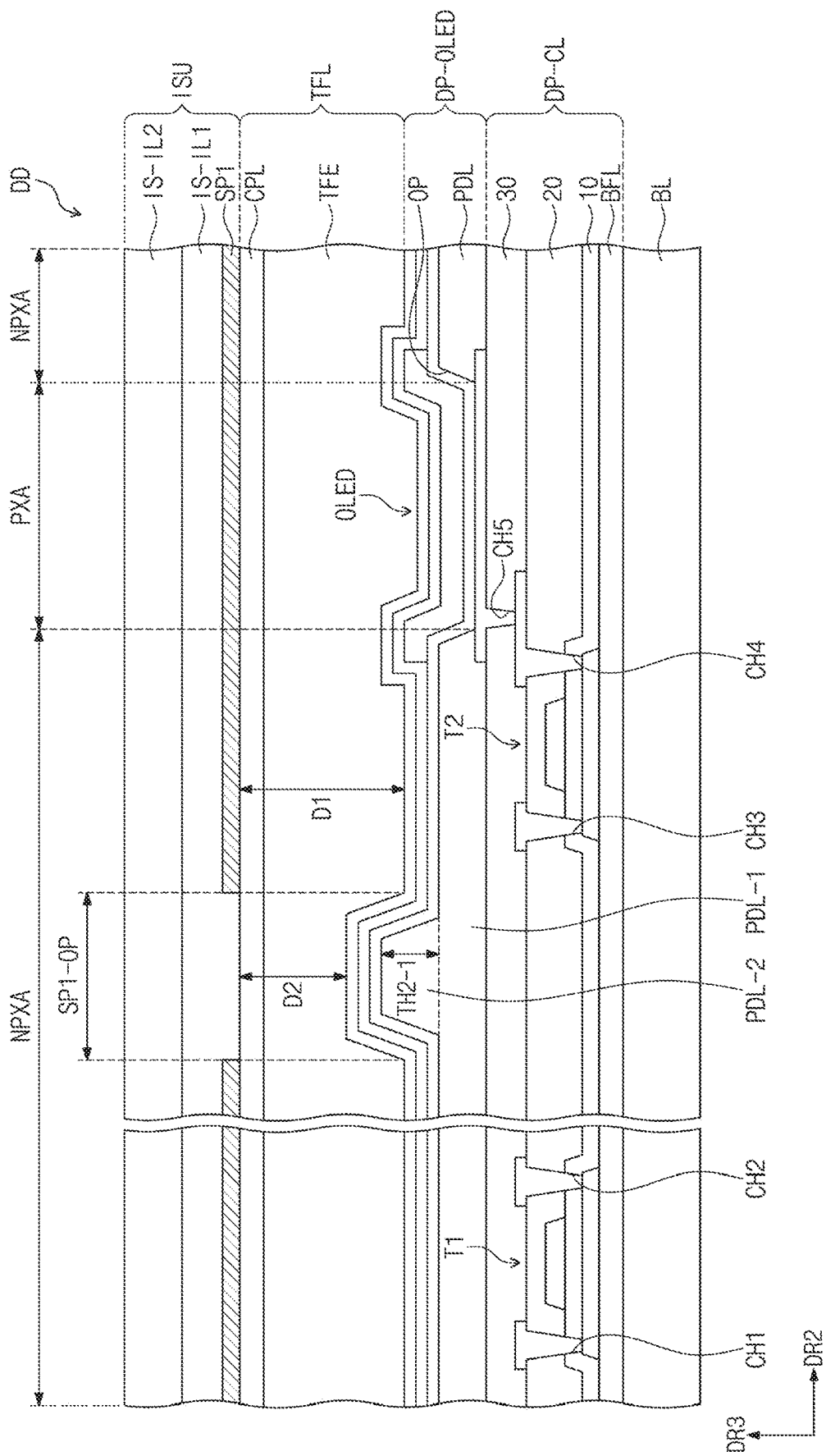
FIG. 7C is an enlarged cross-sectional view taken along lines III-III' of FIG. 7B.

FIG. 7A is an enlarged plan view illustrating a region BB of a display having the input sensor ISU constructed according to an exemplary embodiment of the invention. FIG. 7B is an enlarged plan view illustrating a portion of the input sensor of FIG. 7A. FIG. 7C is an enlarged cross-sectional view taken along lines III-III' of FIG. 7B. The first portion PDL-1 and the second portion PDL-2 of the pixel definition layer PDL will be described with reference to FIG. 3D.

Although not illustrated in detail in FIGS. 6B to 6D, an open region may be defined in a sensing electrode. Here, the open region means a region which is formed by partially removing a transparent conductive layer and/or a metal layer constituting the sensing electrode. The open region may be formed to correspond to the second portion PDL-2 or PDL-20 described with reference to FIGS. 3A to 4B. The open region may be formed regardless of whether the open region is located on the sensor portion SP1 or SP2 and/or on the connecting portion CP1 or CP2 described with reference to FIGS. 6B to 6D, as long as the open region is a region corresponding to the second portion PDL-2 or PDL-20. Nevertheless, in the case where the open region is formed on the connecting portion, the open region may be formed to meet the technical requirements for the connecting portion (e.g., to electrically connect two adjacent sensor portions to each other).

FIG. 7A illustrates an enlarged shape of a region 'BB' of FIG. 6B. The region 'BB' of FIG. 6B is a region overlapped with a region 'AA' of FIG. 4A. In the illustrated embodiment, the first sensor portion SP1 including a transparent conductive layer is exemplarily illustrated. The anti-reflection unit and the window, which may be provided on the input sensor ISU, are omitted from FIG. 7C.

As shown in FIGS. 7A to 7C, an open region SP1-OP may be defined in the first sensor portion SP1, which is formed of the transparent conductive layer, to correspond to the second portion PDL-2. As shown in FIG. 7B, the second portion PDL-2 may be provided in the open region SP1-OP, when viewed in a plan view. As shown in FIG. 7B, when viewed in a plan view, the first sensor portion SP1 may be overlapped with the second portion PDL-2 in such a way that an overlapped area is less than 10% of an area of the second portion PDL-2, and in an exemplary embodiment, the first sensor portion SP1 may be not overlapped with the second portion PDL-2.

As shown in FIG. 7C, if the open region SP1-OP is not defined, a distance D2 between a portion of the first sensor portion SP1 corresponding to the open region SP1-OP and the second electrode CE may be less than a distance D1 between another portion of the first sensor portion SP1 and the second electrode CE. The variation in distance between the second electrode CE and the first sensor portion SP1 may produce a noise issue in the input sensor ISU. This is because a parasitic capacitor having a relatively large capacitance is formed between the first sensor portion SP1 corresponding to the open region SP1-OP and the second electrode CE. By contrast, according to the illustrated embodiment, since the first sensor portion SP1 is not provided in the open region SP1-OP, it may be possible to prevent such a parasitic capacitor from being formed.

Figure 8A:
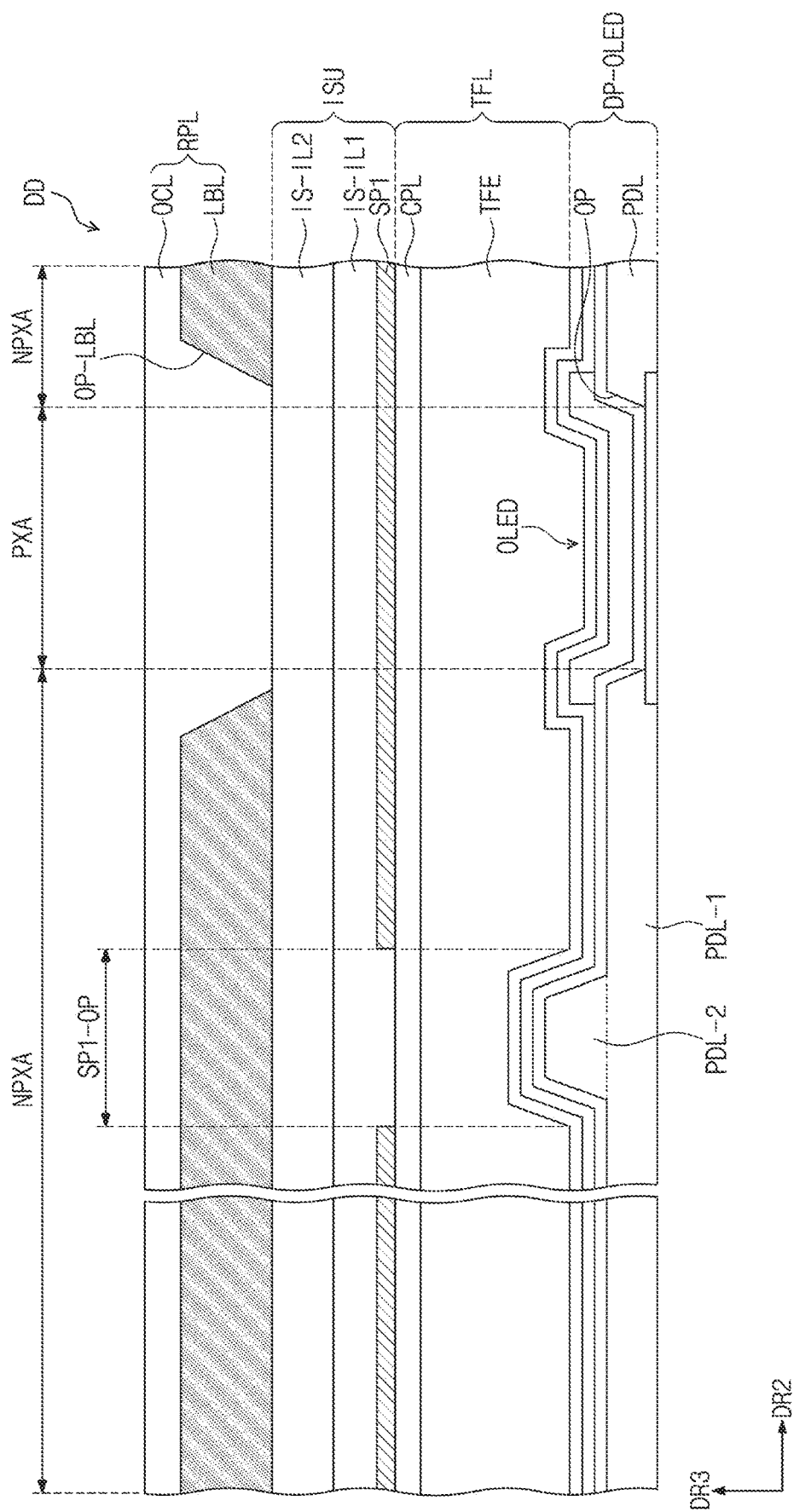
FIGS. 8A and 8B are enlarged cross-sectional views each illustrating a display device constructed according to an exemplary embodiment of the invention.
Figure 8B:
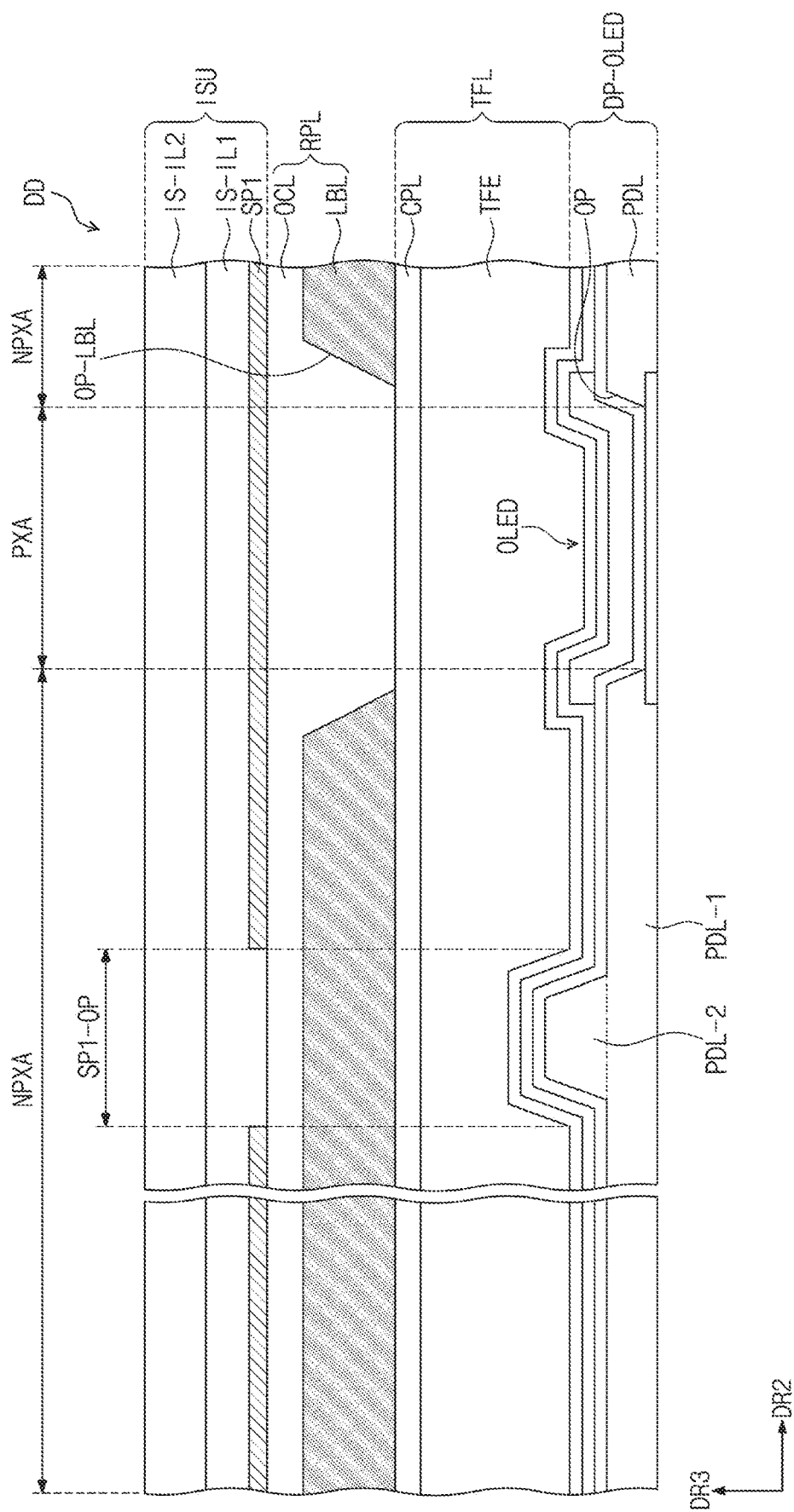

FIGS. 8A and 8B are enlarged cross-sectional views each illustrating the display device DD constructed according to an exemplary embodiment of the invention. For concise description, an element described with reference to FIGS. 1 to 7C may be identified by the same reference number without repeating a detailed description thereof to avoid redundancy. FIGS. 8A and 8B illustrate sections corresponding to FIG. 7C, and elements provided below the display device layer DP-OLED are not shown in FIGS. 8A and 8B.

FIG. 8A shows an enlarged cross-sectional shape of the display device DD corresponding to FIG. 2C, and FIG. 8B shows an enlarged cross-sectional shape of the display device DD corresponding to FIG. 2D. Each of the display devices DD shown in FIGS. 8A and 8B may further include the anti-reflection layer RPL.

The anti-reflection layer RPL may include a light blocking layer LBL and an over-coat layer OCL. An opening OP-LBL corresponding to the opening OP of the pixel definition layer PDL may be defined in the light blocking layer LBL.

The light blocking layer LBL may include a light blocking material. The light blocking material may include, for example, an organic material having high light absorptivity. As an example, the light blocking layer LBL may include a black pigment or a black dye. The light blocking layer LBL may include a photo-sensitive organic material and, for example, may include a coloring agent, such as pigments or dyes. The light blocking layer LBL may have a single- or multi-layered structure. The light blocking layer LBL may be used to reduce reflectance of an external light. Furthermore, the light blocking layer LBL may be configured to realize a narrow color distribution of a reflection light and thereby to improve a color sense property of the reflection light.

The over-coat layer OCL may be used to remove a height difference caused by the presence of the light blocking layer LBL and may be formed of or include an organic material. For example, as shown in FIG. 8A, after forming the light blocking layer LBL on the second insulating layer IS-IL2, the over-coat layer OCL may be formed to fully cover a structure provided with the light blocking layer LBL. The light blocking layer LBL may be formed by coating and patterning a photo-sensitive organic layer or by printing a photo-sensitive organic material on a predetermined region. As shown in FIG. 8B, the light blocking layer LBL and the over-coat layer OCL may be formed on the capping layer CPL. Thereafter, the input sensor ISU may be formed on the over-coat layer OCL.

Figure 9A:
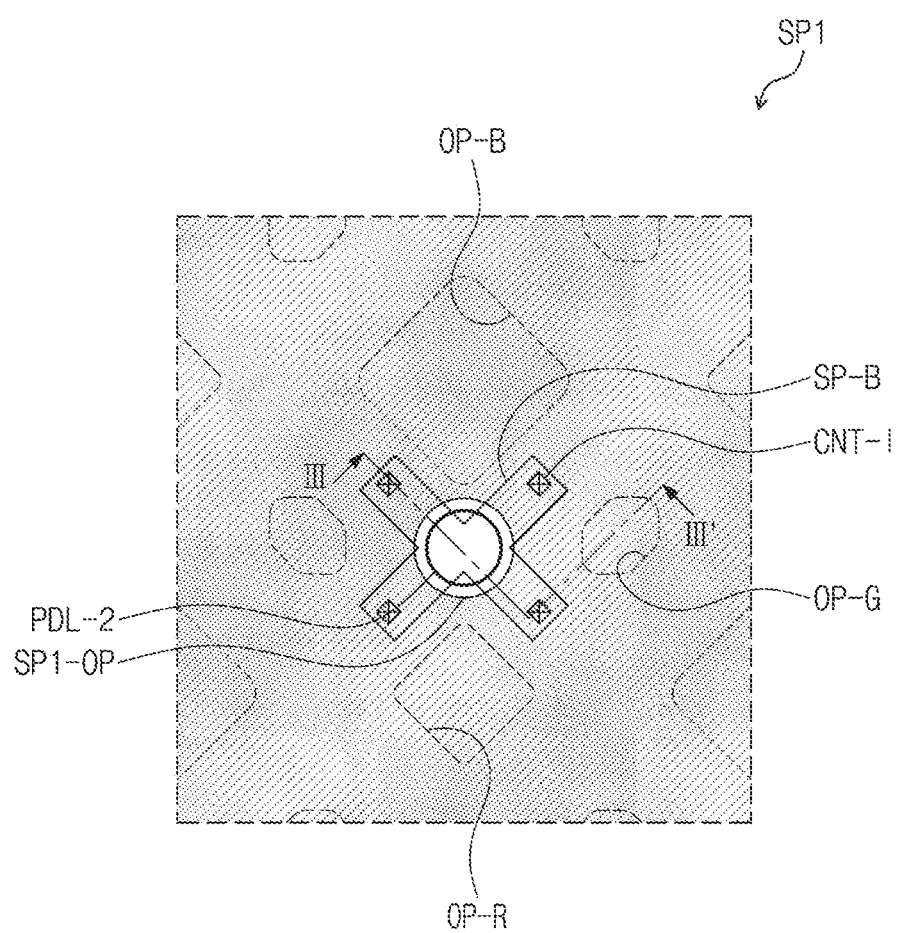
FIG. 9A is a plan view illustrating an input sensor constructed according to an exemplary embodiment of the invention.
Figure 9B:
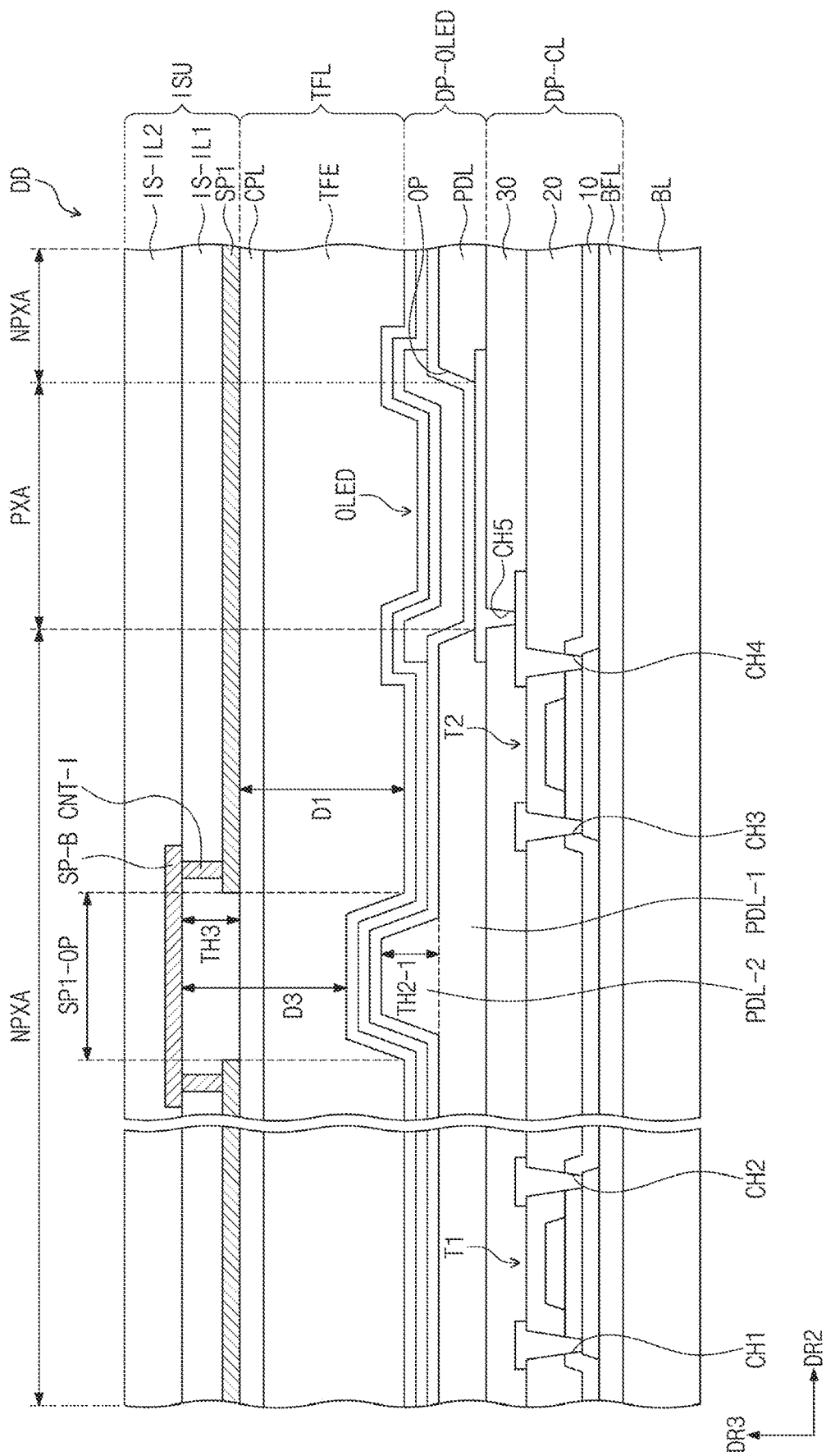
FIG. 9B is an enlarged cross-sectional view taken along lines III-III' of FIG. 9A.

FIG. 9A is a plan view illustrating the input sensor ISU constructed according to an exemplary embodiment of the invention. FIG. 9B is an enlarged cross-sectional view taken along lines III-III' of FIG. 9A. FIG. 9A illustrates a planar shape of the input sensor ISU corresponding to FIG. 7B, and FIG. 9B illustrates a cross-sectional shape of the input sensor ISU corresponding to FIG. 7C. For concise description, the same element as that in the display device DD described with reference to FIGS. 1 to 8B may be identified by the same reference number without repeating a detailed description thereof to avoid redundancy.

The input sensor ISU according to the illustrated embodiment may include the first conductive layer IS-CL1, the first insulating layer IS-IL1, the second conductive layer IS-CL2, and the second insulating layer IS-IL2, similar to the input sensor ISU of FIGS. 6A to 7C. The input sensor ISU according to the illustrated embodiment may further include a bridge connector. The bridge connector includes a bridge pattern SP-B formed from the second conductive layer IS-CL2.

As shown in FIGS. 9A and 9B, the bridge pattern SP-B may be overlapped with the open region SP1-OP and may be connected to the sensing electrode (e.g., the first sensor portion SP1 in the illustrated embodiment) through the contact hole CNT-I (or the first connection contact hole) penetrating the first insulating layer IS-IL1. The bridge pattern SP-B may have substantially the same stacking structure as the first connecting portion CP1 of FIG. 6E.

The bridge pattern SP-B may compensate for a decrease in sensitivity in the open region SP1-OP of the sensing electrode. The bridge pattern SP-B may be configured to improve sensing of an external input, without an increase in noise caused by the second electrode CE.

A distance D3 between the bridge pattern SP-B and the second electrode CE may be substantially equal to a distance D1 between other region of the first sensor portion SP1 and the second electrode CE. For this, a thickness TH3 of the first insulating layer IS-IL1 may be substantially equal to a thickness TH2-1 of the second portion PDL-2.

Since the bridge pattern SP-B is electrically connected to the first sensor portion SP1, in the operation of sensing an external input using the first sensor portion SP1, it may be possible to achieve substantially the same sensing effect as in a structure without the open region SP1-OP. This is because, when a touch event occurs on the bridge pattern SP-B, the touch event can be detected by the first sensor portion SP1.

Figure 10B:
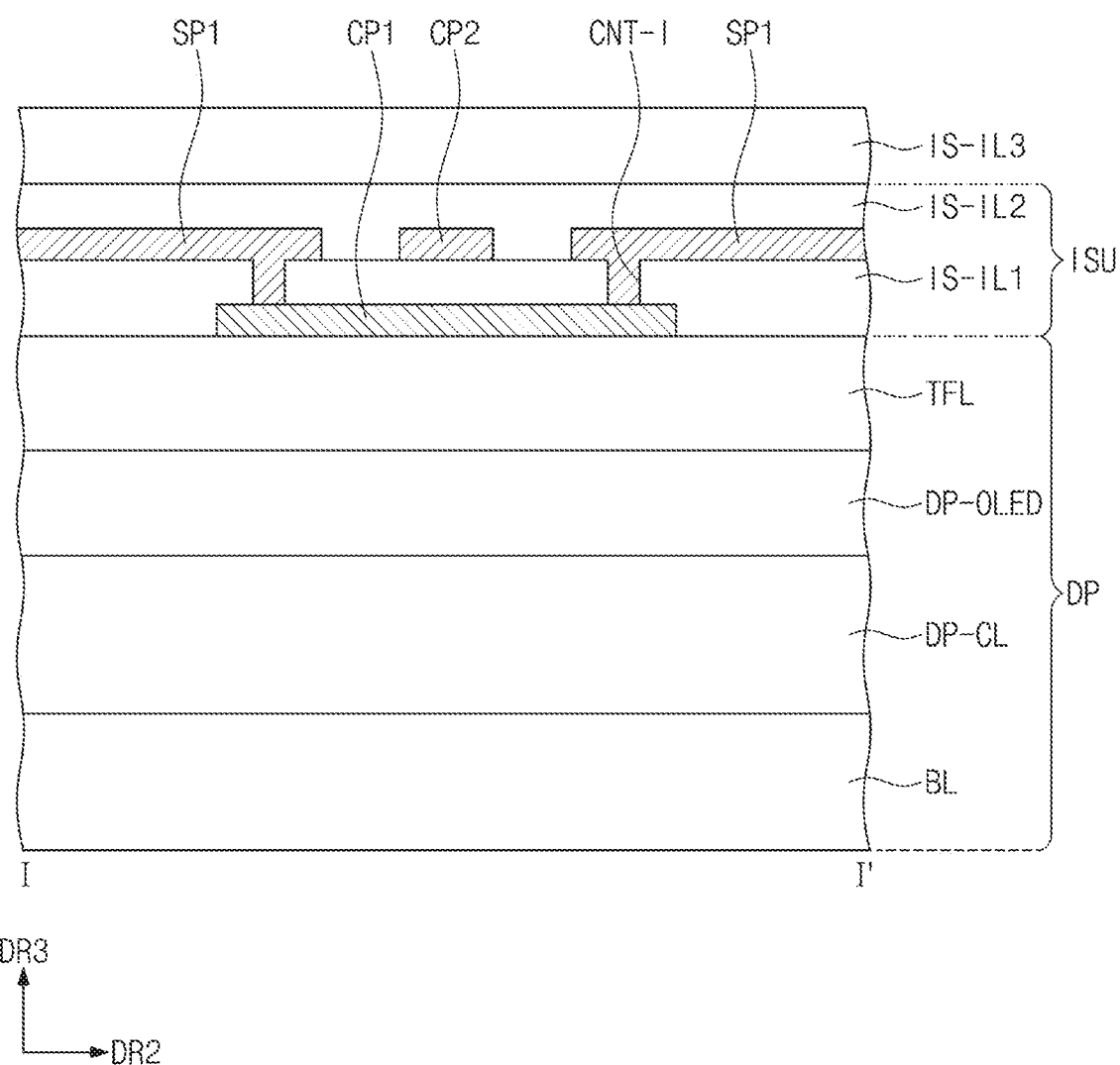
FIGS. 10B and 10C are cross-sectional views each illustrating a portion of an input sensor constructed according to an exemplary embodiment of the invention.
Figure 10C:
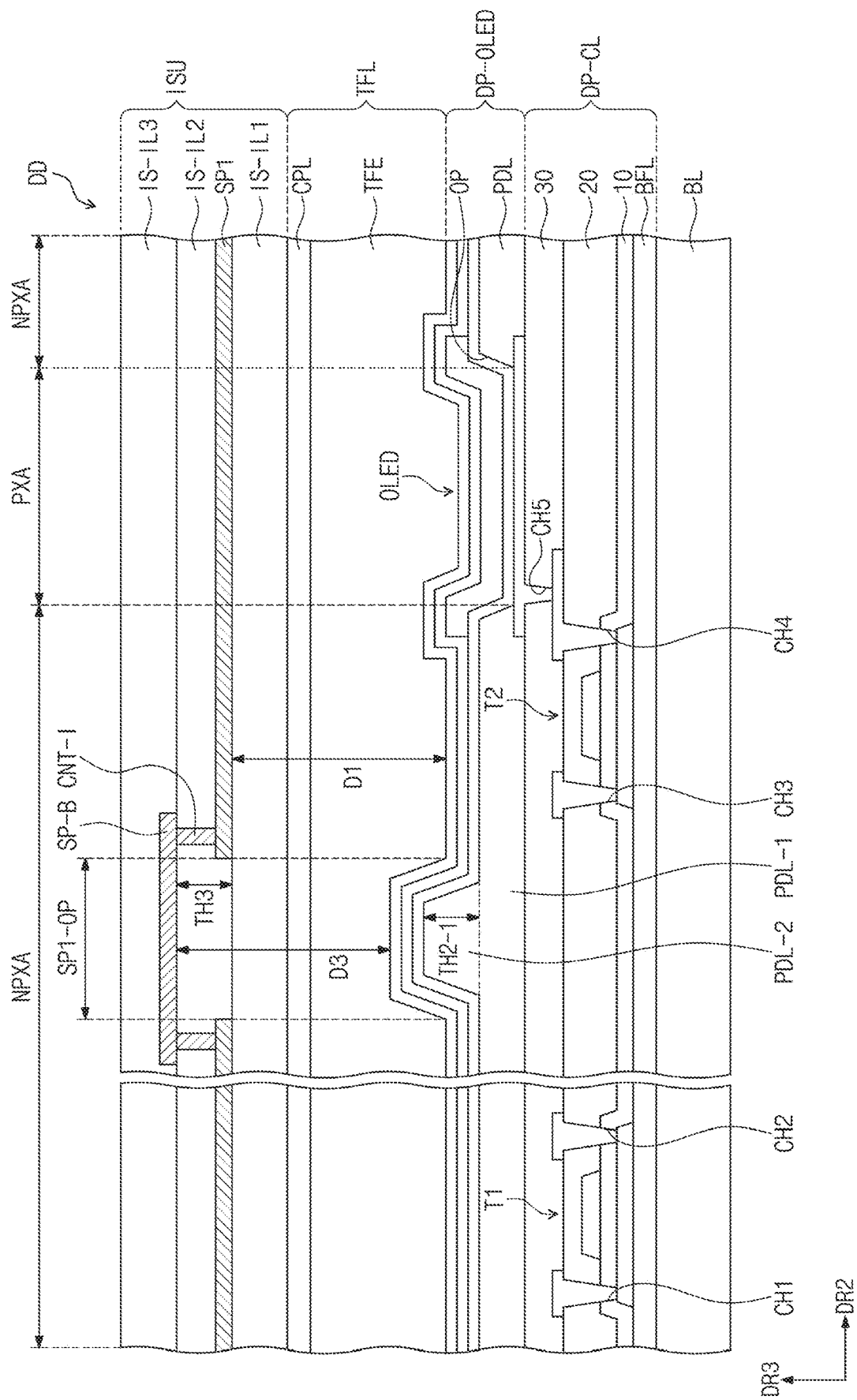

FIG. 10A is a cross-sectional view illustrating the input sensor ISU constructed according to an exemplary embodiment of the invention. FIGS. 10B and 10C are cross-sectional views each illustrating a portion of the input sensor ISU constructed according to an exemplary embodiment of the invention. FIGS. 10A, 10B, and 10C may correspond to FIGS. 6A, 6E, and 7C, respectively. For concise description, the same element as that in the display device DD described with reference to FIGS. 1 to 9B may be identified by the same reference number without repeating a detailed description thereof to avoid redundancy.

As shown in FIG. 10A, the input sensor ISU according to the illustrated embodiment may further include a third conductive layer IS-CL3 and a third insulating layer IS-IL3, compared with the input sensor ISU described with reference to FIGS. 6A to 7C. In the illustrated embodiment, the first conductive layer IS-CL1 of the input sensor ISU may include the first connecting portions CP1, and the second conductive layer IS-CL2 of the input sensor ISU may include the first sensor portions SP1, the second sensor portions SP2, and the second connecting portions CP2.

In the input sensor ISU according to the illustrated embodiment, conductive patterns, which are formed from the first conductive layer IS-CL1 and the second conductive layer IS-CL2, may be provided in a reversed manner, compared with the input sensor ISU described with reference to FIGS. 6A to 7C. For example, as shown in FIG. 10B, the first connecting portion CP1 may be provided on the upper insulating layer TFL, and the first sensor portion SP1 and the second connecting portion CP2 may be provided on the first insulating layer IS-IL1.

As shown in FIG. 10C, the input sensor ISU according to the illustrated embodiment may include the bridge pattern SP-B, similar to the input sensor ISU described with reference to FIGS. 9A and 9B. The bridge pattern SP-B may be formed from the third conductive layer IS-CL3.

Figure 11A:
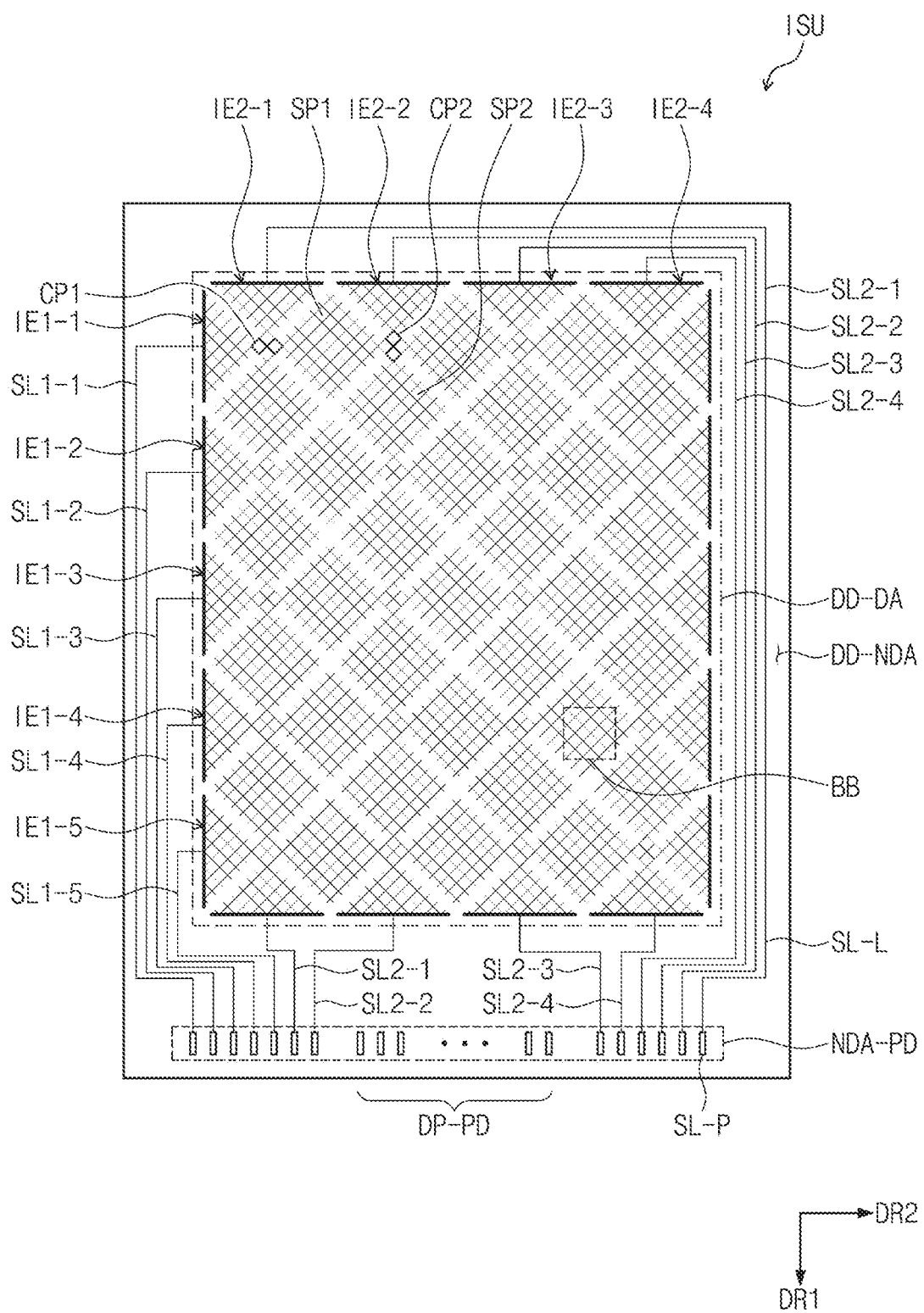
FIG. 11A is a plan view illustrating an input sensor constructed according to an exemplary embodiment of the invention.
Figure 11B:
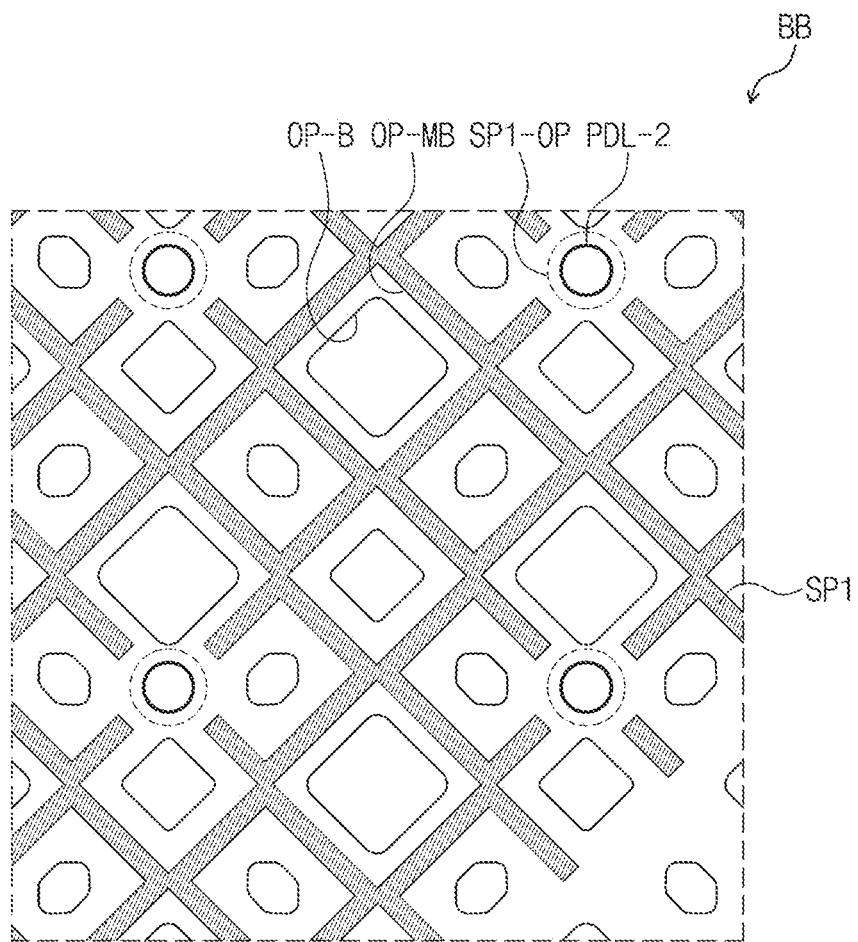
FIG. 11B is an enlarged plan view of region BB of FIG. 11A illustrating a portion of the input sensor.
Figure 11C:
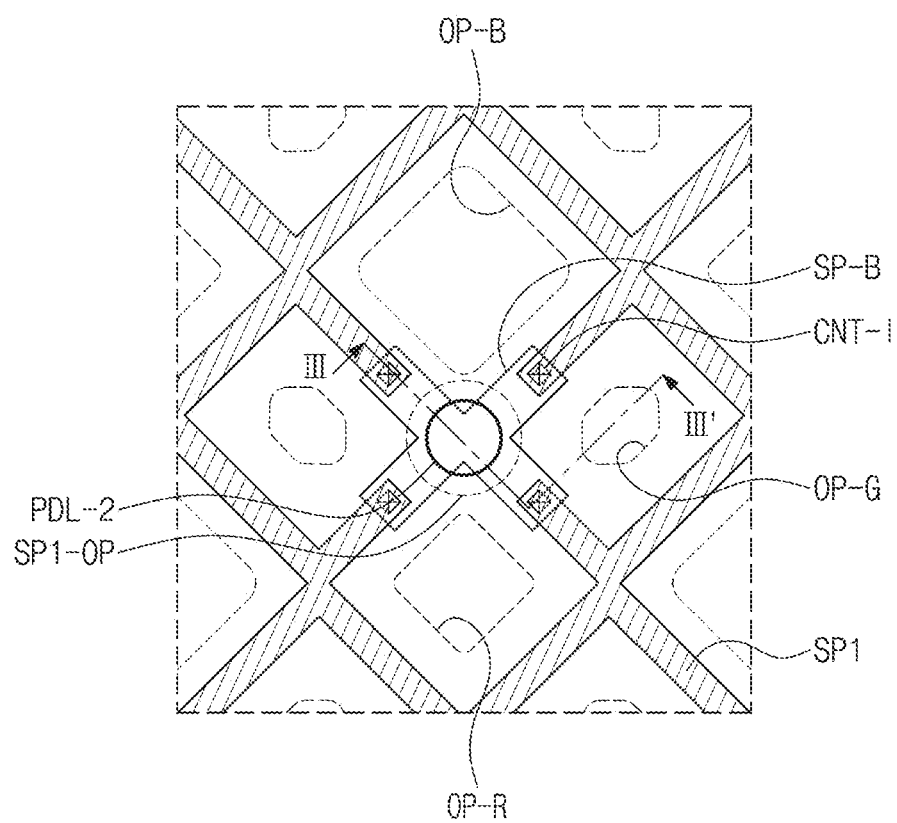
FIG. 11C is an enlarged plan view illustrating a portion of an input sensor constructed according to an exemplary embodiment of the invention.

FIG. 11A is a plan view illustrating the input sensor ISU constructed according to an exemplary embodiment of the invention. FIG. 11B is an enlarged plan view of region BB of FIG. 11A illustrating a portion of the input sensor ISU. FIG. 11C is an enlarged plan view illustrating a portion of the input sensor ISU constructed according to an exemplary embodiment of the invention. For concise description, the same element as that in the display device DD described with reference to FIGS. 1 to 10C may be identified by the same reference number without repeating a detailed description thereof to avoid redundancy.

As shown in FIG. 11A, the first sensing electrodes IE1-1 to IE1-5 and the second sensing electrodes IE2-1 to IE2-4 may have a mesh shape. Since the first sensing electrodes IE1-1 to IE1-5 and the second sensing electrodes IE2-1 to IE2-4 have the mesh shape, it may be possible to reduce parasitic capacitance between the sensing electrodes and the second electrode CE (e.g., see FIG. 7C). In addition, the first sensing electrodes IE1-1 to IE1-5 and the second sensing electrodes IE2-1 to IE2-4 may not be overlapped with the light-emitting regions PXA-R, PXA-G, and PXA-B, as will described below, and thus, the first sensing electrodes IE1-1 to IE1-5 and the second sensing electrodes IE2-1 to IE2-4 may not be recognized by a user.

The first sensing electrodes IE1-1 to IE1-5 and the second sensing electrodes IE2-1 to IE2-4 may be formed of or include at least one of silver, aluminum, copper, chromium, nickel, titanium, or the like, on which a low temperature process can be used, but the inventive concepts are not limited thereto. Even when the input sensor ISU is formed by a successive process after forming the organic light emitting diodes OLED, it may be possible to prevent the organic light emitting diodes OLED (e.g., see FIG. 7C) from heating damage in a manufacturing process for the input sensor ISU.

As shown in FIG. 11B, the first sensor portion SP1 may be overlapped with the non-light-emitting region NPXA. The first sensor portion SP1 may include mesh lines defining openings OP-MG, OP-MR, and OP-MB, which are formed to correspond to the openings OP-G, OP-R, and OP-B of the pixel definition layer. For example, the openings OP-MG, OP-MR, and OP-MB of the first sensor portion SP1 may include a first opening OP-MG, a second opening OP-MR, and a third opening OP-MB, which are formed to correspond to the first-, second-, and third-type openings OP-G, OP-R, and OP-B, respectively.

The mesh lines may have a triple-layered structure of, for example, titanium/aluminum/titanium. In the above exemplary embodiments, the first, second, and third openings OP-MG, OP-MR, and OP-MB are illustrated to correspond to the first-, second-, and third-type openings OP-G, OP-R, and OP-B in a one-to-one manner, but the inventive concepts are not limited thereto. For example, each of the openings OP-MG, OP-MR, and OP-MB may be formed to correspond to two or more ones of the openings OP-G, OP-R, and OP-B.

The open region SP1-OP may be defined in the first sensor portion SP1. Owing to the presence of the open region SP1-OP, the mesh lines of the first sensor portion SP1 may be cut or snapped. The mesh lines of the first sensor portion SP1 may not be overlapped with the second portion PDL-2.

FIG. 11C illustrates an example of the input sensor ISU, in which the second conductive layer IS-CL2 and the second insulating layer IS-IL2 are additionally provided, in comparison with the input sensor ISU of FIGS. 11A and 11B. As shown in FIG. 11C, the input sensor ISU may further include the bridge pattern SP-B. A section of the input sensor ISU taken along line of III-III' FIG. 11C may be substantially the same as that in FIG. 9B or FIG. 10C.

As shown in FIG. 11C, the bridge pattern SP-B may include a mesh line. The mesh line of the bridge pattern SP-B may have substantially the same line width as each of the mesh lines of the first sensor portion SP1. Hence, when viewed in a plan view, the bridge pattern SP-B may be recognized as a part of the first sensor portion SP1.

Figure 12A:
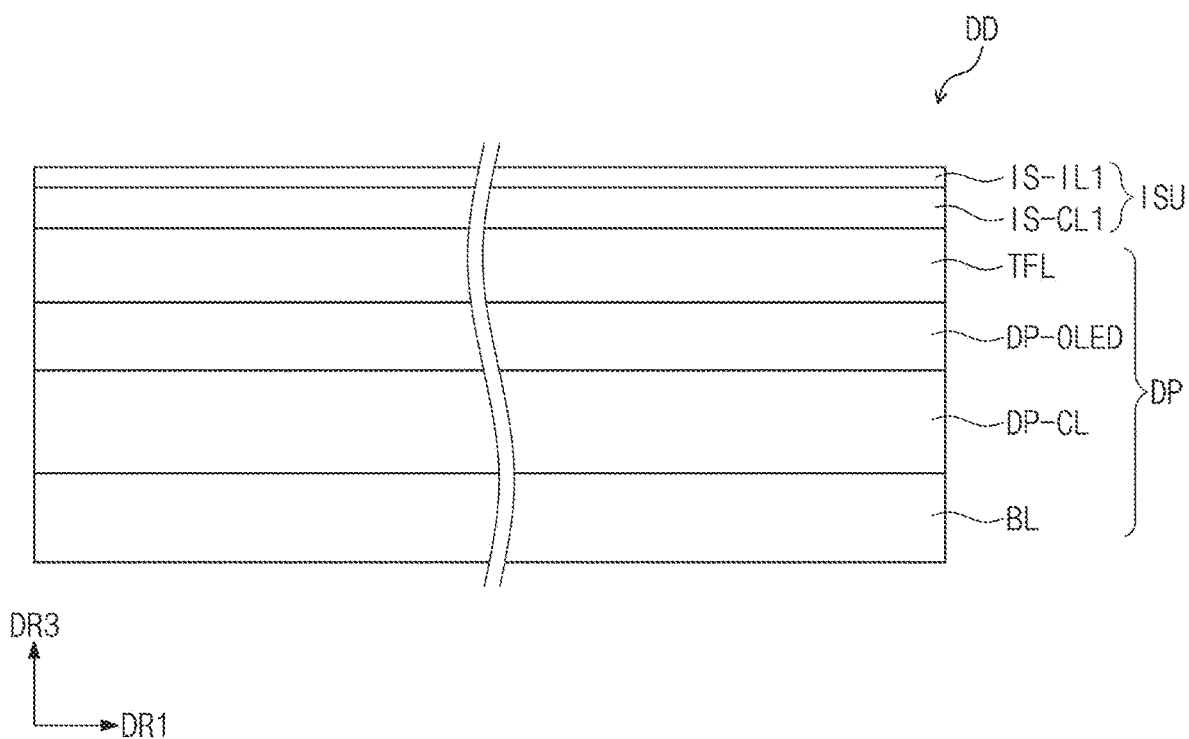
FIG. 12A is a cross-sectional view illustrating a display device constructed according to an exemplary embodiment of the invention.
Figure 12B:
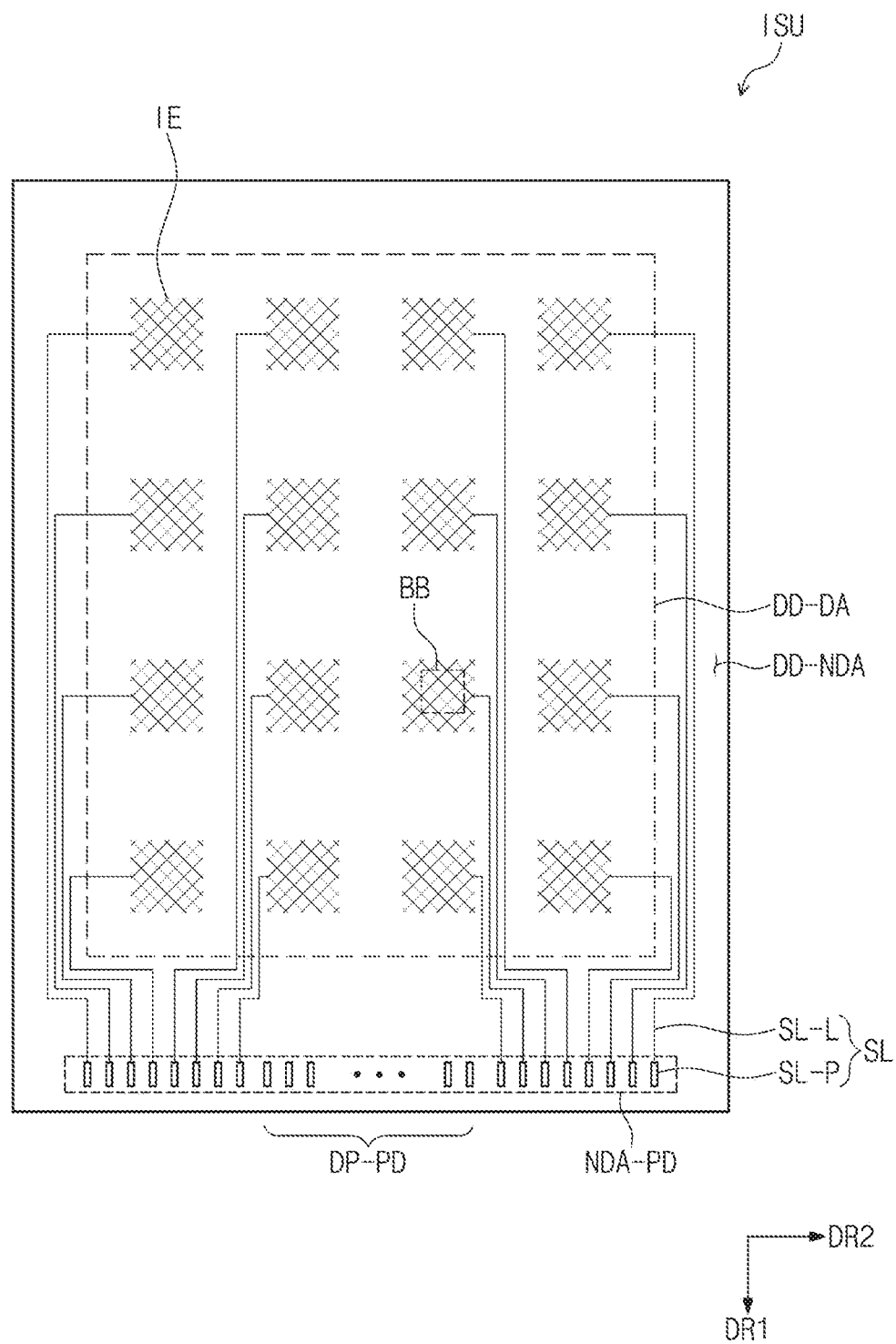
FIG. 12B is a plan view illustrating an input sensor constructed according to an exemplary embodiment of the invention.
Figure 12C:
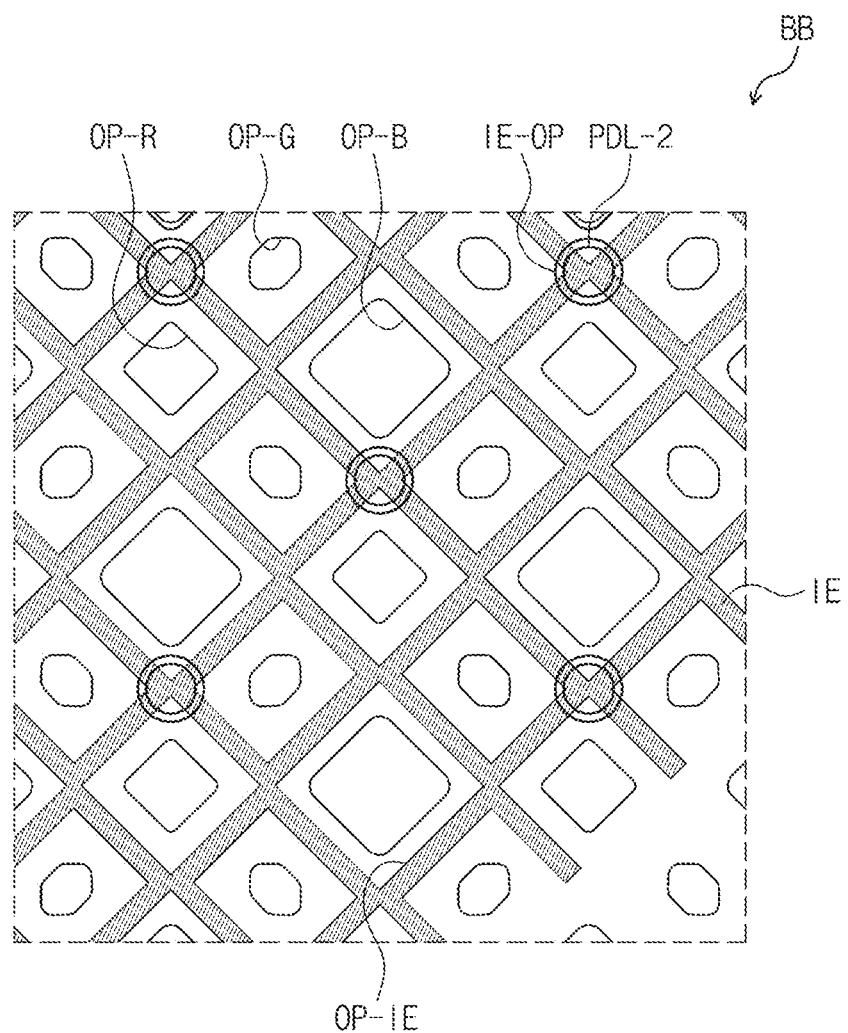
FIG. 12C is an enlarged plan view of region BB of FIG. 12A illustrating a portion of the input sensor of FIG. 12B.
Figure 12D:
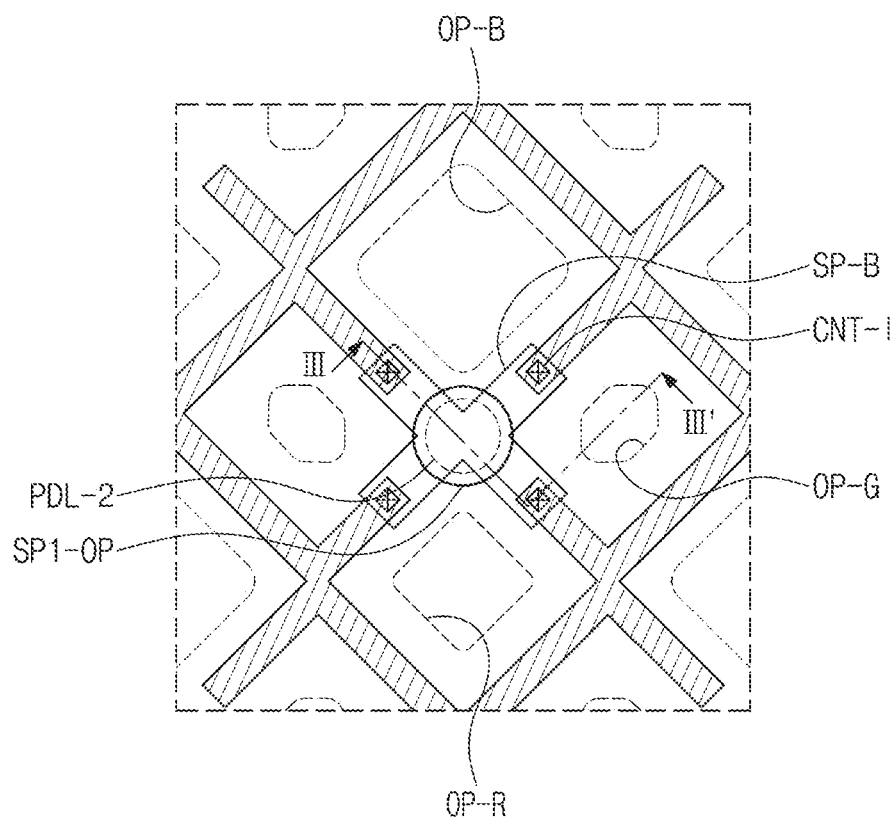
FIG. 12D is an enlarged plan view illustrating a portion of an input sensor constructed according to an exemplary embodiment of the invention.

FIG. 12A is a cross-sectional view illustrating the display device DD constructed according to an exemplary embodiment of the invention. FIG. 12B is a plan view illustrating the input sensor ISU constructed according to an exemplary embodiment of the invention. FIG. 12C is an enlarged plan view of region BB of FIG. 12A illustrating a portion of the input sensor ISU of FIG. 12B. FIG. 12D is an enlarged plan view illustrating a portion of the input sensor ISU constructed according to an exemplary embodiment of the invention. For concise description, the same element as that in the display device DD described with reference to FIGS. 1 to 11C may be identified by the same reference number without repeating a detailed description thereof to avoid redundancy.

Compared with the input sensor ISU of FIGS. 6A to 7C, the display device DD of FIGS. 12A to 12C may include the input sensor ISU, from which the second conductive layer IS-CL2 and the second insulating layer IS-IL2 are omitted. In the illustrated embodiment, the input sensor ISU may include the first conductive layer IS-CL1 and the first insulating layer IS-IL1, which is provided to directly cover or be in direct contact with the first conductive layer IS-CL1. The first conductive layer IS-CL1 may include a plurality of conductive patterns.

As shown in FIG. 12B, the input sensor ISU may include a plurality of sensing electrodes IE and a plurality of signal lines SL. Each of the sensing electrodes IE may have specific coordinate information. For example, the sensing electrodes IE may be arranged in a matrix shape and may be connected to the signal lines SL, respectively. Each of the signal lines SL may include the line portion SL-L and the pad portion SL-P. The inventive concepts are not limited to the specific shapes and arrangement of the sensing electrodes IE. Some of the signal lines SL may be provided on the display region DD-DA and others may be provided on the non-display region DD-NDA. In the illustrated embodiment, the input sensor ISU may be configured to obtain information on coordinates of an external input in a self-capacitance manner.

As shown in FIG. 12C, the sensing electrodes IE may have a mesh shape. The sensing electrodes IE may include mesh lines that are provided to define the openings OP-MG, OP-MR, and OP-MB corresponding to the openings OP-G, OP-R, and OP-B of the pixel definition layer. The mesh lines may have a triple-layered structure of, for example, titanium/aluminum/titanium.

In the illustrated embodiment, the sensing electrodes IE are illustrated to have a mesh shape, but the inventive concepts are not limited to this example. The input sensor ISU is illustrated as having a single-layered structure including one type of the sensing electrodes IE, but the inventive concepts are not limited to this example. In an exemplary embodiment, the input sensor ISU having the single-layered structure may include two types of the sensing electrodes IE, which are used to transmit or receive different signals.

FIG. 12D illustrates an example of the input sensor ISU, in which the second conductive layer IS-CL2 and the second insulating layer IS-IL2 are additionally provided, in comparison with the input sensor ISU of FIGS. 12A to 12C. As shown in FIG. 12C, the input sensor ISU may further include a bridge pattern IE-B. The bridge pattern IE-B may be overlapped with an open region IE-OP and may be connected to the sensing electrode IE through the contact hole CNT-I (or the first connection contact hole). The bridge pattern IE-B may be formed from the second conductive layer IS-CL2. A section of the input sensor ISU taken along line III-III' of FIG. 12D may be substantially the same as that in FIG. 9B.

Figure 13A:
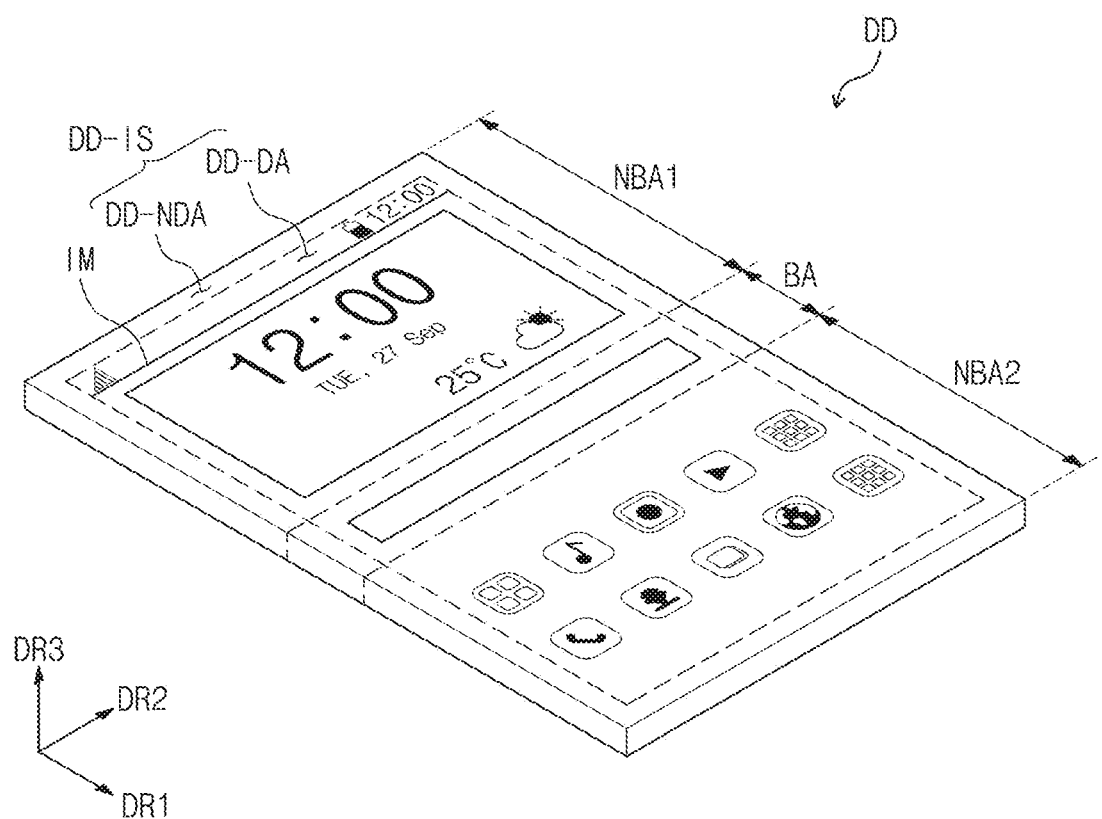
FIGS. 13A, 13B, and 13C are perspective views each illustrating a display device constructed according to an exemplary embodiment of the invention.
Figure 13B:
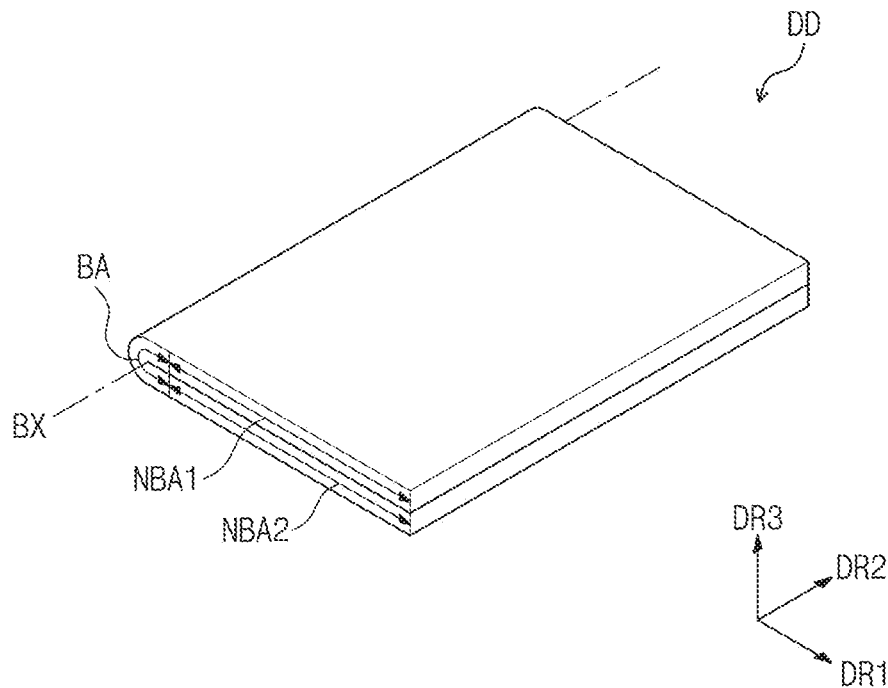
Figure 13C:
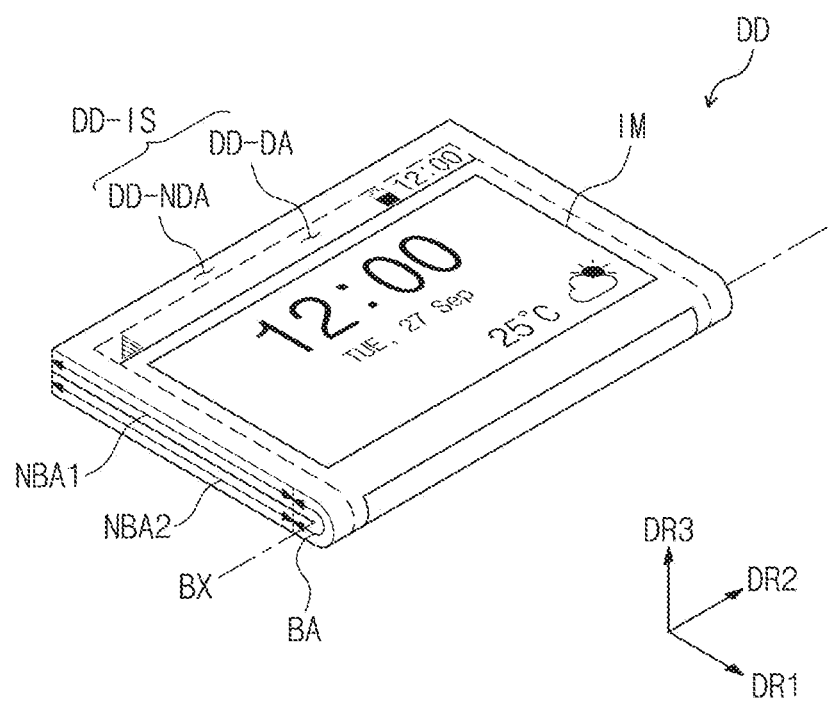
Figure 14A:
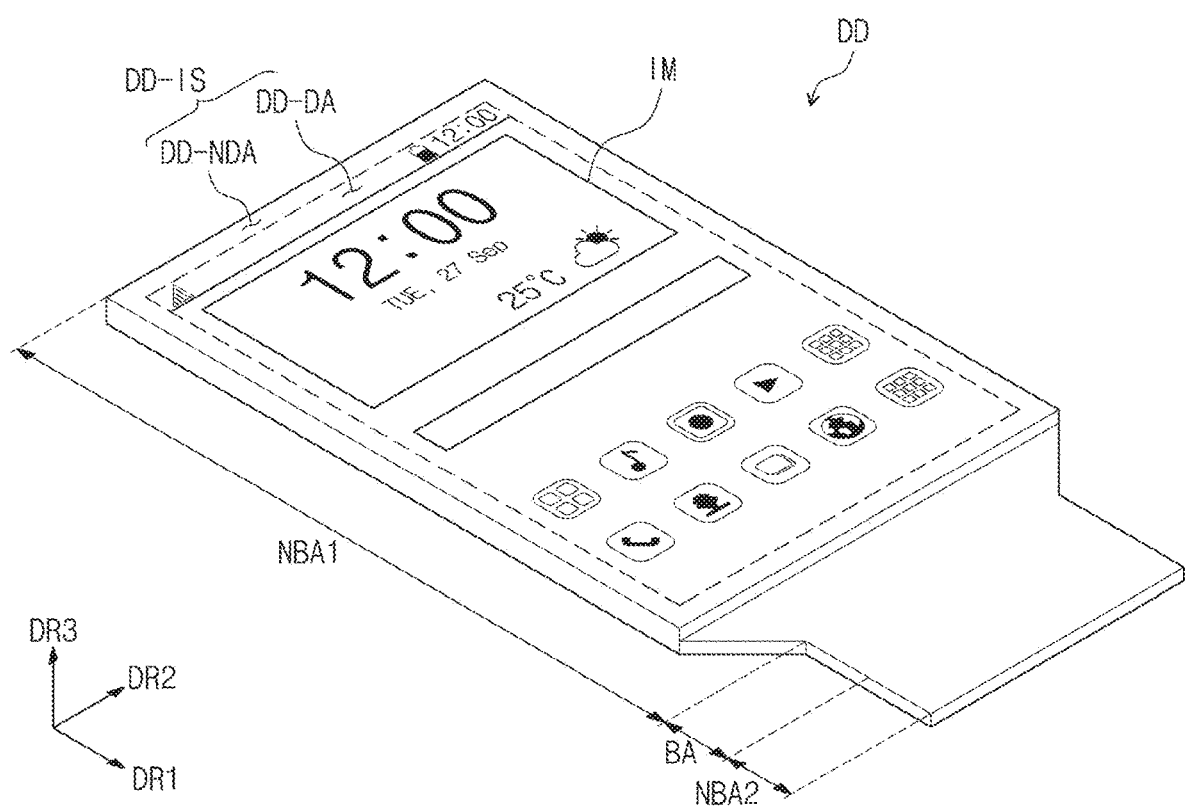
FIGS. 14A and 14B are perspective views each illustrating a display device constructed according to an exemplary embodiment of the invention.
Figure 14B:
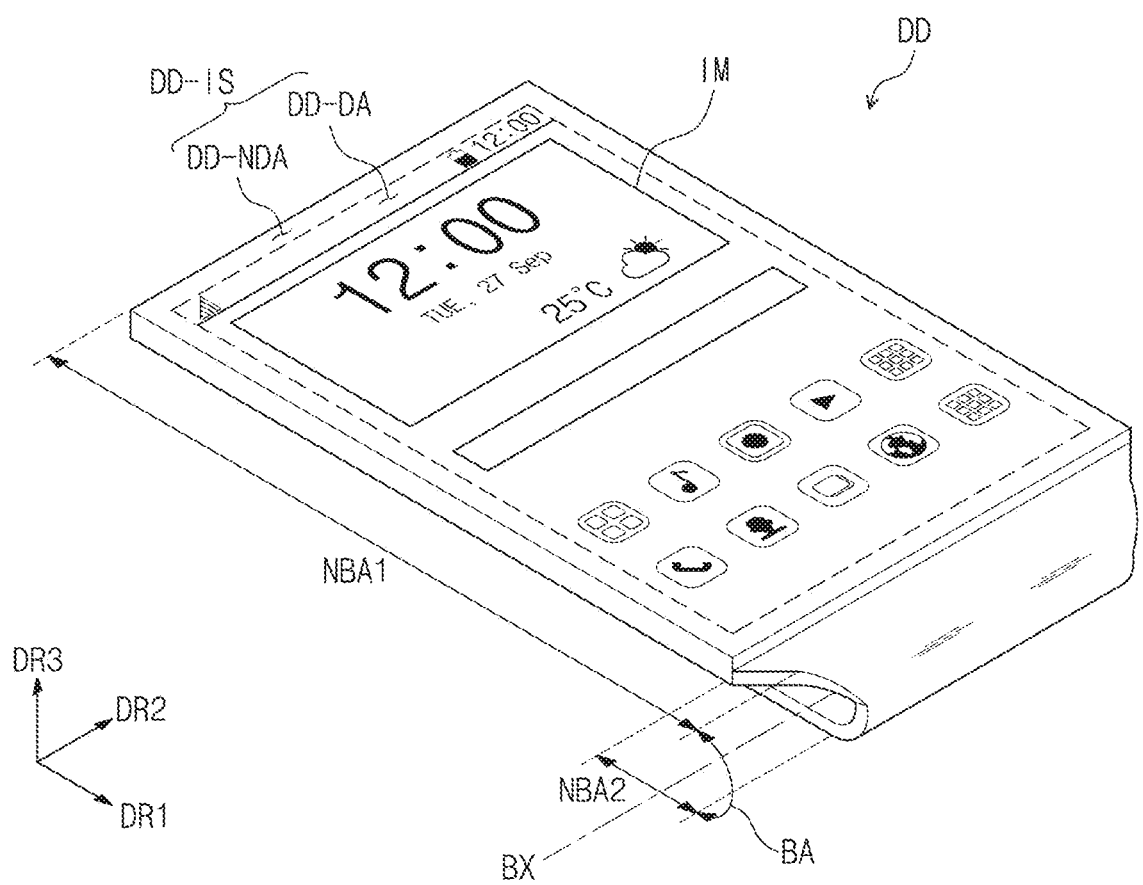
Figure 15:
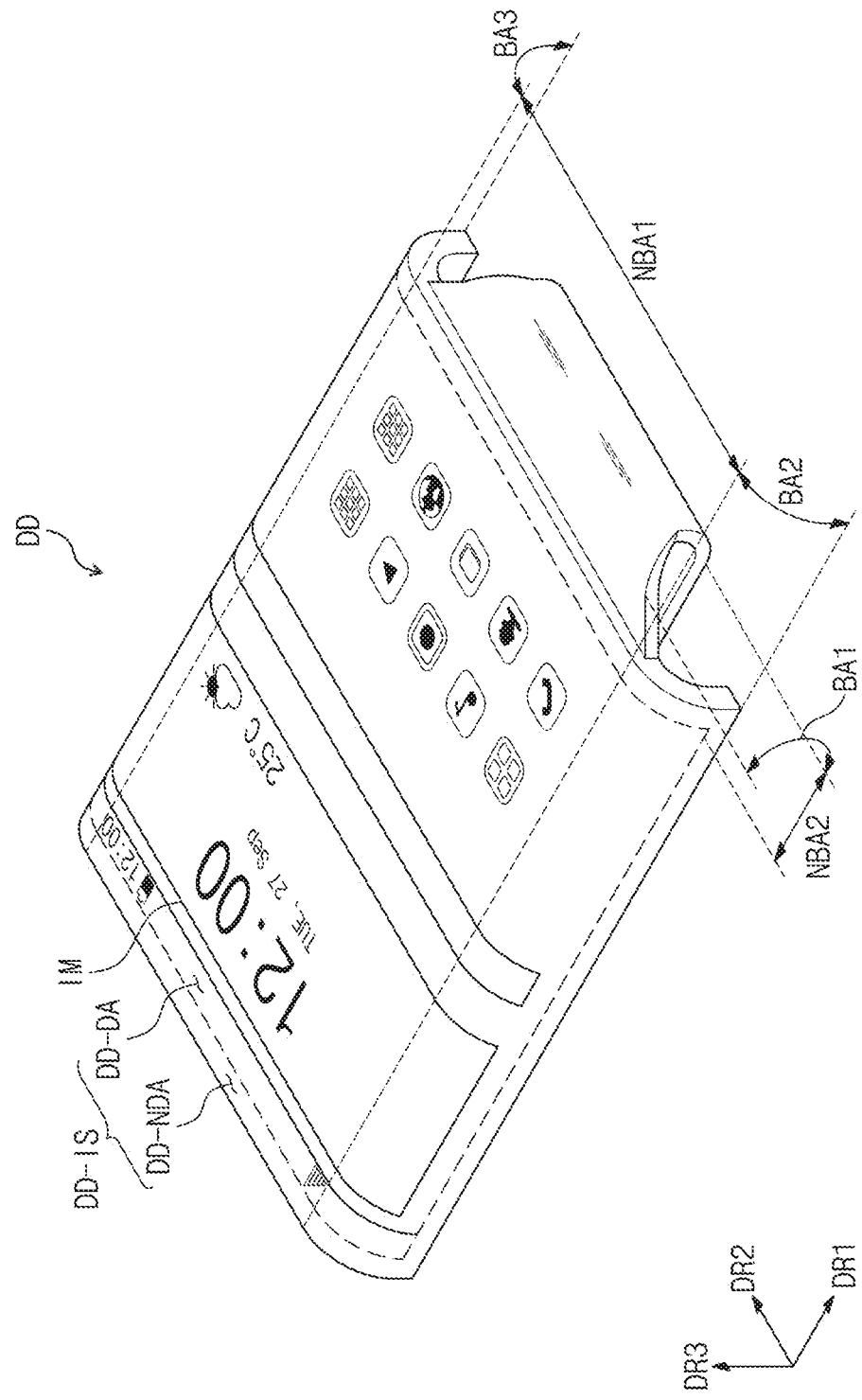
FIG. 15 is a perspective view illustrating a display device constructed according to an exemplary embodiment of the invention.

FIGS. 13A to 13C are perspective views each illustrating the display device DD constructed according to an exemplary embodiment of the invention. FIGS. 14A and 14B are perspective views each illustrating the display device DD constructed according to an exemplary embodiment of the invention. FIG. 15 is a perspective view illustrating the display device DD constructed according to an exemplary embodiment of the invention. The display panel DP and the input sensor ISU described with reference to FIGS. 1 to 12D may be used to realize one of the flexible display devices DD to be described below.

As shown in FIGS. 13A to 13C, the display device DD may include a plurality of areas, which are defined based on its operation mode. The display device DD may include a first region NBA1, a second region NBA2, and a third region BA between the first and second regions NBA1 and NBA2. The third region BA may be configured to be bent about a bending axis BX and thereby to have a variable curvature. Hereinafter, the first region NBA1, the second region NBA2, and the third region BA may be referred to as a first non-bending region NBA1, a second non-bending region NBA2, and a bending region BA, respectively.

As shown in FIG. 13B, the display device DD may be configured to perform an inner-bending operation, allowing the display surface DD-IS of the first non-bending region NBA1 to face the display surface DD-IS of the second non-bending region NBA2. As shown in FIG. 13C, the display module DM may be configured to perform an outwardly-bending operation of exposing the display surface DD-IS to the outside.

In an exemplary embodiment, the display device DD may include a plurality of the bending regions BA. In addition, the bending region BA may be defined, based on a shape of the display device DD manipulated by a user. For example, unlike that shown in FIGS. 13B and 13C, the bending region BA may be defined to be parallel to the first direction axis DR1 or in a diagonal direction. An area of the bending region BA may not be fixed and may vary depending on its curvature radius. In an exemplary embodiment, the display device DD may be configured to repeat only an operation mode illustrated in FIGS. 13A and 13B or to repeat only an operation mode illustrated in FIGS. 13A and 13C.

As shown in FIGS. 14A and 14B, the display device DD may include the first non-bending region NBA1, the second non-bending region NBA2, and the bending region BA. The first non-bending region NBA1, the second non-bending region NBA2, and the bending region BA may be defined based on the display panel DP (e.g., see FIGS. 2A to 2D). The input sensor, the anti-reflection unit, and the window may be provided in only the first non-bending region NBA1.

As shown in FIG. 14A, a width of the display panel DP in the first direction DR1 may be dependent on position. The bending region BA and the second non-bending region NBA2 may have widths that are smaller than a width of the first non-bending region NBA1. Since the bending region BA has a relatively small width, the bending region BA may be easily bent. Meanwhile, as shown in FIG. 14A, the first non-bending region NBA1 may include a border region having a gradually decreasing width. In an exemplary embodiment, the border region having a gradually decreasing width may be omitted. As shown in FIG. 14B, in a bent state, the second non-bending region NBA2 may face the first non-bending region NBA1 and may be spaced apart from the first non-bending region NBA1.

As shown in FIG. 15, the display device DD may include three bending regions BA1, BA2, and BA3. In comparison with the display device DD of FIG. 14B, the second and third bending regions BA2 and BA3 may be defined by bending two opposite edge regions of the first non-bending region NBA1 facing each other in the second direction DR2. The first bending region BA1 may correspond to the bending region BA of FIGS. 14A and 14B. The input sensor ISU, the anti-reflection unit, and the window described with reference to FIGS. 2A to 2D may be overlapped with the first non-bending region NBA1 and the second and third bending regions BA2 and BA3.

Due to a shape of a pixel definition layer, the pixel definition layer may lead to a spatial variation in distance between a second electrode and a sensing electrode. According to an exemplary embodiment of the inventive concept, a portion of the sensing electrode, which is relatively close to the second electrode, may be removed. The sensing electrode may have an open region, which is formed to correspond to a second portion of the pixel definition layer. The open region of the sensing electrode may be configured to suppress or prevent noise caused by the second electrode from affecting the sensing electrode.

The input sensor may further include a bridge pattern corresponding to the open region of the sensing electrode. The bridge pattern may be used to improve sensitivity in an operation of sensing an external input, without an increase of the noise caused by the second electrode.

The display device may further include a light blocking layer. The light blocking layer may be used to reduce reflectance of an external light. Furthermore, the light blocking layer may be configured to realize a narrow color distribution of a reflection light and thereby to improve a color sense property of the reflection light.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
 a display panel; and
 an input sensor directly disposed on the display panel, the input sensor including a sensing electrode and an insulating layer,
 wherein the display panel comprises:
 a first electrode in contact with a base surface;
 a pixel definition layer disposed on the first electrode in contact with the base surface, the pixel definition layer including a first portion defining an opening exposing the first electrode and a second portion disposed on and at least partially-overlapping with the first portion;
 a second electrode covering the first portion and the second portion of the pixel definition layer;
 a light emitting layer disposed between the first electrode and the second electrode, and the light emitting layer overlapping the opening in a plan view;
 a plurality of thin films disposed between the second electrode and the sensing electrode,
 wherein the sensing electrode and the insulating layer overlaps the pixel definition layer in a plan view, and
 wherein an open region is defined in the insulating layer at least partially overlapping the second portion of the pixel definition layer in a plan view.

2. The display device of claim 1, wherein the insulating layer covers the sensing electrode, the input sensor further comprises a bridge connector disposed on the insulating layer and overlapping the open region, and the bridge connector being connected to the sensing electrode through a contact hole defined in the insulating layer.

3. The display device of claim 1, wherein the sensing electrode comprises a first sensing electrode and a second sensing electrode intersecting each other and being insulated from each other, the first sensing electrode comprises first sensor portions and a first connecting portion connecting the first sensor portions to each other, the second sensing electrode comprises second sensor portions and a second connecting portion connecting the second sensor portions to each other, the insulating layer comprises a first insulating layer provided between the first connecting portion and the second connecting portion.

4. The display device of claim 3, wherein the first connecting portion is disposed below the first insulating layer, and the first sensor portions, the second sensor portions, and the second connecting portion are disposed on the first insulating layer.

5. The display device of claim 4, wherein the insulating layer further comprises a second insulating layer, which is disposed on the first insulating layer to cover the first sensor portions, the second sensor portions, and the second connecting portion, the input sensor further comprises a bridge connector disposed on the second insulating layer, the bridge connector is connected to the first sensor portions or the second sensor portions through a contact hole defined in the second insulating layer, and the bridge connector is at least partially overlapped with the open region.

6. The display device of claim 5, wherein a thickness of the second insulating layer is substantially equal to a thickness of the second portion.

7. The display device of claim 1, wherein a thickness of the first portion of the pixel definition layer is substantially equal to a thickness of the second portion of the pixel definition layer.

8. The display device of claim 1, wherein the second portion of the pixel definition layer is not overlapped with the sensing electrode.

9. The display device of claim 1, wherein a length of a side or a diameter of the second portion ranges from about 10 μm to about 25 μm.

10. The display device of claim 1, wherein the first portion and the second portion of the pixel definition layer are integrated.

11. The display device of claim 1, wherein the sensing electrode has a mesh-shaped structure, in which an opening corresponding to the opening of the first portion is defined.

12. The display device of claim 1, further comprising an anti-reflection unit directly disposed on the input sensor, wherein the anti-reflection unit includes a light blocking layer, an opening partially overlapping the opening of the first portion of the pixel definition layer is defined in the light blocking layer.

13. The display device of claim 1, further comprising an anti-reflection unit disposed between the display panel and the input sensor, wherein the anti-reflection unit includes a light blocking layer, an opening partially overlapping the opening of the first portion of the pixel definition layer is defined in the light blocking layer.

14. The display device of claim 1, wherein the plurality of thin films comprise a first inorganic layer in contact with the second electrode, a second inorganic layer disposed on the first inorganic layer, an organic layer disposed on the second inorganic layer, a third inorganic layer disposed on the organic layer, and a fourth inorganic layer disposed on the third inorganic layer, and the sensing electrode is in contact with the fourth inorganic layer.

15. A display device, comprising:

a display panel; and an input sensor disposed on the display panel, the input sensor including a sensing electrode and an insulating layer, wherein the display panel comprises:

a plurality of light emitting elements disposed on a base surface;

a pixel definition layer in contact with the base surface, the pixel definition layer including a main portion having a plurality of openings exposing first electrodes of the plurality of light emitting elements, and a plurality of sub portions located adjacent to the main portion and having a second thickness greater than a thickness of the main portion; and a plurality of thin films covering the plurality of light emitting elements, wherein the sensing electrode is disposed apart from the second electrode in a cross-sectional view, wherein the sensing electrode is disposed on the plurality of thin films overlapping with the main portion and, wherein a plurality of open regions at least partially overlapping the plurality of sub portions in a plan view are defined in the sensing electrode.

16. The display device of claim 15, wherein the first electrodes comprise first-type electrodes, each of the first-type electrodes has a first area, second-type electrodes, each of the second-type electrodes has a second area larger than the first area, and third-type electrodes, each of the third-type electrodes has a third area larger than the second area, the plurality of openings comprise first-type openings corresponding to the first-type electrodes, second-type openings corresponding to the second-type electrodes, and third-type openings corresponding to the third-type electrodes, and each of the plurality of sub portions is surrounded with two of the first-type openings, one of the second-type openings, and one of the third-type openings.

17. The display device of claim 16, wherein the sensing electrode has a mesh-shaped structure defining first openings corresponding to the first-type openings, second openings corresponding to the second-type openings, and third openings corresponding to the third-type openings.

18. The display device of claim 15, wherein the insulating layer covers the sensing electrode, the input sensor further comprises bridge connectors disposed on the insulating layer, the bridge connectors are connected to the sensing electrode through contact holes defined in the insulating layer, and the bridge connectors overlap the plurality of open regions.

19. The display device of claim 18, wherein the bridge connectors comprise bridge patterns, each of the sensing electrode and the bridge patterns has a mesh line, and
a line width of the mesh line of the sensing electrode is substantially equal to a line width of the mesh line of each of the bridge patterns.

20. The display device of claim 18, wherein a difference in thickness between one of the sub portions and the main portion is substantially equal to a thickness of the insulating layer.

* * * * *